United States Patent
Tran et al.

(10) Patent No.: US 7,395,487 B2
(45) Date of Patent: Jul. 1, 2008

(54) COMMON CIRCUITRY SUPPORTING BOTH BIT NODE AND CHECK NODE PROCESSING IN LDPC (LOW DENSITY PARITY CHECK) DECODER

(75) Inventors: Hau Thien Tran, Irvine, CA (US); Kelly Brian Cameron, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 524 days.

(21) Appl. No.: 11/171,568

(22) Filed: Jun. 30, 2005

(65) Prior Publication Data

US 2005/0268206 A1 Dec. 1, 2005

Related U.S. Application Data

(63) Continuation-in-part of application No. 10/901,528, filed on Jul. 29, 2004, now Pat. No. 7,017,106, which is a continuation of application No. 10/369,168, filed on Feb. 19, 2003, now Pat. No. 7,107,511, which is a continuation-in-part of application No. 10/347,732, filed on Jan. 21, 2003.

(60) Provisional application No. 60/634,923, filed on Dec. 10, 2004, provisional application No. 60/630,360, filed on Nov. 22, 2004, provisional application No. 60/615,722, filed on Oct. 4, 2004, provisional application No. 60/427,979, filed on Nov. 20, 2002, provisional application No. 60/408,978, filed on Sep. 6, 2002, provisional application No. 60/403,847, filed on Aug. 15, 2002.

(51) Int. Cl.
*H03M 13/00* (2006.01)
*H03M 13/03* (2006.01)
*G06F 11/00* (2006.01)
*H03D 1/00* (2006.01)

(52) U.S. Cl. .................. 714/758; 714/755; 714/794; 714/801; 375/341

(58) Field of Classification Search .............. 714/755, 714/758–759, 776, 786, 794, 795, 801; 375/341
See application file for complete search history.

(56) References Cited

U.S. PATENT DOCUMENTS 3,542,756 A 11/1970 Gallager (Continued)

FOREIGN PATENT DOCUMENTS

| EP | 0 735 696 A2 | 10/1996 |
|---|---|---|
| EP | 0 735 696 A3 | 1/1999 |
| FR | 91 05278 A1 | 10/1992 |
| WO | WO 02/39587 A2 | 5/2002 |
| WO | WO 2004/006441 A2 | 1/2004 |

OTHER PUBLICATIONS

Mustafa Eroz, Feng-Wen Sun, and Lin-Nan Lee "DVB-S2 Low Density Parity Check Codes with Near Shannon Limit Performance" International Journal of Satellite Communications and Networking, vol. 22, No. 3, Jun. 2004, pp. 269-279.

(Continued)

*Primary Examiner*—Phung M Chung
(74) *Attorney, Agent, or Firm*—Garlick Harrison & Markison; Shayne X. Short

(57) ABSTRACT

Common circuitry supporting both bit node and check node processing in LDPC (Low Density Parity Check) decoder. A novel approach is presented by which a decoder may use the same circuitry to perform updating of edge messages with respect to bit nodes as well as updating of edge messages with respect to check nodes in the context of decoding LDPC coded signals. In addition, several very efficient architectures are presented to performing check node processing that involves the updating of edge messages with respect to check nodes. One embodiment performs check node processing using min (min-double-star) processing in conjunction with min− (min-double-star-minus) processing. Another embodiment performs check node processing using min†† (min-double-dagger) processing in conjunction with min†− (min-dagger-minus) processing. In addition, a single FIFO may be implemented to service a number of macro blocks in a parallel decoding implementation.

20 Claims, 40 Drawing Sheets

U.S. PATENT DOCUMENTS

| | | | |
|---|---|---|---|
| 3,665,396 | A | 5/1972 | Forney, Jr. |
| 4,295,218 | A | 10/1981 | Tanner |
| 5,406,570 | A | 4/1995 | Berrou et al. |
| 5,446,747 | A | 8/1995 | Berrou |
| 5,563,897 | A | 10/1996 | Pyndiah et al. |
| 6,065,147 | A | 5/2000 | Pyndiah et al. |
| 6,119,264 | A | 9/2000 | Berrou et al. |
| 6,122,763 | A | 9/2000 | Pyndiah et al. |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 6,725,409 | B1 | 4/2004 | Wolf |
| 7,243,287 | B2 * | 7/2007 | Cameron et al. ............ 714/752 |
| 2003/0002603 | A1 | 1/2003 | Worm et al. |
| 2003/0033575 | A1 | 2/2003 | Richardson et al. |
| 2003/0104788 | A1 | 6/2003 | Kim |
| 2004/0005019 | A1 | 1/2004 | Smith et al. |
| 2004/0034828 | A1 | 2/2004 | Hocevar |
| 2004/0187129 | A1 | 9/2004 | Richardson |
| 2005/0262421 | A1 * | 11/2005 | Tran et al. ................... 714/758 |
| 2006/0085720 | A1 * | 4/2006 | Tran et al. ................... 714/758 |
| 2007/0260944 | A1 * | 11/2007 | Cameron et al. ............ 714/699 |

OTHER PUBLICATIONS

Flarion Technologies Inc. "Vector-Low-Density Parity-Check (V-LDPC) Coding Solution Data Sheet" Internet Article, May 2003, pp. 1-3.

Lin-Na Lee, "LDPC Codes, Application to Next Generation Communication Systems" IEEE Semi-Annual Vehical Technology Conference, Oct. 2003, pp. 1-8.

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

Draft ETSI EN 302 307 V1.1.1 (Jun. 2004), Digital Video Broadcasting (DVB); Second generation framing structure, channel coding and modulation systems for Broadcasting, Interactive Services, News Gathering and other broadband satellite applications.

ETSI EN 302 307 V1.1.1 (Mar. 2005). Digital Video Broadcasting (DVB); Second generation framing structure, channel coding and modulation systems for Broadcasting, Interactive Services, News Gathering and other broadband satellite applications.

R. G. Gallager, "Low density parity check codes," IRE Trans. Info. Theory, vol. IT-8, pp. 21-28, Jan. 1962.

J. Hagenauer, E. Offer, and L. Papke, "Iterative decoding of binary block and convolutional codes," IEEE Transactions on Information Theory, pp. 429-445, Mar. 1996.

Mittelholzer, et al., "Reduced complexity decoding of low density parity check codes for generalized partial response channels," IEEE Tran. on Magnetics, vol. 37, No. 2, pp. 721-778, Mar. 2001.

P. Robertson, E. Villebrum, and P. Hoeher, "A comparison of optimal and suboptimal MAP decoding algorithms operating in the log domain," in Proc. Int. Conf. Communications, Seattle, WA, Jun. 1995, pp. 1009-1013.

Andrew J. Viterbi, "An Intuitive Justification and a Simplified Implementation of the MAP Decoder for Convolutional Codes," IEEE Journal on Selected Areas in Communications, vol. 16, No. 2, pp. 260-264, Feb. 1998.

Xiao et al. "Efficient implementation of the sum-product algorithm for decoding LDPC," 2001 IEEE, pp. 1036-1036E.

Seog et al., "State-paralled MAP module design for turbo decoding of 3GPP," Apr. 2002, Journal of the Korean Physical Society, vol. 40, No. 4, pp. 677-685.

* cited by examiner

| mod | QPSK | 8 PSK | 16 APSK | 16 QAM |
|---|---|---|---|---|
| Coef_0 | x | P_0 | A_0 | Q_0 |
| Coef_1 | P_1 | P_1 | A_1 | Q_1 |
| Coef_2 | x | P_2 | A_2 | Q_2 |
| Coef_3 | P_3 | P_3 | A_3 | Q_3 |
| Coef_4 | x | x | A_4 | x |
| Coef_5 | x | x | A_5 | x |
| Coef_ | x | x | A_6 | x |
| Coef_7 | x | x | A_7 | x |

Fig. 15

| z | z (binary) | $-\ln(1+e^{-|z|})$ | log_out (binary) |
|---|---|---|---|
| 3.75 | 01111 | -0.02 | 000 |
| 3.50 | 01110 | -0.03 | 000 |
| 3.25 | 01101 | -0.04 | 000 |
| 3.00 | 01100 | -0.05 | 000 |
| 2.75 | 01011 | -0.06 | 000 |
| 2.50 | 01010 | -0.08 | 000 |
| 2.25 | 01001 | -0.10 | 000 |
| 2.00 | 01000 | -0.13 | 000 |
| 1.75 | 00111 | -0.16 | 000 |
| 1.50 | 00110 | -0.20 | 000 |
| 1.25 | 00101 | -0.25 | 111 |
| 1.00 | 00100 | -0.31 | 111 |
| 0.75 | 00011 | -0.39 | 111 |
| 0.50 | 00010 | -0.47 | 111 |
| 0.25 | 00001 | -0.58 | 110 |
| 0.00 | 00000 | -0.69 | 110 |
| -0.25 | 11111 | -0.58 | 110 |
| -0.50 | 11110 | -0.47 | 111 |
| -0.75 | 11101 | -0.39 | 111 |
| -1.00 | 11100 | -0.31 | 111 |
| -1.25 | 11011 | -0.25 | 111 |
| -1.50 | 11010 | -0.20 | 000 |
| -1.75 | 11001 | -0.16 | 000 |
| -2.00 | 11000 | -0.13 | 000 |
| -2.25 | 10111 | -0.10 | 000 |
| -2.50 | 10110 | -0.08 | 000 |
| -2.75 | 10101 | -0.06 | 000 |
| -3.00 | 10100 | -0.05 | 000 |
| -3.25 | 10011 | -0.04 | 000 |
| -3.50 | 10010 | -0.03 | 000 |
| -3.75 | 10001 | -0.02 | 000 |
| -4.00 | 10000 | -0.02 | 000 |

Fig. 25

| z | z (binary) | +ln(1−e^(−|z|)) | log_out (binary) |
|---|---|---|---|
| 3.75 | 01111 | 0.02 | 00000 |
| 3.50 | 01110 | 0.03 | 00000 |
| 3.25 | 01101 | 0.04 | 00000 |
| 3.00 | 01100 | 0.05 | 00000 |
| 2.75 | 01011 | 0.07 | 00000 |
| 2.50 | 01010 | 0.09 | 00000 |
| 2.25 | 01001 | 0.11 | 00000 |
| 2.00 | 01000 | 0.15 | 00000 |
| 1.75 | 00111 | 0.19 | 00000 |
| 1.50 | 00110 | 0.25 | 00001 |
| 1.25 | 00101 | 0.34 | 00001 |
| 1.00 | 00100 | 0.46 | 00001 |
| 0.75 | 00011 | 0.64 | 00010 |
| 0.50 | 00010 | 0.93 | 00011 |
| 0.25 | 00001 | 1.51 | 00110 |
| 0.00 | 00000 | 2.14* | 01000* |
| -0.25 | 11111 | 1.51 | 00110 |
| -0.50 | 11110 | 0.93 | 00011 |
| -0.75 | 11101 | 0.64 | 00010 |
| -1.00 | 11100 | 0.46 | 00001 |
| -1.25 | 11011 | 0.34 | 00001 |
| -1.50 | 11010 | 0.25 | 00001 |
| -1.75 | 11001 | 0.19 | 00000 |
| -2.00 | 11000 | 0.15 | 00000 |
| -2.25 | 10111 | 0.11 | 00000 |
| -2.50 | 10110 | 0.09 | 00000 |
| -2.75 | 10101 | 0.07 | 00000 |
| -3.00 | 10100 | 0.05 | 00000 |
| -3.25 | 10011 | 0.04 | 00000 |
| -3.50 | 10010 | 0.03 | 00000 |
| -3.75 | 10001 | 0.02 | 00000 |
| -4.00 | 10000 | 0.02 | 00000 |

COMMON CIRCUITRY SUPPORTING BOTH BIT NODE AND CHECK NODE PROCESSING IN LDPC (LOW DENSITY PARITY CHECK) DECODER

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/615,722, "Efficient design to implement LDPC (Low Density Parity Check) decoder,", filed Oct. 4, 2004, pending.
2. U.S. Provisional Application Ser. No. 60/630,360, entitled "Efficient design to implement min or max functions in LDPC (Low Density Parity Check) decoders,", filed Nov. 22, 2004, pending.
3. U.S. Provisional Application Ser. No. 60/634,923, "Common circuitry supporting both bit node and check node processing in LDPC (Low Density Parity Check) decoder,", filed Dec. 10, 2004, pending.

CIP of BP2541

The present U.S. Utility Patent Application also claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:

1. U.S. Utility patent application Ser. No. 10/347,732, entitled "Inverse function of min*: min*- (inverse function of max*: max*-),", filed Jan. 21, 2003, pending, which claims priority pursuant to 35 U.S.C. § 119(e) to the following U.S. Provisional Patent Applications which are hereby incorporated herein by reference in their entirety and made part of the present U.S. Utility Patent Application for all purposes:
   a. U.S. Provisional Application Ser. No. 60/403,847, entitled "Inverse of min*: min*- (the inverse of max*: max*-),", filed Aug. 15, 2002.
   b. U.S. Provisional Application Ser. No. 60/427,979, "Single stage implementation of min*, max*, min and/or max to perform state metric calculation in SISO decoder,", filed Nov. 20, 2002.

CIP of BP2559CON

The present U.S. Utility Patent Application also claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:

1. U.S. Utility patent application Ser. No. 10/901,528, now U.S. Pat. No. 7,017,106 entitled "Low Density Parity Check (LDPC) code decoder using min*, min**, max* or max** and their respective inverses,", filed Jul. 29, 2004, pending.

BP2559CON is a CON of BP2559

The U.S. Utility patent application Ser. No. 10/901,528, now U.S. Pat. No. 7,017,106 claims priority pursuant to 35 U.S.C. § 120, as a continuation, to the following U.S. Utility Patent Application which is hereby incorporated herein by reference in its entirety and made part of the present U.S. Utility Patent Application for all purposes:

1. U.S. Utility patent application Ser. No. 10/369,168, now U.S. Pat. No. 7,107,511 entitled "Low Density Parity Check (LDPC) code decoder using min*, min**, max* or max** and their respective inverses,", filed Feb. 19, 2003, pending, which claims priority pursuant to 35 U.S.C. § 119(e) to the following U.S. Provisional Patent Applications which are hereby incorporated herein by reference in their entirety and made part of the present U.S. Utility Patent Application for all purposes:
   a. U.S. Provisional Application Ser. No. 60/403,847, entitled "Inverse of min*: min*- (the inverse of max*: max*-),", filed Aug. 15, 2002.
   b. U.S. Provisional Application Ser. No. 60/408,978, entitled "Low Density Parity Check (LDPC) Code Decoder using min*, min*-, min, and/or min-,", filed Sep. 6, 2002.
   c. U.S. Provisional Application Ser. No. 60/427,979, "Single stage implementation of min*, max*, min and/or max to perform state metric calculation in SISO decoder,", filed Nov. 20, 2002.

INCORPORATION BY REFERENCE

The following U.S. Utility Patent Applications are hereby incorporated herein by reference in their entirety and made part of the present U.S. Utility Patent Application for all purposes:

1. U.S. Utility patent application Ser. No. 10/865,556, now U.S. Pat. No. 7,243,287 entitled "Decoding LDPC (Low Density Parity Check) code and graphs using multiplication (or addition in log-domain) on both sides of bipartite graph,", filed Jun. 10, 2004, pending.
2. U.S. Utility patent application Ser. No. 11/171,998, entitled "Efficient design to implement LDPC (Low Density Parity Check) decoder,", filed Jun. 30, 2005, pending.
3. U.S. Utility patent application Ser. No. 11/172,165, entitled "Efficient design to implement min/min- or max/max- functions in LDPC (Low Density Parity Check) decoders,", filed Jun. 30, 2005, pending.

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. Each of these different types of communication systems is able to achieve relatively low BERs (Bit Error Rates).

A continual and primary directive in this area of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC codes are oftentimes referred to in a variety of ways. For example, iterative soft decoding of LDPC codes may be implemented in a number of ways including based on the BP (Belief Propagation) algorithm, the SP (Sum-Product) algorithm, and/or the MP (Message-Passing) algorithm; the MP algorithm is sometimes referred to as a Sum Product/Belief Propagation combined algorithm. While there has been a significant amount of interest and effort directed towards these types of LDPC codes, regardless of which particular manner of iterative decoding algorithm is being employed in the specific case (3 of which are enumerated above: BP, SP, and MP), there still is ample room for improvement in the implementation and processing to be performed within a communication device to complete such decoding. For example, there are a variety of relatively complex and numerically burdensome calculations, data management and processing that must be performed to effectuate the accurate decoding of an LDPC coded signal.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to operate in the natural log (ln) domain (i.e., the logarithm domain having base e); this is sometimes referred to as simply the "log domain." LDPC decoders also fall in to this category. By operating within the log domain, this converts all multiplications to additions, divisions to subtractions, and eliminates exponentials entirely, without affecting BER performance.

One somewhat difficult calculation is the natural log (ln) domain includes calculating the sum of exponentials as shown below:

$$\ln(e^a+e^b+e^c+\ldots)$$

This calculation can be significantly reduced in complexity using the Jacobian formula shown below:

$$\max{}^*(a,b)=\ln(e^a+e^b)=\max(a,b)+\ln(1+e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate $\ln(e^a+e^b+e^c)$, the following two max* operations may be performed:

$$\max{}^*(a,b)=\ln(e^a+e^b)=\max(a,b)+\ln(1+e^{-|a-b|})=x$$

$$\max{}^*(a,b,c)=\max{}^*(x,c)=\ln(e^x+e^c)=\max(x,c)+\ln(1+e^{-|x-c|})$$

While there has a been a great deal of development within the context of LDPC code, the extensive processing and computations required to perform decoding therein can be extremely burdensome. This one example provided above, of the calculating the sum of exponentials, illustrates the potentially complex and burdensome calculations needed when performing decoding of such signals. Sometimes the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1+e^{-|a-b|})$ altogether and use only the max(a, b) result which may be implemented within a single instruction within a DSP (Digital Signal Processor). However, this will inherently introduce some degradation in decoder performance given this lack of precision in the calculations. Most of the common approaches that seek to provide some computational improvements either cut corners in terms of computational accuracy, or they do not provide a sufficient reduction in computational complexity to justify their integration. One of the prohibiting factors concerning the implementation of many LDPC codes is oftentimes the inherent computational complexity coupled with the significant amount of memory required therein.

There still exists a need in the art to provide for more efficient solutions when making calculations, such as max*, within decoders that operate within the logarithmic domain.

The use of LDPC coded signals continues to be explored within many newer application areas. One such application area is that digital video broadcasting. The Digital Video Broadcasting Project (DVB) is an industry-led consortium of over 260 broadcasters, manufacturers, network operators, software developers, regulatory bodies and others in over 35 countries committed to designing global standards for the global delivery of digital television and data services. Publicly available information concerning the DVB is available at the following. Internet address:

"http://www.dvb.org/"

The DVB-S2 (i.e., DVB-Satellite Version 2) draft standard is also publicly available via this Internet address, and the DVB-S2 draft standard may be downloaded in Adobe PDF format at the following Internet address:

"http://www.dvb.org/documents// en302307.v1.1.1.draft.pdf"

The entire contents of this DVB-S2 draft standard, "Draft ETSI EN 302 307 V1.1.1 (2004-06), Digital Video Broadcasting (DVB); Second generation framing structure, channel coding and modulation systems for Broadcasting, Interactive Services, News Gathering and other broadband satellite applications" is hereby incorporated herein by reference in its entirety and made part of the present disclosure for all purposes.

In addition, the standard "ETSI EN 302 307 V1.1.1 (2005-03), Digital Video Broadcasting (DVB); Second generation framing structure, channel coding and modulation systems for Broadcasting, Interactive Services, News Gathering and other broadband satellite applications" was formally ratified by the ETSI (European Telecommunications Standards Institute) in March 2005. The entire contents of this standard is hereby incorporated herein by reference in its entirety and made part of the present disclosure for all purposes.

Greater detail regarding the types of signals employed within such DVB-S2 compliant systems is included within this DVB-S2 standard. The DVB-S2 standard focuses primarily on the transmission system description and the subsystems therein including mode adaptation, stream adaptation, FEC encoding (including both BCH outer encoding and LDPC inner encoding), bit mapping into constellation, physical layer framing, and baseband shaping and quadrature modulation.

The DVB-S2 is an advanced version of DVB-S (the first standard produced by the Digital Video Broadcasting Project). DVB-S2 seeks to provide for greater efficiency than DVB-S. DVB-S2 plans to implement 4 different modulation types: QPSK (Quadrature Phase Shift Key), 8 PSK (Phase Shift Key), 16 APSK (Asymmetric Phase Shift Keying), and 32 APSK. Generally speaking, the QPSK and 8 PSK modulation types are intended for broadcast applications through non-linear satellite transponders driven near to saturation; the 16 APSK and 32 APSK modulation types are geared more primarily towards professional applications requiring semi-linear transponders. The 16 APSK and 32 APSK modulation types operate by trading off power efficiency for greater throughput.

In addition, DVB-S2 uses a powerful FEC (Forward Error Correction) system based on concatenation of BCH (Bose-Chaudhuri-Hocquenghem) outer coding with LDPC inner coding. The result is performance which is at times only 0.7 dB from the Shannon limit. The choice of FEC parameters depends on the system requirements. With VCM (Variable Coding and Modulation) and ACM (Adaptive Coding and Modulation), the code rates can be changed dynamically, on a frame by frame basis.

The multiple operational parameters to which a receiving device, that includes a decoder, must operate to be DVB-S2 compliant is very clearly laid out by the operational parameters of the transmission system description. However, as long as a receiving device, that includes a decoder, complies with these operational parameters specified within the DVB-S2 standard, great latitude in the means of implementation is permissible. The generation of signals on the transmission end of a communication channel is clearly laid out within the DVB-S2 standard, and the means by which the receive processing of such signal (at the receiving end of a communication channel) may be performed is widely open to the designer. Clearly, a key design constrain of such receiving devices is to provide for the accommodation of such DVB-S2 signals while providing for very high performance while occupying a relatively small amount of area and having a relatively lower level of complexity.

Another application area in which the use of LDPC coded signals continues to be explored is in various communication system embodiments and application areas whose operation is specified and governed by the IEEE (Institute of Electrical & Electronics Engineers). For example, the use of LDPC coded signals has been of significant concern within the IEEE P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Typical encoding and modulation of LDPC coded signals is performed by generating a signal that includes symbols each having a common code rate and being mapped to a singular modulation (e.g., a singular constellation shape having a singular mapping of the constellation points included therein). That is to say, all of the symbols of such an LDPC coded modulation signal have the same code rate and the same modulation (the same constellation shape whose constellation points have the singular mapping). Oftentimes, such prior art designs are implemented as to maximize the hardware and processing efficiencies of the particular design employed to generate the LDPC coded signal having the single code rate and single modulation for all of the symbols generated therein.

However, in some more recent prior art LDPC communication systems, the design of LDPC encoders has sought to provide for capabilities to generate multiple types of LDPC coded signals. Within these communication systems, the code rate and modulation type for all of the symbols within any given LDPC block is the same. That is to say, the entire block has a particular code rate and modulation type associated with it. Nevertheless, the encoder is operable to generate different LDPC blocks such that a first LDPC block has a first code rate and first modulation type associated with it, and a second LDPC block has a second code rate and second modulation type associated with it.

A decoder that operates to decode such signals must be able to accommodate the various LDPC block types that it may receive. Currently, the LDPC decoder designs being discussed in the art require a relatively large amount of area and are of a relatively high complexity. There is a need in the art to provide for an LDPC decoder that can accommodate such signals while providing for very high performance, less area, and less complexity.

As mentioned above, the calculations required to decode such signals can be very difficult to implement within an actual physical decoding device. In addition, when performing decoding processing on signals that have relatively large LDPC bipartite graphs, then the numbers of calculations required when performing both bit node processing and check node processing can be very large. Oftentimes, designers take a brute force approach in cascading the necessary number of calculation functional blocks within such decoding devices to be able to accommodate the necessary amount of calculations required in such decoding processing. As an example, when performing max* processing on 10 inputs during check node processing as described above, a prior art approach is to implement 10 individual max* processing functional blocks to accommodate all of the 10 inputs. This can be extremely consumptive in terms of real estate on an actual device (e.g., an integrated circuit) as well as extremely costly given the increased size of the device. An alternative approach sometimes taken in the prior art is to employ a singular max* processing functional block and a significantly large amount of memory management that requires storing a large amount of intermediate values. This prior art approach can take a large number of clock cycles to complete. This prior art approach also can be extremely consumptive in terms of real estate and cost of a device, in that, a significant amount of memory management hardware is required to accommodate all of the intermediate values. As such, there is a need in the art to provide for some means of performing decoding processing of such LDPC coded signals in an actual device that requires a smaller number of processing functional blocks, that consumes less real estate within an actual decoding device, as well as hopefully cost less than prior art devices.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 15 is a diagram illustrating an embodiment of a table including coefficients for corresponding modulations according to certain aspects of the invention.

FIG. 25 is a diagram illustrating an embodiment of a min* log table according to certain aspects of the invention.

DETAILED DESCRIPTION OF THE INVENTION

Various aspects of the invention may be found in any number of devices that perform decoding of LDPC (Low Density Parity Check) coded signals. In some instances, the decoding approaches and functionality presented herein are operable to decode and process signals that have been generated and that comply with the DVB-S2 (i.e., DVB-Satellite Version 2) standard. In addition, the decoding approaches and functionality presented herein may also be adapted to decode and process signals that have been generated and that comply with draft standards and recommended practices that have been provided by the IEEE P802.3an (10GBASE-T) Task Force.

Generally speaking, the decoding approaches and functionality presented herein may be found in any number of devices that perform processing of LDPC coded signals and/or other coded signal types. Sometimes, these devices are operable to perform both transmit processing (including encoding) as well as receive processing (including decoding) of LDPC coded signals. In other instances, these devices are operable to perform only receive processing (including decoding) of LDPC coded signals.

The decoding aspects of the invention are adaptable to accommodate decoding of such LDPC signals having variable modulation and/or variable code rate. For example, the DVB-S2 standard explicitly describes the means by which VCM (Variable Coding and Modulation) and ACM (Adaptive Coding and Modulation) may be implemented by generating the various LDPC coded signals employed within the DVB-S2 standard. In general, the code rate and/or modulation of such DVB-S2 compliant signals changes may change on a frame by frame basis. The decoding approaches and functionality presented herein are capable of processing and decoding signals whose code rate and/or modulation may vary as frequently as on a frame by frame basis. Moreover, the decoding approaches and functionality presented herein are also capable of processing and decoding signals whose code rate and/or modulation may vary as frequently as on a block by block basis. For example, a block may be viewed as being a group of symbols within a frame. In some instances, a frame may include multiple blocks.

Still, decoding approaches and functionality presented are also adaptable to accommodate decoding of LDPC signals that have a single code rate and/or single modulation for all of the symbols of the LDPC coded signal. For example, for an LDPC signal whose symbols all have a common code rate and a common modulation (constellation and mapping), any of the LDPC decoding approaches enumerated herein (and described below in more detail) may be employed to decode such an LDPC coded signal.

Figure 1:
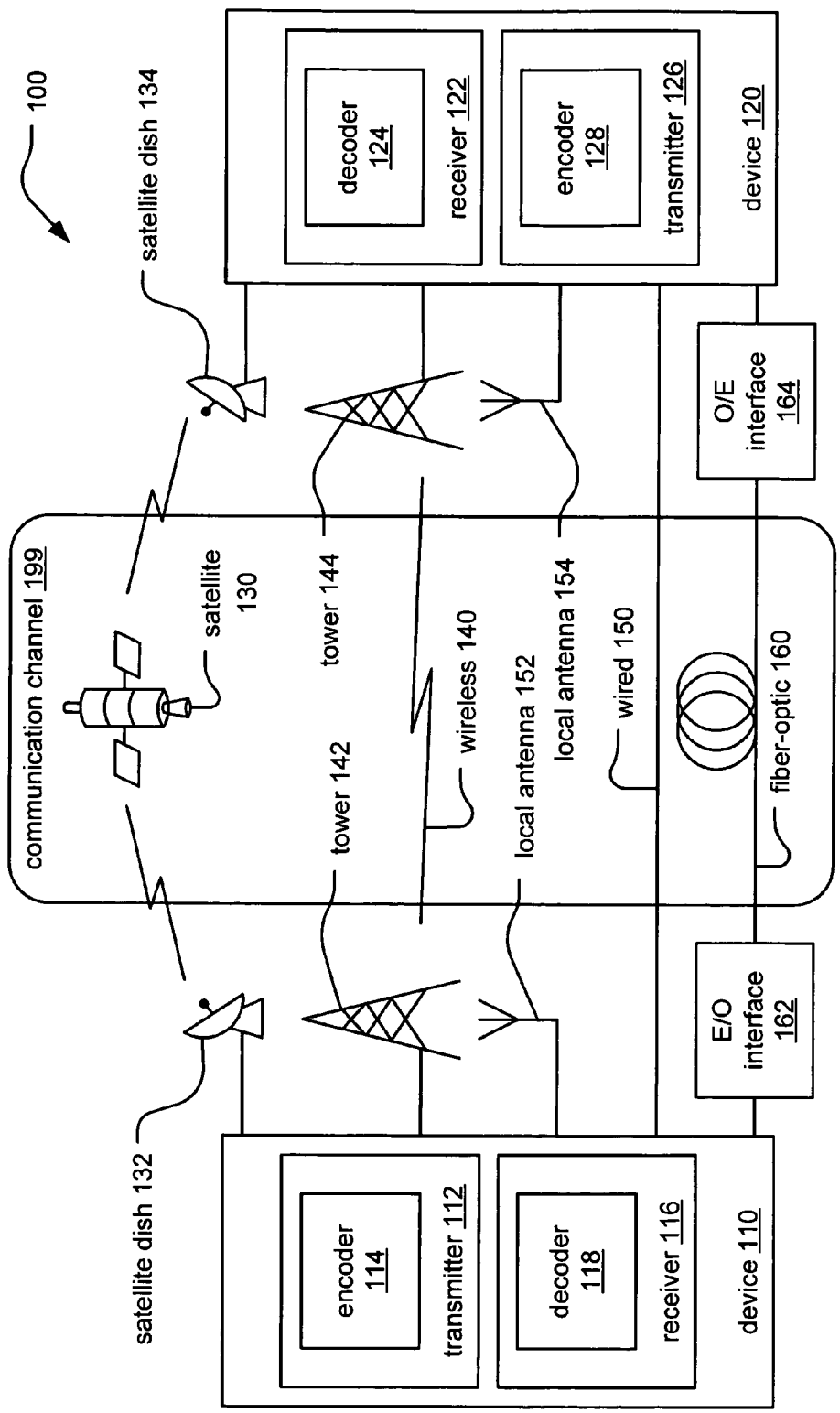
FIG. 1 and FIG. 2 are diagrams illustrating various embodiments of communication systems that may be built in accordance with certain aspects of the invention.
Figure 2:
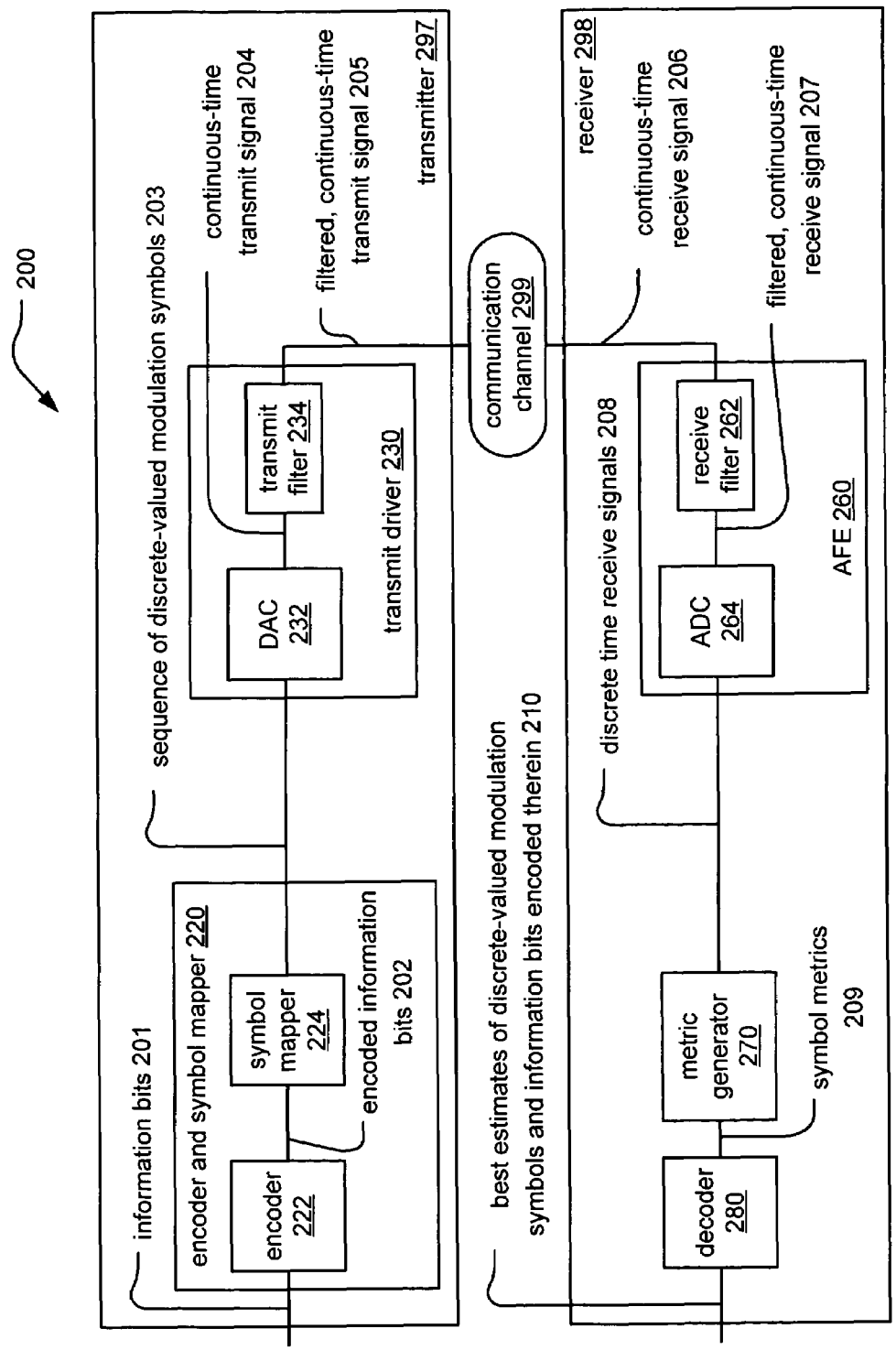

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects of the invention therein. In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Figure 3:
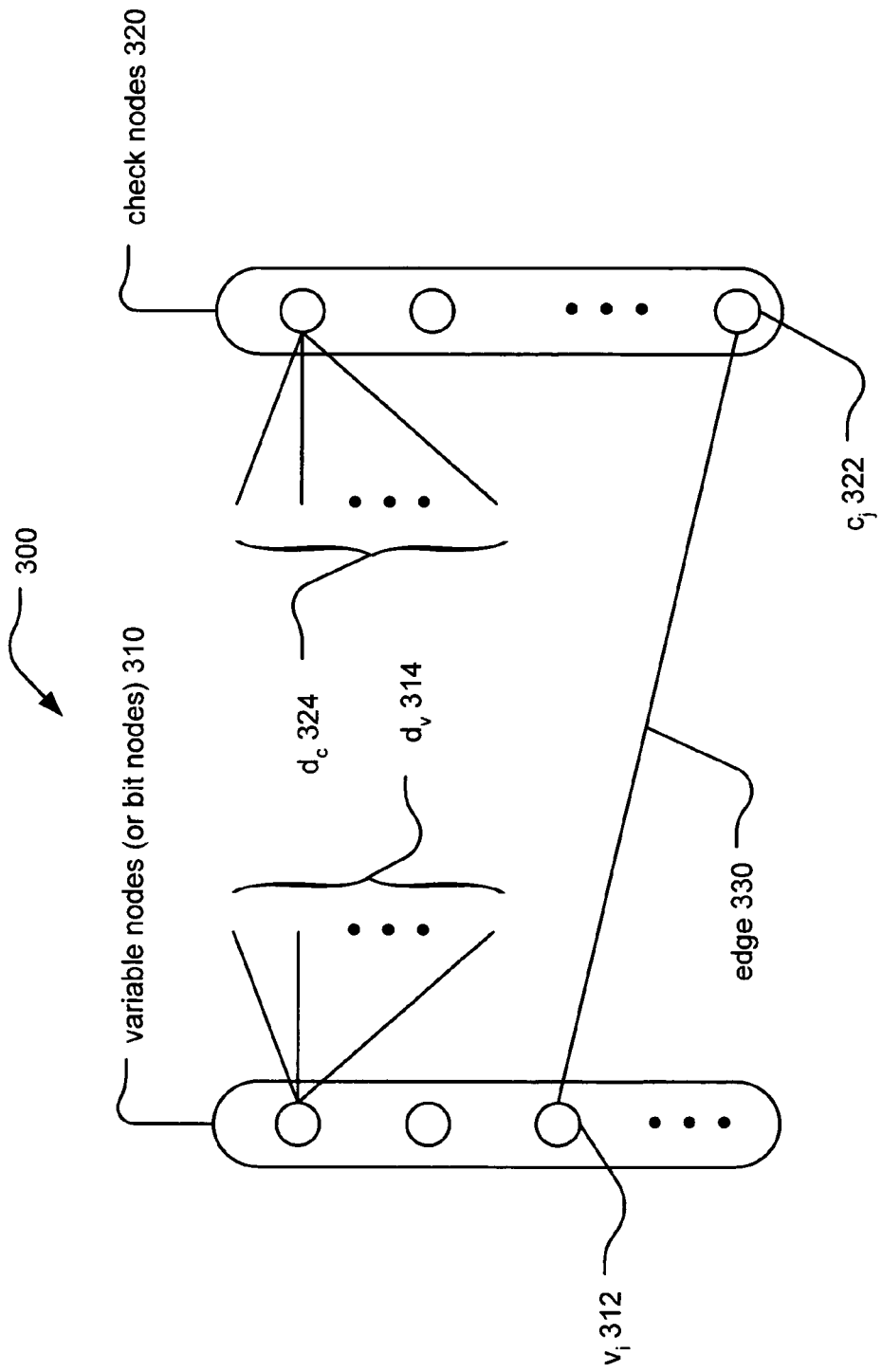
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also be referred to as a Tanner graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

"[2] M. G. Luby, M. Mitzenmacher, M. A. Shokrollahi, D. A. Spielman, and V. Stemann, "Practical loss-resilient codes," *Proc. 29$^{th}$ Symp. on Theory of Computing*, 1997, pp. 150-159".

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j); the nodes of the edge may alternatively be denoted as by e=(v(e), c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$, and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

The LLR (Log-Likelihood Ratio) decoding approach of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code's parity check matrix that is used to check the parity of the received vector. The LLR is the logarithm of the ratio of these two calculated probabilities. This LLR gives a measure of the degree to which the communication channel over which a signal is transmitted may undesirably affect the bits within the vector.

The LLR decoding of LDPC codes may be described mathematically as follows:

Beginning with $C=\{v|v=(v_0,\ldots,v_{N-1}), vH^T=0\}$ being an LDPC code and viewing a received vector, $y=(y_0,\ldots,y_{N-1})$, within the sent signal having the form of $((-1)^{v_{0i}},\ldots,(-1)^{v_{N-1}})$, then the metrics of the channel may be defined as $p(y_i|v_i=0)$, $p(y_i|v_i=1)$, $i=0,\ldots,N-1$. The LLR of a metric, $L_{metric}(i)$, will then be defined as follows:

$$L_{metric}(i) = \ln \frac{p(y_i \mid v_i = 0)}{p(y_i \mid v_i = 1)}$$

It is noted than "ln," as depicted herein within various mathematical expressions, refers to the natural logarithm having base e.

For every variable node $v_i$, its LLR information value will then be defined as follows:

$$\ln \frac{p(v_i = 0 \mid y_i)}{p(v_i = 1 \mid y_i)} = L_{metric}(i) + \ln \frac{p(v_i = 0)}{p(v_i = 1)}$$

Since the variable node, $v_i$, is in an LDPC codeword, then the value of the ratio of these values, $$\ln \frac{p(v_i = 0)}{p(v_i = 1)},$$

may be replaced by the following $$\ln \frac{p(v_i = 0, vH^T = 0 \mid y)}{p(v_i = 1, vH^T = 0 \mid y)} = \sum_{(i,j) \in E_v(i)} \ln \frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of $$\ln \frac{p(v_i = 0, vh_j^T = 0 \mid y)}{p(v_i = 1, vh_j^T = 0 \mid y)}$$

may be replaced by the following relationship $$L_{check}(i, j) = \ln \frac{p\left(\sum_{e \in E_c(j)\setminus\{(i,j)\}} v_{v(e)} = 0 \mid y\right)}{p\left(\sum_{e \in E_c(j)\setminus\{(i,j)\}} v_{v(e)} = 1 \mid y\right)}$$

$L_{check}(i, j)$ is called the EXT (extrinsic) information of the check node $c_j$ with respect to the edge $(i, j)$. In addition, it is noted that $e \in E_c(j)\setminus\{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge $(i, j)$ may be defined as follows:

$$L_{var}(i, j) = L_{metric}(i) + \sum_{(i,k) \in E_v(i)\setminus\{(i,j)\}} L_{check}(i, k).$$

Figure 4:
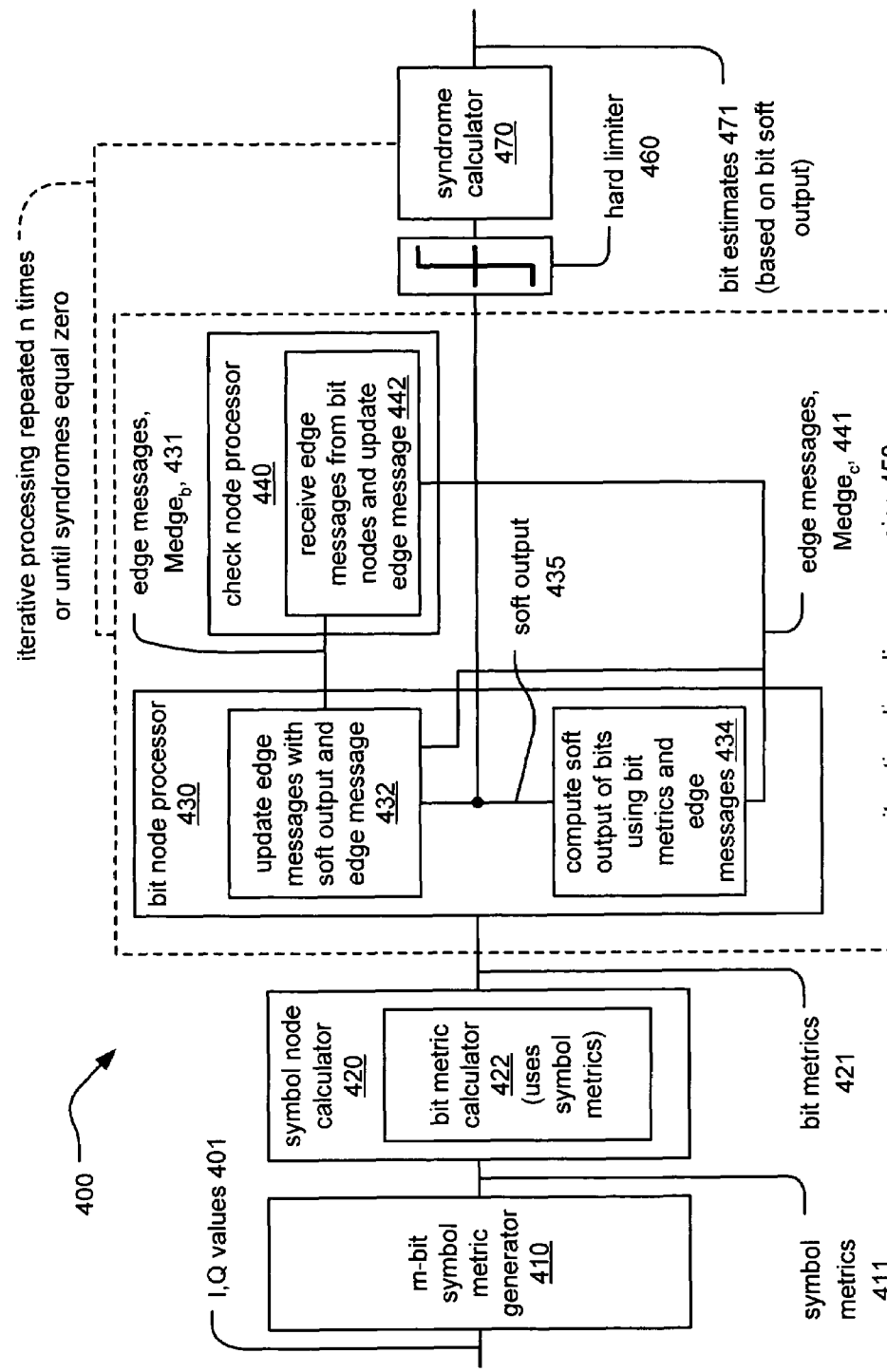
FIG. 4 is a diagram illustrating an embodiment of LDPC (Low Density Parity Check) decoding functionality using bit metric according to certain aspects of the invention.

FIG. 4 is a diagram illustrating an embodiment of LDPC (Low Density Parity Check) decoding functionality using bit metric 400 according to certain aspects of the invention. To perform decoding of an LDPC coded signal having an m-bit signal sequence, the functionality of this diagram may be employed. After receiving the I, Q (In-phase, Quadrature) values 401 of a signal at the symbol nodes, an m-bit symbol metric generator 410 calculates the corresponding symbol metrics 411. At the symbol nodes, these symbol metrics 411 are then passed to a symbol node calculator functional block 420 that uses these received symbol metrics 411 to calculate the bit metrics 421 corresponding to those symbols. These bit metrics 421 are then passed to the bit nodes connected to the symbol nodes according to the LDPC code bipartite graph by which the LDPC coded signal has been generated and by which it is to be decoded.

Thereafter, at the bit nodes, a bit node processor 430 operates to compute the corresponding soft messages of the bits. Then, in accordance with iterative decoding processing 450, the bit node processor 430 receives the edge messages with respect to the check nodes, Medge$_c$ 441, from a check node processor 440 and updates the edge messages with respect to the bit nodes, Medge$_b$ 431, with the bit metrics 421 received from the symbol node calculator functional block 420. These edge messages with respect to the bit nodes, Medge$_b$ 431, after being updated, are then passed to the check node processor 440.

At the check nodes, the check node processor 440 then receives these edge messages with respect to the bit nodes, Medge$_b$ 431, (from the bit node processor 430) and updates the them accordingly thereby generating the next updated version of edge messages with respect to the check nodes, Medge$_c$ 441; this is shown in functional block 442. These updated edge messages with respect to the check nodes, Medge$_c$ 441, are then passed back to the bit nodes (e.g., to the bit node processor 430) where the soft output of the bits is calculated using the bit metrics 421 and the current iteration values of the edge messages with respect to the bit nodes, Medge$_b$ 431; this is shown in functional block 434. Thereafter, using this just calculated soft output of the bits (shown as the soft output 435), the bit node processor 430 updates the edge messages with respect to the bit nodes, Medge$_b$ 431, using the previous values of the edge messages with respect to the bit nodes, Medge$_b$ 431 (from the just previous iteration) and the just calculated soft output 435; this is shown in functional block 432. The iterative decoding processing 450 continues between the bit nodes and the check nodes (i.e., between the bit node processor 450 and the check node processor 440) according to the LDPC code bipartite graph that was employed to encode and generate the signal that is being decoded.

These iterative decoding processing steps, performed by the bit node processor 430 and the check node processor 440, are repeated a predetermined number of iterations (e.g., repeated n times, where n is selectable). Alternatively, these iterative decoding processing steps are repeated until the syndromes of the LDPC code are all equal to zero.

The soft output 435 is generated within the bit node processor 430 during each of the decoding iterations. In this embodiment, this soft output 435 may be provided to a hard limiter 460 where hard decisions may be made, and that hard decision information may be provided to a syndrome calculator 470 to determine whether the syndromes of the LDPC code are all equal to zero. When the syndromes are not equal to zero, the iterative decoding processing 450 continues again by appropriately updating and passing the edge messages between the bit node processor 430 and the check node processor 440. For example, the edge messages with respect to the bit nodes, Medge$_b$ 431, are passed to the check node processor 440 from the bit node processor 430. Analogously, the edge messages with respect to the check nodes, Medge$_c$ 441, are passed to the bit node processor 430 from the check node processor 440 from. In some embodiments, the soft output 435 and the syndrome calculation performed by the syndrome calculator 470 are both performed during every decoding iteration.

After all of these steps of the iterative decoding processing 450 have been performed, then the best estimates of the bits (shown as bit estimates 471) are output based on the bit soft output. In the approach of this embodiment, the bit metric values that are calculated by the symbol node calculator functional block 420 are fixed values and used repeatedly in updating the bit node values.

Figure 5:
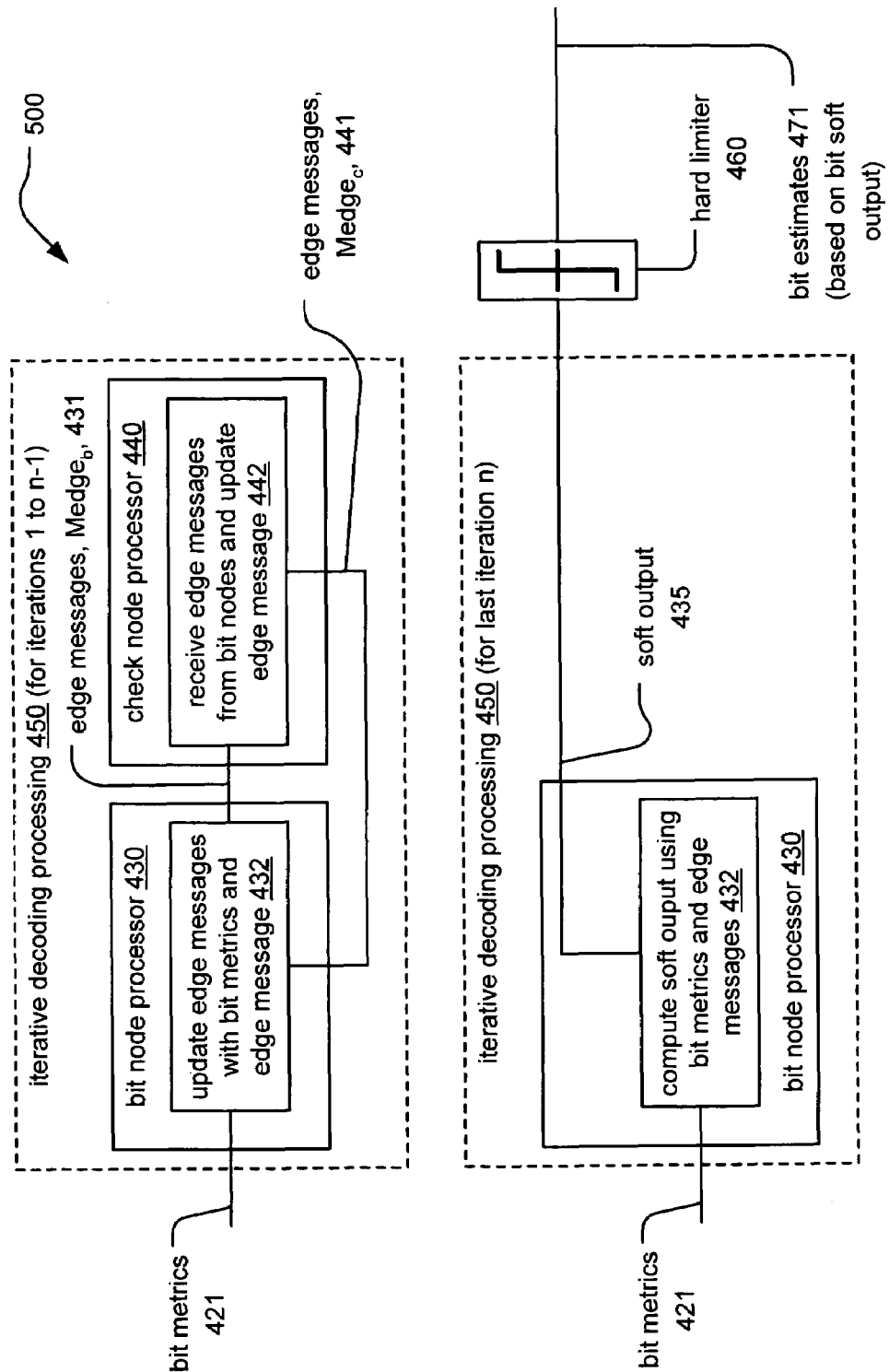
FIG. 5 is a diagram illustrating an alternative embodiment of LDPC decoding functionality using bit metric according to certain aspects of the invention (when performing n number of iterations).

FIG. 5 is a diagram illustrating an alternative embodiment of LDPC decoding functionality using bit metric 500 according to certain aspects of the invention (when performing n number of iterations). This embodiment shows how the iterative decoding processing 450 of the FIG. 4 may be performed when a predetermined number of decoding iterations, shown as n, is performed. If the number of decoding iterations is known beforehand, as in a predetermined number of decoding iterations embodiment, then the bit node processor 430 may perform the updating of its corresponding edge messages with respect to the bit nodes, Medge$_b$ 431, using the bit metrics 421 themselves (and not the soft output 435 as shown in the previous embodiment and described above). This processing may be performed in all but the last decoding iteration (e.g., for iterations 1 through n−1). However, during the last iteration, the bit node processor 430 calculates the soft output 435. The soft output 435 is then provided to the hard limiter 460 where hard decisions may be made of the bits. The syndromes need not be calculated in this embodiment since only a predetermined number of decoding iterations are being performed.

Oftentimes, when implementing LDPC decoding functionality into actual communication devices and hardware, a critical design consideration is how to implement the hardware so that the calculations may be performed as quickly as possible and also with the highest degree of accuracy as possible. Also, hardware implementations of such LDPC decoding functionality can be implemented within the logarithmic domain (or "log domain" for short). In doing this, the hardware implementations can sometimes be simplified, in that, the multiplication processes may be reduced to additions, and the division processes may be reduced to subtractions. Oftentimes, the difficulty in implementing the calculations necessary to perform the LDPC decoding processing lie in the difficult to implement the calculations necessary to perform check node processing. For example, the calculations performed within a check node processor (or bit-check processor that is performing check node processing) often require the determination of a minimum (or maximum) value from among a number of possible values. When these calculations are performed in actual hardware whose calculations are implemented in the log domain, this often involves determining this minimum (or maximum) value at the cost of some precision. That is to say, without employing some log correction factor within the calculations, then a loss of precision may be incurred. Even when implemented in the log domain, some prior art decoding approaches only select a minimum (or maximum) value from among a number of possible values without employing any log correction factor. This inherently introduced some imprecision when selecting a minimum (or maximum) value from among a number of possible values when operating in the log domain.

Several of these calculations are presented below with respect to operating on an input value "x" and an input value "y." These input values may be viewed as being different edge messages with respect to the bit nodes, Medge$_b$. For example, the input value "x" may be viewed as being a first edge message with respect to the bit nodes, Medge$_b$(1), and the input value "y" may be viewed as being a second edge message with respect to the bit nodes, Medge$_b$(2), or vice versa. The check node processing of these edge messages with respect to the bit nodes, Medge$_b$, using any of the various possible embodiments presented herein, is employed to generate the corresponding updated edge messages with respect to the check nodes, Medge$_c$.

The inventors have developed a number of means by which these calculations may be performed while still maintaining a high degree of accuracy when performing check node processing. These calculations include min* (min-star) processing, min*− (min-star-minus) processing, min (min-double-star) processing, min− (min-double-star-minus) processing. In addition, each of these processing approaches has a corresponding maximum related function: max* (max-star) processing, max*− (max-star-minus) processing, max (max-double-star) processing, max− (max-double-star-minus) processing. In addition, other processing approaches may be employed including min' (min-prime) processing, min† (min-dagger) processing, min†− (min-dagger-minus) processing, min†† (min-double-dagger) processing. Several of these possible calculations are presented below with respect to operating on an input value "x" and an input value "y."

min* processing and min*− processing:

$$\text{min}^*(x, y) = \min(x, y) - \ln(1 + \exp(-|x - y|))$$
$$\text{min}^*-(x, y) = \min(x, y) - \ln(1 - \exp(-|x - y|))$$

-continued max* processing and max*− processing:

$$\text{max}^*(x, y) = \max(x, y) + \ln(1 + \exp(-|x - y|))$$
$$\text{max}^*-(x, y) = \max(x, y) + \ln(1 - \exp(-|x - y|))$$

min processing and min− processing:

$$\text{min}^{**}(x, y) = \min(x, y) - \ln(1 + \exp(-|x - y|)) + \ln(1 + \exp(-(x + y)))$$
$$\text{min}^{**}-(x, y) = \min(x, y) - \ln(1 - \exp(-|x - y|)) + \ln(1 - \exp(-(x + y)))$$

max processing and max− processing:

$$\text{max}^{**}(x, y) = \max(x, y) + \ln(1 + \exp(-|x - y|)) - \ln(1 + \exp(-(x + y)))$$
$$\text{max}^{**}-(x, y) = \max(x, y) + \ln(1 - \exp(-|x - y|)) - \ln(1 + \exp(-(x + y)))$$

min' processing:

$$\text{min}'(x, y) = \begin{cases} \text{min}^*(x, y) & \text{min}^*(x, y) > 0 \\ 0 & \text{otherwise} \end{cases}$$

min† processing:

$$\text{min}\dagger(x, y) = \begin{cases} \text{min}^*(x, y) & \text{min}^*(x, y) \geq 0 \\ 0 & \text{otherwise} \end{cases}$$

min† − processing:

$$\text{min}\dagger-(x, y) = \begin{cases} \text{min}^*-(x, y) & \text{min}^*(-x, y) > 0 \\ 0 & \text{otherwise} \end{cases}$$

The functionality and processing of many of these various types of processing are presented below in conjunction with accompanying diagrams. With respect to the min†† (min-double-dagger) processing, this min†† processing may be viewed as being somewhat analogous to min* processing with the additional functionality of minimum comparison processing. As can be seen below in one possible such embodiment, the minimum comparison processing performed within the min†† processing may be implemented when the values operated on are implemented in sign-magnitude format. This sign-magnitude format makes it a bit easier to find the minimum value from among a plurality of values.

Certain aspects of the invention provide for extremely fast and efficient hardware implementations of these calculations that may be employed when performing check node processing when decoding LDPC coded signals. In addition, various architectures are presented below showing how and where these various calculations are performed within the decoding processing operations.

FIG. 6, FIG. 7, FIG. 8, and FIG. 9 are diagrams illustrating various alternative embodiments of LDPC decoding functionality according to certain aspects of the invention.

Figure 6:
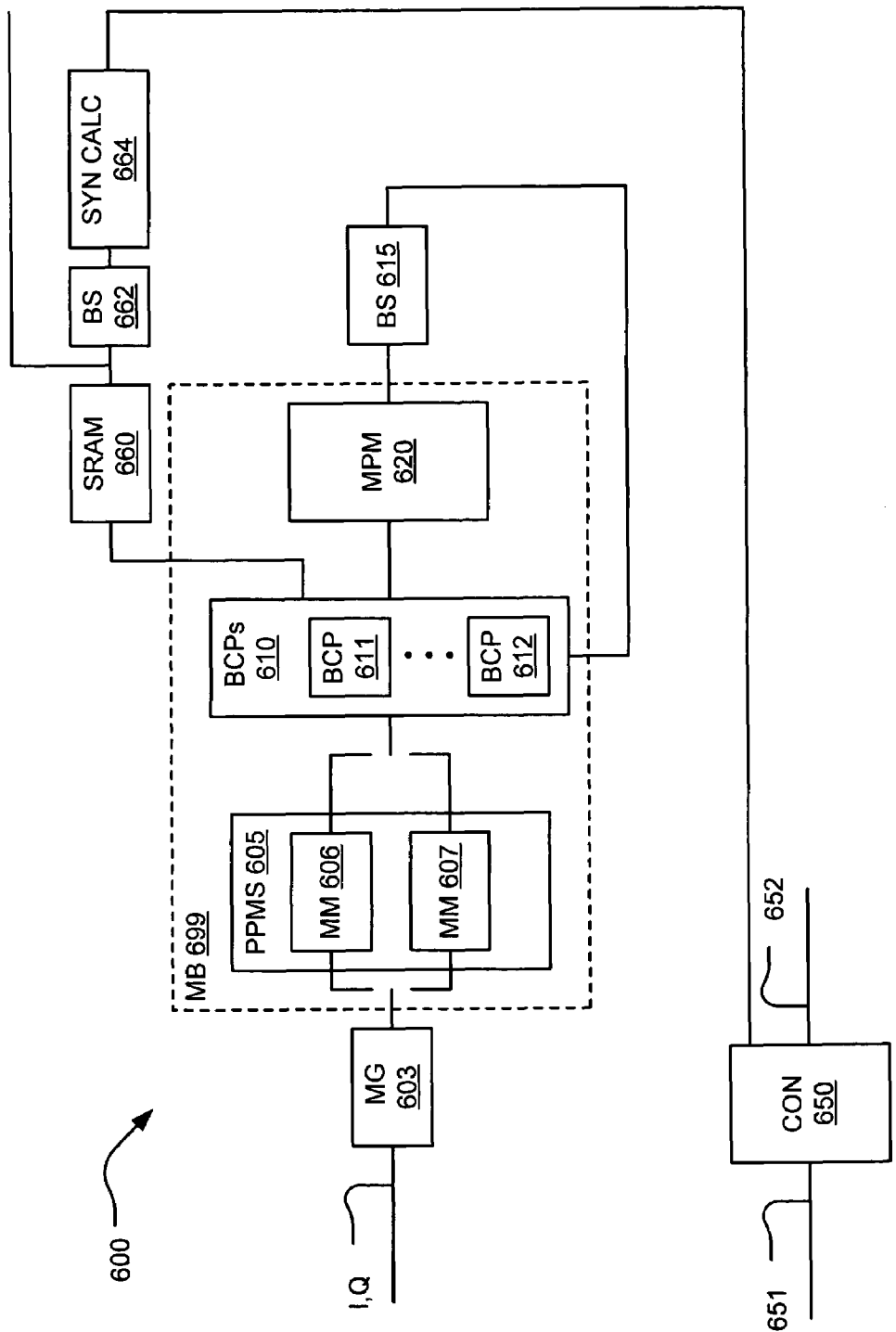
FIG. 6, FIG. 7, FIG. 8, and FIG. 9 are diagrams illustrating various alternative embodiments of LDPC decoding functionality according to certain aspects of the invention.

Referring to the LDPC decoding functionality 600 of FIG. 6, the I, Q (In-phase, Quadrature) values of a received symbol are provide to a metric generator 603 (shown as MG 603). These I, Q values may be viewed as coming from a pre-processing functional block within a communication device that performs the preliminary processing of a continuous time signal that is received from a communication channel. For example, this pre-processing may include frequency conversion, receive filtering, digital sampling, gain adjustment, and/or equalization. These I, Q values correspond to discrete time signals that have been generated from the continuous time signal that is received from the communication channel.

The metric generator 603 calculates the bit metrics corresponding to at least one symbol that is to be decoded. This metric generator 603 performs the functionality of calculating the symbol metrics and also converting them to bit metrics. In some other embodiments above, two separate functional blocks are shown to perform this functionality of first calculating the symbol metrics from the received I, Q values and then subsequently calculating the bit metrics from the symbol metrics.

The bit metrics are provided to a ping-pong memory structure 605 (shown as PPMS 605) from the metric generator 603. The ping-pong memory structure 605 includes two separate metric memories 606 and 607 (shown as MM 606 and MM 607). When the metric generator 603 is providing the bit metrics that corresponding to one symbol or group of symbols to the metric memory 606 of the ping-pong memory structure 605, earlier provided bit metrics are being output from the metric memory 606 of the ping-pong memory structure 605. Generally speaking, within the ping-pong memory structure 605, a first plurality of bit metrics is written to metric memory 606 when a second plurality of bit metrics is read from metric memory 607. The first plurality of bit metrics may correspond to bit metrics for each symbol within a first frame of symbols, and the second plurality of bit metrics may correspond to symbols metrics for each symbol within a second frame of symbols.

The appropriate bit metrics are output from the ping-pong memory structure 605 and provided to a plurality of bit/check processors 610 (shown as BCPs 610). The plurality of bit/check processors 610 includes a number of bit/check processors as shown by BCP 611, ..., and BCP 612. It is noted that a singular group of processing blocks, namely the plurality of bit/check processors 610, is capable to performing both bit node processing and check node processing in accordance with certain aspects of the invention. That is to say, the very same hardware within the plurality of bit/check processors 610 may be employed to perform both bit node processing and check node processing when decoding LDPC coded signals. This is possible, in part, by the use of a barrel shifter 615 (shown as BS 615) in combination with a message passing memory 620 (shown as MPM 620). It is noted that by using an efficient address scheme (more details of which are provided below), this message passing memory 620 is operable to store both types of the edge messages with respect to the plurality of bit nodes (i.e., (1) the edge messages corresponding to information bits and (2) the edge messages corresponding to parity bits). This is a significant departure from the prior art, in that, two separate memory structures/devices are typically employed to store these two different types of edge messages with respect to the plurality of bit nodes. However, this single memory device (i.e., the message passing memory 620) is operable to store both of these types of edge messages.

When the plurality of bit/check processors 610 are performing bit node processing (i.e., updating the edge messages with respect to the bit nodes, Medge$_b$), and after these updated edges messages with respect to the bit nodes, Medge$_b$, have been written to the message passing memory 620, then the barrel shifter 615 ensures that these edge messages are accessed from the message passing memory 620 in a particular and controlled manner for their use in the next iteration of check node processing (i.e., updating the edge messages with respect to the check nodes, Medge$_c$).

The barrel shifter 615 controls the manner of accessing the edge messages with respect to the bit nodes, Medge$_b$, from the message passing memory 620 so that they may be appropriately read out from the message passing memory 620 for use by the very same plurality of bit/check processors 610 for use in subsequent check node processing (i.e., updating the edge messages with respect to the check nodes, Medge$_c$). The use of the barrel shifter 615 situated after the message passing memory 620 allows for the use of the same functional blocks (i.e., the same hardware of the plurality of bit/check processors 610) to be able to perform both check node processing and bit node processing. This creates a significant reduction in size and complexity of an actual communication device implemented to perform decoding of LDPC coded signals.

It is also noted that the barrel shifter 615 could alternatively be interposed between the after the plurality of bit/check processors 610 and the message passing memory 620 on another path of connectivity. This embodiment is explored in more detail below.

Regardless of precisely where the barrel shifter 615 is situated, the plurality of bit/check processors 610, the barrel shifter 615, and the message passing memory 620 operate cooperatively to perform iterative decoding processing of LDPC coded signals thereby generating soft output of the decoded bits using the most recently updated edge messages with respect to the bit nodes, Medge$_b$. The hard decisions (generating after a last decoding iteration or when all syndromes are equal to zero) corresponding to this soft output of the decoded bits is then provided to a SRAM (Static Random Access Memory) 660 (shown as SRAM 660). These hard decisions stored in the SRAM 660 are the best estimates of the decoded bits based on the originally received the I, Q values of the signal being decoded. Before a last decoding iteration or before all syndromes are equal to zero, soft output of the decoded bits is provided to the SRAM 660.

This soft output of the decoded bits is provided to a group of functional blocks that are cooperatively operable to perform the syndrome checking by using the parity check of the LDPC code by which the LDPC coded signal was originally generated. This is performed to determine if the decoded bit is part of a valid codeword. After the soft input is appropriately input and then output from the SRAM 660, the soft output is passed through another barrel shifter 662 (shown as BS 662), and the soft output is passed subsequently to a syndrome calculation functional block 664 (shown as SYN CALC 664). If the syndromes pass (i.e., all of the inputs to the syndrome calculation functional block 664 are equal to zero), then a controller 650 (shown as CON 650) is notified of this as the iterative decoding processing may finish. More details of the controller 650 are provided below.

In addition, the controller 650 is also implemented and is operable to provide control signals 652 based on the LDPC code selected 651. For example, the LDPC decoding functionality 600 is operable to decode a wide variety of LDPC coded signals including those that are DVB-S2 compliant. Looking at the example of DVB-S2 compliant signals, with the included functionality therein of VCM (Variable Coding and Modulation) and ACM (Adaptive Coding and Modulation) therein, the code rates (as well as modulation types) of LDPC coded signal can be changed dynamically, on a frame by frame basis. That is to say, a first frame may be encoded using a first code rate and a first modulation type, and a second frame may be encoded using a second code rate and a second modulation type. Base on the selected LDPC code 651, the controller 650 provides the appropriate decoding control signals 652 to the other functional blocks within the LDPC decoding functionality 600. This will ensure that the appropriate bit metrics are calculated within the metric generator 603 for the received I, Q values. Moreover, based on the decoding control signals 652, the plurality of bit/check processors 610, the barrel shifter 615, and the message passing memory 620 all also are operate cooperatively to perform LDPC decoding of a received signal according to the manner by which the signal was generated at the transmit end of a communication channel that provides the continuous time signal from which the I, Q values are eventually extracted and provided to the LDPC decoding functionality 600 for subsequent decoding.

The decoding control signals 652 inform the plurality of bit/check processors 610, the barrel shifter 615, and the message passing memory 620 of the particular signal type and properties thereof so that the appropriate parity check matrix is employed when decoding the received signal. The decoding control signals 652 also direct the barrel shifter 615 to perform the appropriate degree of shifting to the edge messages with respect to the bit nodes, $Medge_b$ (as well as the edge messages with respect to the check nodes, $Medge_c$—depending at what time the LDPC decoding functionality 600 is viewed). Because of this appropriate shifting of the two types of edge messages being performed by the barrel shifter 615, both the edge messages with respect to the bit nodes, $Medge_b$ (as well as the edge messages with respect to the check nodes, $Medge_c$) are stored in the message passing memory 620 in a manner such that they may be retrieved there from for use in the subsequent step of iterative decoding processing by the plurality of bit/check processors 610. It is also noted that, for both the information bits and the parity bits, the degree of shifting performed by the barrel shifter 615 must be undone after check node processing within the plurality of bit/check processors 610 and before doing the next bit node processing step within the plurality of bit/check processors 610. As can be seen, it is the use of the barrel shifter 615 that is integral to allowing the same hardware (namely, the plurality of bit/check processors 610) to perform both bit node processing and check node processing. As one example, when decoding a group of X bits, then if a shift of N is performed before doing check node processing, then a barrel shift of X-N needs to be performed to get the bits back to their original position before doing bit node processing.

Knowing a particular set of LDPC coded signals that are going to be decoded by the LDPC decoding functionality 600, the amount of shifting to be performed by the barrel shifter 615 may be implemented in a ROM (Read Only Memory) device. This would provide for very fast operation and processing when decoding an actual signal. The shift values stored within the ROM are selected based on the connectivity of the edges between the bit nodes and the check nodes within the LDPC bipartite graph by which the LDPC coded signal has been generated.

The use of the controller 650 ensures that the LDPC decoding functionality 600 is operable to decode a wide variety of LDPC coded signals. The DVB-S2 compliant signals are one possible type of signals that may be decoded using the LDPC decoding functionality 600. However, the LDPC decoding functionality 600 is also adaptable to perform decoding of other LDPC coded signals as well. Moreover, with the functionality provided by the controller 650, the LDPC decoding functionality 600 is also capable to perform decoding of LDPC coded signals whose code rate and/or modulation (including constellation shape and mapping) may vary as frequently as on a block by block basis. For example, a block may be viewed as being a group of symbols within a frame. In some instances, a frame may include multiple blocks. The DVB-S2 compliant signals generally include a common code rate and modulation (including constellation shape and mapping) for all of the symbols within a frame, and the code rate and/or modulation varies only as frequently as on a frame by frame basis therein.

As mentioned above, the plurality of bit/check processors 610 includes a number of bit/check processors as shown by BCP 611, . . . , and BCP 612. The selection of how many bit/check processors may be implemented within the plurality of bit/check processors 610 may be selected by a designer. The selection of how many bit/check processors may be implemented within the plurality of bit/check processors 610 may be made based on a number of factors including the number of bits being decoded, the number of bit/check processors within the plurality of bit/check processors 610, the throughput speed desired, and the overall area willing to be consumed. The selection of more bit/check processors within the plurality of bit/check processors 610 lends to more parallel type processing.

It is also noted that several instantiations of the macro block 699 (shown as MB 699) may be implemented to support parallel processing even further. In this embodiment, the macro block includes the ping-pong memory structure 605, the plurality of bit/check processors 610, and the message passing memory 620. Other embodiments are also shown below by which multiple instantiations of macro blocks are employed to support an even more efficient implementation is consuming an even smaller total area. Generally speaking, the total number of macro blocks selected is to ensure that the total area of the device is the smallest possible. With respect to the macro block 699, it is also noted that the barrel shifter 615 need not necessarily be implemented therein. In this embodiment, the barrel shifter is in fact implemented outside of the macro block 699 and is operable to service a plurality of macro blocks 699. However, the barrel shifter 615 may also be implemented inside of the macro block 699 without departing from the scope and spirit of the invention (as will be seen in other embodiments described below). However, generally speaking, it may be preferable to situate the barrel shifter 615 outside of the macro block 699 as it is typically desirable not to impede or slow down the access time of the message passing memory 620 (which may be implemented using RAM (Random Access Memory)). When the barrel shifter 615 outside of the macro block 699, there may be a need to use a pipeline register to ensure synchronization of the access to and from the message passing memory 620.

Also, the manner by which the various functional blocks of the LDPC decoding functionality 600 are implemented (by using the barrel shifter 615 in conjunction with the singular functional block of the message passing memory 620) allows for the use of a single port memory device for the message passing memory 620; this inherently occupies less area than a dual port memory device while also consuming less power than a dual port memory device.

As mentioned above, there are many different types of LDPC coded signals that may be decoding using the LDPC decoding functionality 600. One possible and specific example of the bit and word widths, as well as the number of bit/check processors within the plurality of bit/check processors 610 is provided below to show their relationship in a particularized situation. The I, Q values that are provided to the metric generator 603 may be 7 bits each. The bit metrics that are generated by the metric generator 603, using the 7 bit I, Q values, may be values of 6 bits each. Therefore, each of the two separate metric memories 606 and 607 operates on values of 180×360×6 bits; this is required for DVB-S2 block length of 64,800 bits.

In designing an architecture that is capable to decode DVB-S2 compliant signals, there may be bit metrics output from the metric generator 603 of 360×6 bits; that is to say, there may be 360 different values of 6 bits each. These bit metrics provided to the plurality of bit/check processors 610 may be provided to 360 separate bit/check processors arranged in a parallel configuration. More specifically, the plurality of bit/check processors 610 may include the BCP 611 (which is a $1^{st}$ bit/check processor), . . . , and BCP 612 (which is a $360^{th}$ bit/check processor). From the 360 separate of the plurality of bit/check processors 610, the appropriately edge messages may be output as 6 bit values. Therefore, there is a total of 360×6 bits output from the 360 separate of the plurality of bit/check processors 610; 6 bit edge messages are output from each bit/check processor of the plurality of bit/check processors 610. Analogously, the appropriately shifted edge messages within the barrel shifter 615 are also of 6 bits each. Therefore, there is a total of 360×6 bits output from the barrel shifter 615 as well. Also in accordance with decoding DVB-S2 compliant signals, the message passing memory 620 may pass values of up to 792×360×6 bits. There may therefore be 360 decoded bits that are output from the SRAM 660.

It is also noted that these bit values described within this paragraph are only exemplary of one possible embodiment by which the LDPC decoding functionality 600 may be implemented. A significant variety of different embodiments may also be implemented in accordance with certain aspects of the invention using different numbers of bit widths for the various values depicted herein.

Figure 7:
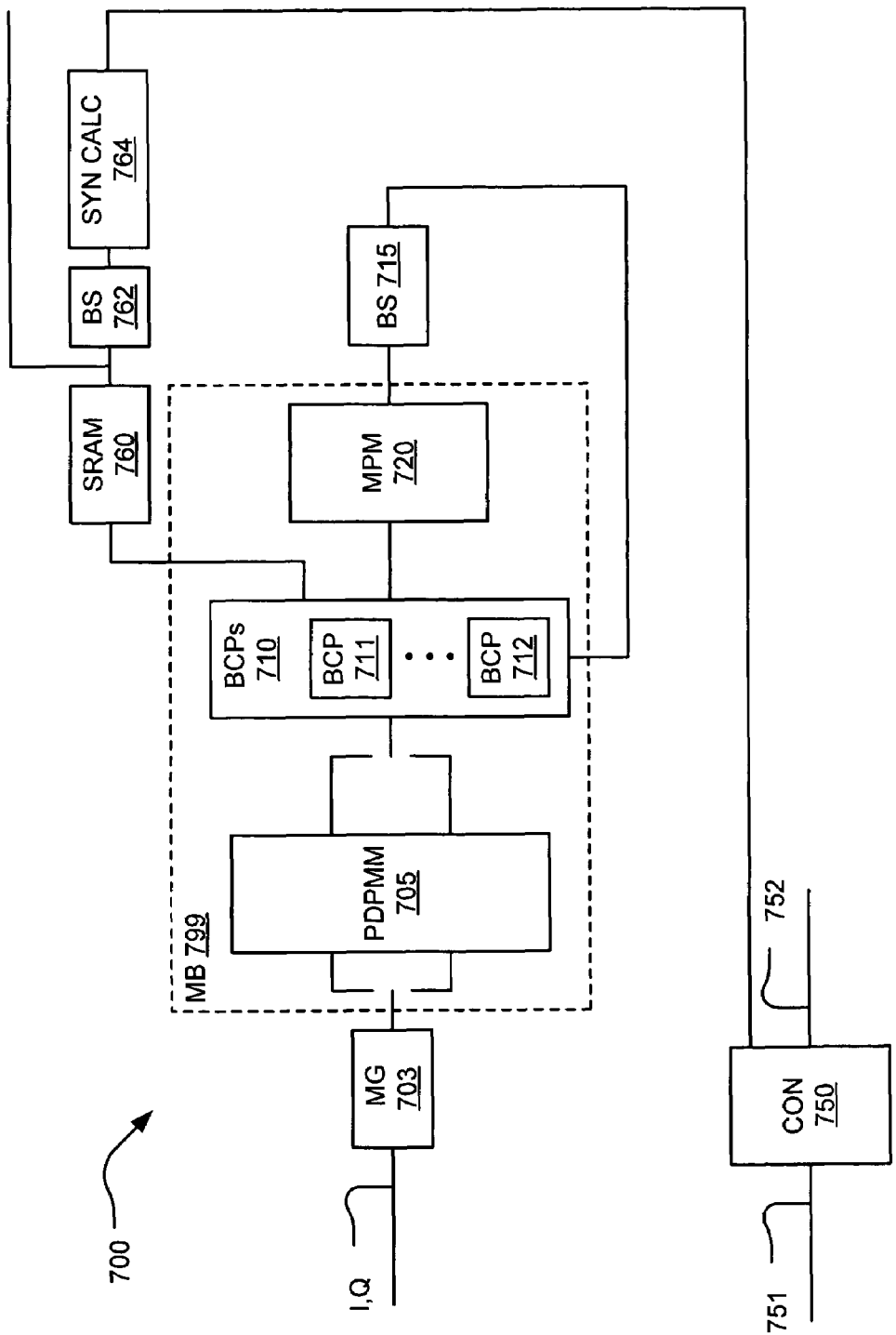

Referring to the LDPC decoding functionality 700 of FIG. 7, this embodiment is directly analogous to the embodiment of the LDPC decoding functionality 600 of FIG. 6 with the exception that a pseudo dual port metric memory 705 (shown as PDPMM 705) is employed instead of a ping-pong memory structure 605. The dual port memory management is operable to support dual port memory management even though it is a single port memory device. By using the pseudo dual port metric memory 705 of the FIG. 7 instead of the ping-pong memory structure 605 of the FIG. 6 (including dual port memory structures), a significant savings in terms of space may be made within the LDPC decoding functionality 700 when compared to the LDPC decoding functionality 600. In the embodiment of the FIG. 7, when operating on DVB-S2 compliant signals as similarly described above with respect to FIG. 6, the pseudo dual port metric memory 705 operates on values of 180×360×6 bits.

Figure 8:
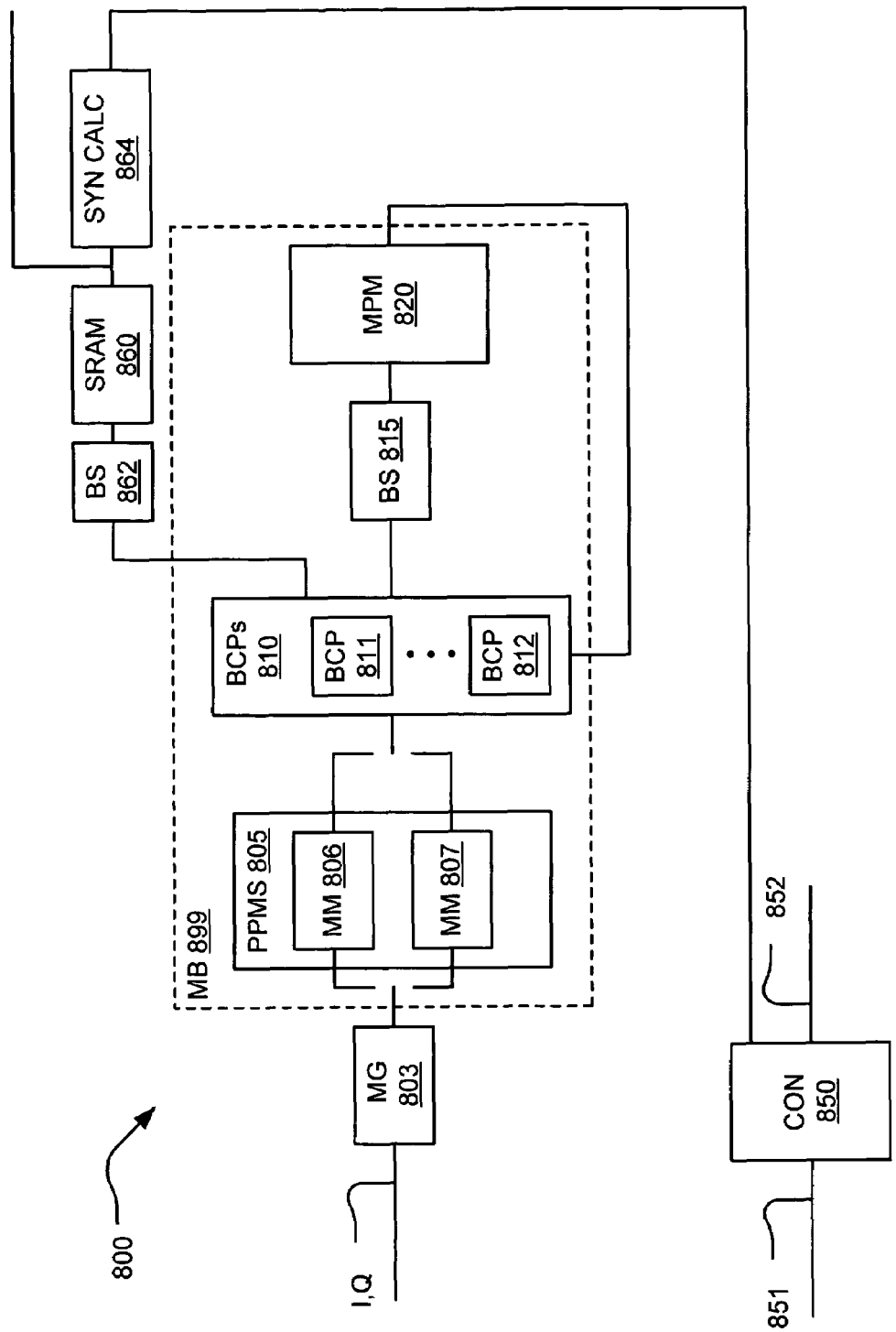

Referring to the LDPC decoding functionality 800 of FIG. 8, this embodiment is very similar to the embodiment of the LDPC decoding functionality 600 of FIG. 6 with respect to the I, Q inputs, the metric generator 803 (shown as MG 803), and the controller 850 (shown as CON 850) and the corresponding control signals 852 based on the LDPC code selected 851. However, the LDPC decoding functionality 800 includes a slightly modified macro block 899 (shown as MB 899) when compared to the macro block 699 of the FIG. 6. The macro block 899 may be replicated a predetermined number of times to assist in providing for even more efficient LDPC decoding functionality than the previous embodiments. The macro block 899 includes all of the functionality that may be replicated for an even more parallel processing architecture.

In this embodiment, the barrel shifter 815 is included within the macro block 899. This embodiment of the barrel shifter 815 is different than the embodiment of the barrel shifter 615 or the barrel shifter 715 in the previous embodiments, in that, the barrel shifter 815 in this embodiment services only the components within the actual macro block 899 in which it is situated. In contradistinction, the barrel shifter 615 or the barrel shifter 715 each service all of the instances of the macro blocks 699 and macro blocks 799 in their respective embodiments. As such, the barrel shifter 815 may be slightly less complex than the barrel shifter 615 or the barrel shifter 715.

Because the barrel shifter 815 is situated is situated differently that the barrel shifter 615 or the barrel shifter 715, care must be taken to ensure that the edge messages are appropriately shifted for subsequent check node processing or bit node processing within the plurality of bit/check processors 810. Also, because the barrel shifter 815 is situated is situated differently that the barrel shifter 615 or the barrel shifter 715, the BS 862 and the SRAM 860 are rearranged in order to accommodate this different order of processing.

A design that is capable to decode DVB-S2 complaint signals may include 18 separate instantiations of macro blocks 899. The I, Q values that are provided to the metric generator 803 may be 7 bits each. The bit metrics that are generated by the metric generator 803, using the 7 bit I, Q values, may be values of 6 bits each.

However, each of the macro blocks 899 of the FIG. 8 is implemented differently than the macro block 699 of the FIG. 6. The ping-pong memory structure 805 (shown as PPMS 805), that includes metric memories 806 and 807 (shown as MM 805 and MM 807), operates on values of 180×120 bits. These 120 bits are implemented as 20×6 bits each; that is to say, there are 20 separate values of 6 bits each. The bit metrics that are output from the ping-pong memory structure 805 are also of 120 bits (i.e., 20×6 bits each).

These bit metrics provided to the plurality of bit/check processors 810 may be provided to 20 separate bit/check processors arranged in a parallel configuration within each of the macro blocks 899. More specifically, the plurality of bit/check processors 810 may include the BCP 811 (which is a $1^{st}$ bit/check processor), . . . , and BCP 812 (which is a $20^{th}$ bit/check processor). From the 20 separate of the plurality of bit/check processors 810, the appropriately edge messages may be output as 120 bits (i.e., 20×6 bits each). Therefore, there is a total of 120 bits (i.e., 20×6 bits) output from the 20 separate of the plurality of bit/check processors 810 within each of the macro blocks 899. The 6 bit edge messages are output from each bit/check processor of the 20 bit/check processors of the plurality of bit/check processors 810. Analogously, the appropriately shifted edge messages within the barrel shifter 815 are also of 120 bits (i.e., 20×6 bits) each. Therefore, there is a total of 120 bits (i.e., 20×6 bits) output from the barrel shifter 815 as well. Also in accordance with decoding DVB-S2 compliant signals, the message passing memory 820 may pass values of 792×120 bits as well. There may therefore be 120 bits (i.e., 20×6 bits) decoded bits that are output from the SRAM 860.

As with other embodiments, it is also noted that the barrel shifter 815 may be implemented either inside or outside of any of the macro blocks 899. If the barrel shifter 815 is implemented on the outside of the macro block 899, a single barrel shifter may be implemented to operate on edge message values of 360×6 bits. However, when the barrel shifter 815 is implemented inside of the macro block 899, then there would be 18 separate barrel shifters (i.e., one is each macro block 899), operating on edge message values of 120 bits (i.e., 20×6 bits).

It is also noted that the number of macro blocks 899 may be selected so that total area of the LDPC decoding functionality 899 is the smallest as possible. As one example, to decode DVB-S2 compliant signals, the number of macro blocks times the number of bit/check processors within the plurality of bit/check processors 810 of each macro block 899 should be equal to 360. As an example, the 360 parallel processors may be selected to support the required throughput to be DVB-S2 compliant. In order to support higher throughput, more parallel processors are required.

Figure 9:
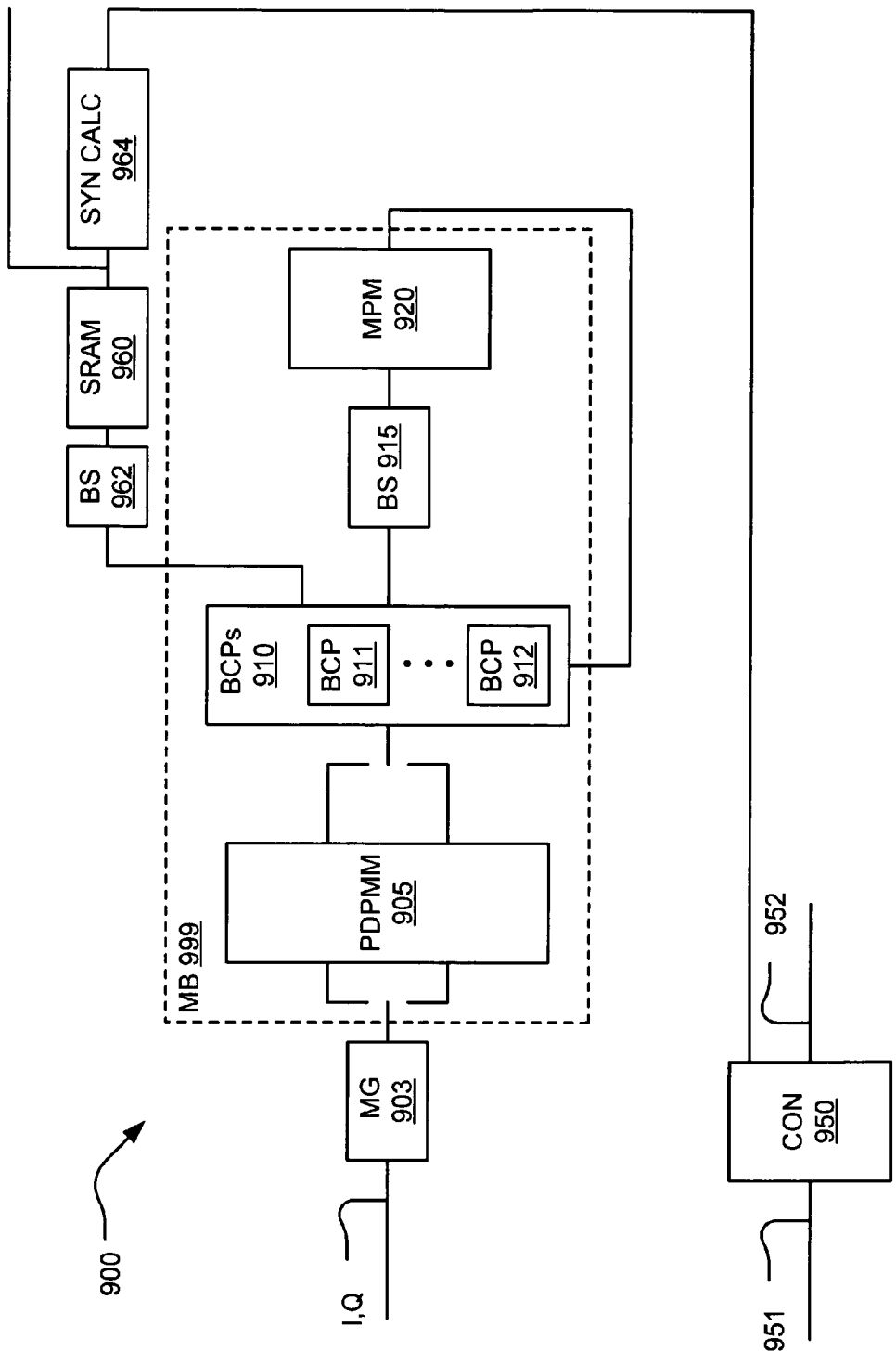

Referring to the LDPC decoding functionality 900 of FIG. 9, this embodiment is very similar to the embodiment of the LDPC decoding functionality 700 of FIG. 7 with respect to the I, Q inputs, the metric generator 903 (shown as MG 903), and the controller 950 (shown as CON 950) and the corresponding control signals 952 based on the LDPC code selected 951. However, the LDPC decoding functionality 900 includes a slightly modified macro block 999 (shown as MB 999) when compared to the macro block 799 of the FIG. 7.

In this embodiment, the barrel shifter 915 is included within the macro block 999. This embodiment of the barrel shifter 915 is different than the embodiment of the barrel shifter 615 or the barrel shifter 715 in the previous embodiments, in that, the barrel shifter 915 in this embodiment services only the components within the actual macro block 999 in which it is situated. In contradistinction, the barrel shifter 615 or the barrel shifter 715 each service all of the instances of the macro blocks 699 and macro blocks 799 in their respective embodiments. As such, the barrel shifter 915 may be slightly less complex than the barrel shifter 615 or the barrel shifter 715.

Because the barrel shifter 915 is situated is situated differently that the barrel shifter 615 or the barrel shifter 715, care must be taken to ensure that the edge messages are appropriately shifted for subsequent check node processing or bit node processing within the plurality of bit/check processors 910. Also, because the barrel shifter 915 is situated is situated differently that the barrel shifter 615 or the barrel shifter 715, the BS 962 and the SRAM 960 are rearranged in order to accommodate this different order of processing.

Similar to the embodiment of the FIG. 8, the macro block 999 of the FIG. 9 may be replicated a predetermined number of times to assist in providing for even more efficient LDPC decoding functionality than the previous embodiments. The macro block 999 includes all of the functionality that may be replicated for an even more parallel processing architecture.

A design that is capable to decode DVB-S2 complaint signals may include 18 separate instantiations of macro blocks 999. The I, Q values that are provided to the metric generator 903 may be 7 bits each. The bit metrics that are generated by the metric generator 903, using the 7 bit I, Q values, may be values of 6 bits each.

However, each of the macro blocks 999 of the FIG. 9 is implemented differently than the macro block 799 of the FIG. 7. The pseudo dual port metric memory 905 (shown as PDPMM 905) operates on values of 180×120 bits. These 120 bits are implemented as 20×6 bits each; that is to say, there are 20 separate values of 6 bits each. The bit metrics that are output from the pseudo dual port metric memory 905 are also of 120 bits (i.e., 20×6 bits each).

These bit metrics provided to the plurality of bit/check processors 910 may be provided to 20 separate bit/check processors arranged in a parallel configuration within each of the macro blocks 899. More specifically, the plurality of bit/check processors 910 may include the BCP 911 (which is a $1^{st}$ bit/check processor), . . . , and BCP 912 (which is a $20^{th}$ bit/check processor). From the 20 separate of the plurality of bit/check processors 910, the appropriately edge messages may be output as 120 bits (i.e., 20×6 bits each). Therefore, there is a total of 120 bits (i.e., 20×6 bits) output from the 20 separate of the plurality of bit/check processors 910 within each of the macro blocks 999. The 6 bit edge messages are output from each bit/check processor of the 20 bit/check processors of the plurality of bit/check processors 910. Analogously, the appropriately shifted edge messages within the barrel shifter 915 are also of 120 bits (i.e., 20×6 bits) each. Therefore, there is a total of 120 bits (i.e., 20×6 bits) output from the barrel shifter 915 as well. Also in accordance with decoding DVB-S2 compliant signals, the message passing memory 920 may pass values of 792×120 bits as well. There may therefore be 120 bits (i.e., 20×6 bits) decoded bits that are output from the SRAM 960.

As with other embodiments, it is also noted that the barrel shifter 915 may be implemented either inside or outside of any of the macro blocks 999. If the barrel shifter 915 is implemented on the outside of the macro block 999, a single barrel shifter may be implemented to operate on edge message values of 360×6 bits. However, when the barrel shifter 915 is implemented inside of the macro block 999, then there would be 18 separate barrel shifters (i.e., one is each macro block 999), operating on edge message values of 120 bits (i.e., 20×6 bits).

As also mentioned with respect to other embodiments, it is also noted that the number of macro blocks 999 may be selected so that total area of the LDPC decoding functionality 999 is the smallest as possible. As one example, to decode DVB-S2 compliant signals, the number of macro blocks times the number of bit/check processors within the plurality of bit/check processors 910 of each macro block 999 should be equal to 360. As an example, the 360 parallel processors may be selected to support the required throughput to be DVB-S2 compliant. In order to support higher throughput, more parallel processors are required.

It is also noted here that the controller each of the various embodiment embodiments described above provides synchronization information to each of the other decoding functional blocks. More specifically, this involves generating timing signals for each of the corresponding metric generators, metric memories, the plurality of bit/check processors, the barrel shifter, and the message passing memories. These timing signals are provided to each of these functional blocks regardless of how each of these functional blocks is implemented in a particular embodiment. If necessary, these timing signals may be appropriately modified to comport with the particular manner in which a given functional block is implemented. As one example, whether or not the barrel shifter is implemented inside or outside of a macro block, then the timing signals may need to be handled differently.

Also, as mentioned above, each of the various LDPC decoding functionality of the various embodiments described above is capable to process and decode different types of LDPC coded signals including LDPC coded signals that have been generated using different parity check matrices as well as LDPC coded signals having different code rates and/or modulation types that may vary on a block by block basis. For example, a block may be viewed as being a group of symbols within a frame. In some instances, a frame may include multiple blocks.

The controller each of the various embodiment embodiments described above is also operable to use programmable and selectable parameters for each LDPC code that may be decoded. These programmable and selectable parameters include the bit node degrees and the check node degrees of each of the LDPC bipartite graphs that are used to generate the various LDPC codes signals. In addition, these programmable and selectable parameters also include the message passing memory addressing as well as the barrel shifter selection.

As an example, for the information bit nodes, check+q for bit+1 is provided. Also, for the parity bit nodes, check+q for bit+q is provided. By doing so, this ensures that both can be stored on the same memory device (e.g., the same RAM (Random Access Memory)). This is possible because bit+q for parity bit nodes is permissible because it does not matter if they are +1 or +q values (note: these are not used during output processing). The bit+q for parity bit nodes are unlike the information bit nodes which requires +1 in the order of the multiple parallel processing engines employed for output processing. For example, when implementing an embodiment as described above that is operable to decode DVB-S2 compliant signals, there may be 360 parallel processing engines employed for output processing. For example, the 360 parallel processing engines would process the 360 information bit nodes (e.g., node 0 to node 359) that correspond to 360 check nodes (e.g. 0, q, 2q, 3q, . . . ). For the parity bit nodes, the 360 parallel processing engines would process 360 bit nodes (e.g., n, n+q, n+2q, n+3q, . . . ). These parity bit nodes correspond to the 360 check nodes (e.g., m, m+q, m+2q, m+3q, . . . ). By doing this, all 360 edge messages are stored in the same location in the memory device that will be used during both check node processing and bit node processing. When this is not done, 2 separate memory devices would be required (one memory device for edge messages corresponding to information bit nodes and another memory device for edge messages corresponding to parity bit nodes).

This adaptability to accommodate different types of LDPC coded signals provides that the LDPC decoding functionality of any of these embodiments can decode LDPC coded signals that are DVB-S2 compliant.

Figure 10:
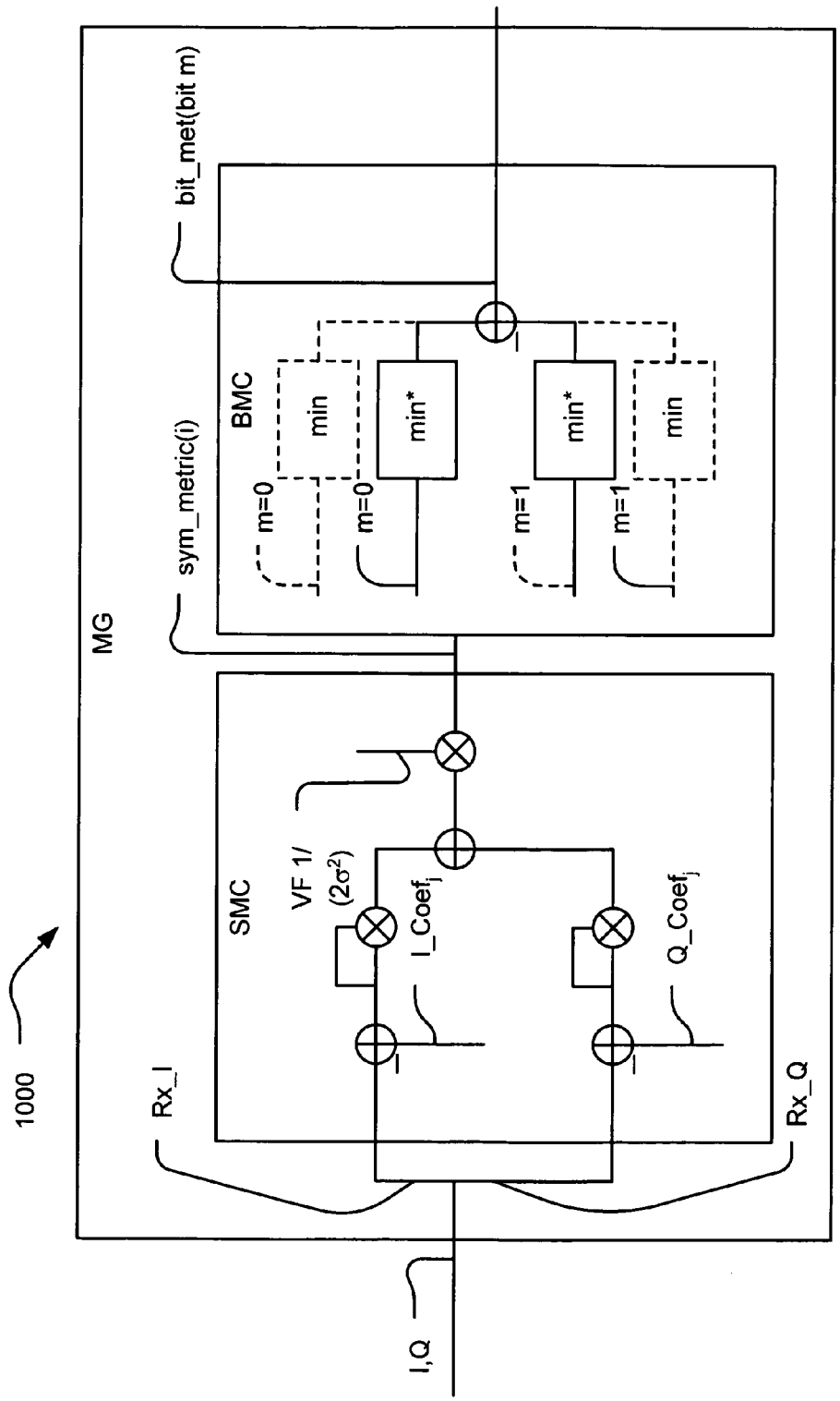
FIG. 10 is a diagram illustrating an embodiment of metric generator functionality according to certain aspects of the invention.

FIG. 10 is a diagram illustrating an embodiment of metric generator functionality 1000 according to certain aspects of the invention. In this diagram, the metric generator (shown as MG) received the I, Q (In-phase, Quadrature) values of the associated symbol for which the metrics are to be calculated. The I, Q components are separate and appropriately provided to an I processing path and a Q processing path within a symbol metric calculator functional block (shown as SMC). Specifically, the received I component (shown as Rx_I) is provided to the I processing path, and the received Q component (shown as Rx_Q) is provided to the Q processing path. Along each of these respective processing paths, the difference between these received values and their corresponding coefficients (with respect to the appropriate modulation by which this particular symbol was generated) is determined. More specifically, the I coefficient (shown as I_Coef$_j$) is subtracted from the received I component (i.e., Rx_I) in the I processing path. Analogously, the Q coefficient (shown as Q_Coef$_j$) is subtracted from the received Q component (i.e., Rx_Q) in the Q processing path. Each of these resulting difference is then squared (i.e., multiplied by itself). These resulting squared differences are then summed together and scaled by a variance factor (shown as VF, whose value is $1/(2\sigma^2)$, where $\sigma$ is the standard deviation noise factor). The symbol metric calculator functional block then outputs the symbol metric (shown as sym_metric(i)), that is subsequently provided to a bit metric calculator functional block.

Once these symbol metrics are provided to the bit metric calculator functional block, then the bit metrics for each bit of interest is calculated. For illustration, the bit metric is calculated for the bit, m. The bit metric is calculated by first performing min* processing using all of the resulting symbol metrics with the bit value, m, being 0. Also, the bit metric is calculated by first performing min* processing using all of the resulting symbol metrics with the bit value, m, being 1. Once each of these min* processing results are determined, then the difference between them is determined. It is also noted that straightforward min processing may be employed instead of min* processing. Prior art approaches to calculating bit metrics using the symbol metrics do not employ min processing or min* processing. This is a significant departure from the prior art approaches, and this also provides a good degree of performance improvement over prior art techniques.

These calculations performed by the metric generator may be described mathematically as described here. The calculation of the symbol metrics, sym_metric(i) is performed as follows:

$$\text{sym\_metric}(i) = 1/(2\sigma^2) \times [(Rx\_I - I\_Coef_j)^2 + (Rx\_Q - Q\_Coef_j)^2]$$

This calculation may be viewed as taking place within the symbol metric calculator functional block (shown as SMC) in this diagram.

The bit metric of a particular bit, m, is thereafter calculated as follows:

$$\text{bit\_met}(\text{bit } m) = \min^*[\text{all sym\_metric}(i) \text{ with bit } m=0] - \min^*[\text{all sym\_metric}(i) \text{ with bit } m=1]$$

This calculation may be viewed as taking place within the bit metric calculator functional block (shown as BMC) in this diagram.

It is also noted that the calculations performed within the bit metric calculator functional block may alternatively be performed using only the min processing as opposed to the min* processing.

As mentioned above, various decoding embodiments described herein are all capable to be adapted for decoding various types of LDPC coded signals including those whose modulation and/or code rate varies as frequently as on a block by block basis. Some examples of such LDPC coded signal may include those LDPC coded signals that comport with the DVB-S2 standard.

The following 4 diagrams illustrate the use of various coefficients that are used to calculate the appropriate metrics for symbols associated with different modulations (i.e., modulations that each includes a constellation shape and a corresponding mapping of the constellation points therein).

Figure 11:
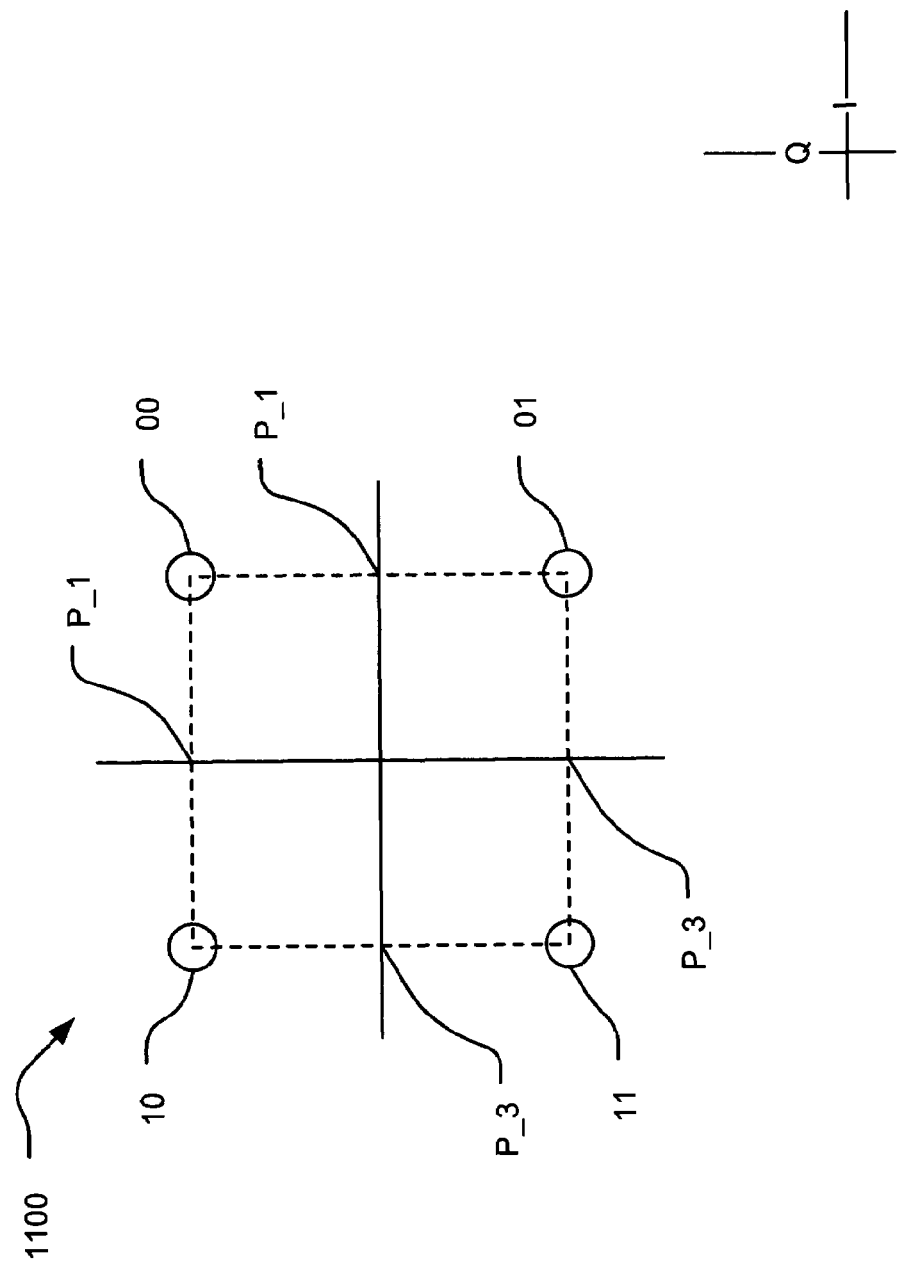
FIG. 11 is a diagram illustrating an embodiment of a QPSK (Quadrature Phase Shift Key) constellation, its corresponding mapping in binary, and the QPSK coefficients employed therein according to certain aspects of the invention.

FIG. 11 is a diagram illustrating an embodiment of a QPSK (Quadrature Phase Shift Key) constellation 1100, its corresponding mapping in binary, and the QPSK coefficients employed therein according to certain aspects of the invention.

Each of the constellation points is indexed appropriately. For example, the constellation points on the QPSK constellation are indexed as follows:

0 constellation point 00,
1 constellation point 01,
2 constellation point 10, and
3 constellation point 11.

The indexing of other constellation points in these diagrams is performed analogously and can be seen pictorially within the diagrams.

Each of these constellation points may be represented using coefficients that extend along each of the I and Q axes of this 2-dimensional diagram from the I, Q origin. Since this constellation shape is symmetric with respect to the I, Q origin, only two coefficients are necessary to represent all of the constellation points in this diagram. Because of this symmetry, these two coefficients may also be viewed as being the same values, but opposite in sign. Only 2 different coefficient values are necessary to depict all of the 4 coefficients within this QPSK shaped constellation.

More specifically, the Cartesian coordinate form for each of these constellation points may be described as follows:

0 constellation point 00→(P_1, P_1) in Cartesian coordinate form,
1 constellation point 01→(P_1, P_3) in Cartesian coordinate form,
2 constellation point 10→(P_3, P_1) in Cartesian coordinate form, and 3 constellation point 12→(P_3, P_3) in Cartesian coordinate form.

Figure 12:
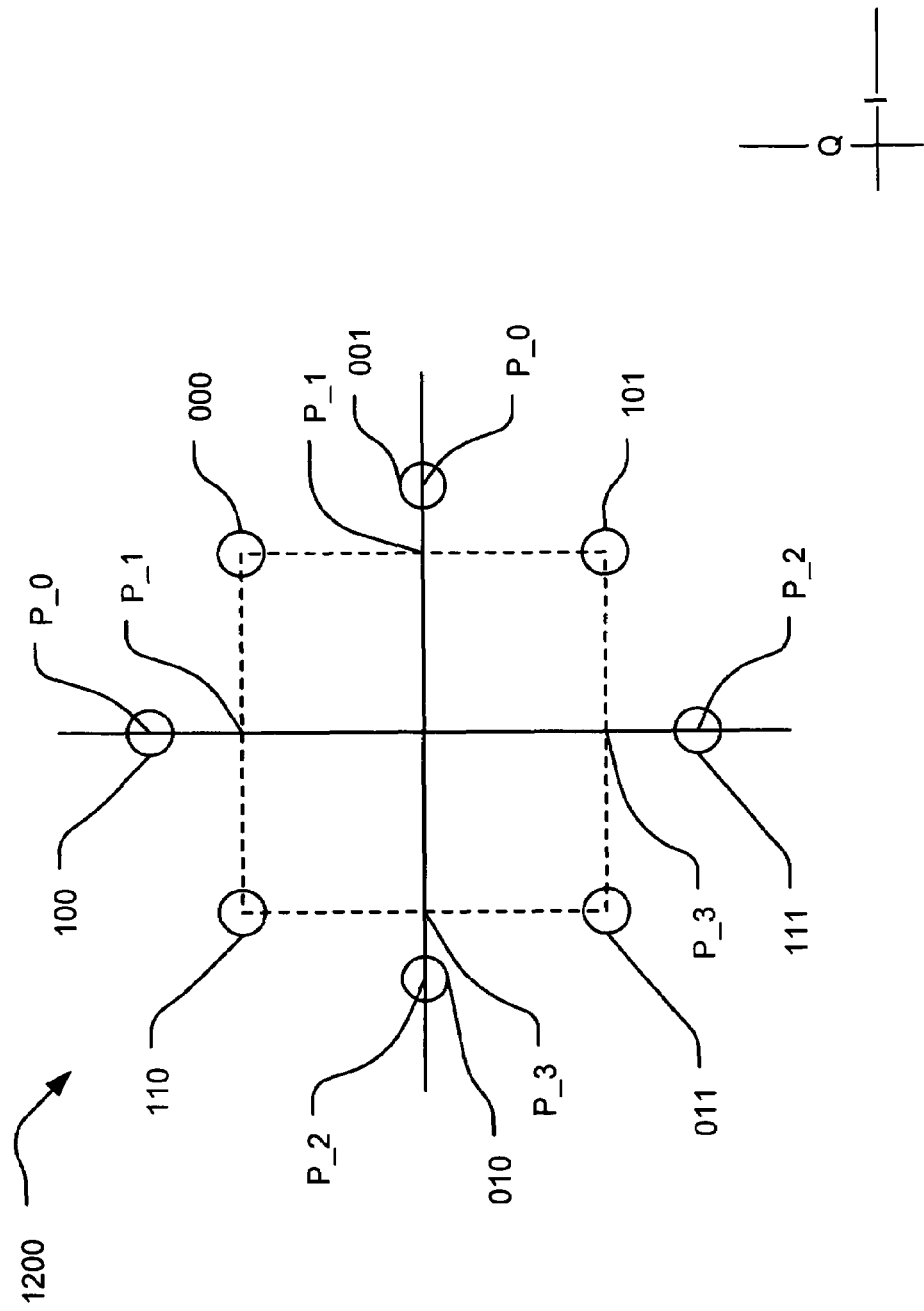
FIG. 12 is a diagram illustrating an embodiment of an 8 PSK (Phase Shift Key) constellation, its corresponding mapping in binary, and the 8 PSK coefficients employed therein according to certain aspects of the invention.

FIG. 12 is a diagram illustrating an embodiment of an 8 PSK (Phase Shift Key) constellation 1200, its corresponding mapping in binary, and the 8 PSK coefficients employed therein according to certain aspects of the invention.

Each of these constellation points may also be represented using coefficients that extend along each of the I and Q axes of this 2-dimensional diagram from the I, Q origin. This 8 PSK constellation shape also employs 4 constellation points that are similar in location with respect to the I, Q origin as within the QPSK constellation shapes in the previous diagram. As can be seen, some of the same coefficients are employed to depict the constellation points within this 8 PSK modulation as within the QPSK modulation of the previous embodiment. Only 4 different coefficient values are necessary to depict all of the 8 coefficients within this 8 PSK shaped constellation.

More specifically, the Cartesian coordinate form for each of these constellation points may be described as follows:

0 constellation point 000→(P_1, P_1) in Cartesian coordinate form, 1 constellation point 001→(P_0, 0) in Cartesian coordinate form, 2 constellation point 010→(0, P_2) in Cartesian coordinate form, 3 constellation point 011→(P_3, P_3) in Cartesian coordinate form, 4 constellation point 100→(0, P_0) in Cartesian coordinate form, 5 constellation point 101→(P_1, P_3) in Cartesian coordinate form, 6 constellation point 110→(P_3, P_1) in Cartesian coordinate form, and 7 constellation point 111→(0, P_2) in Cartesian coordinate form.

Figure 13:
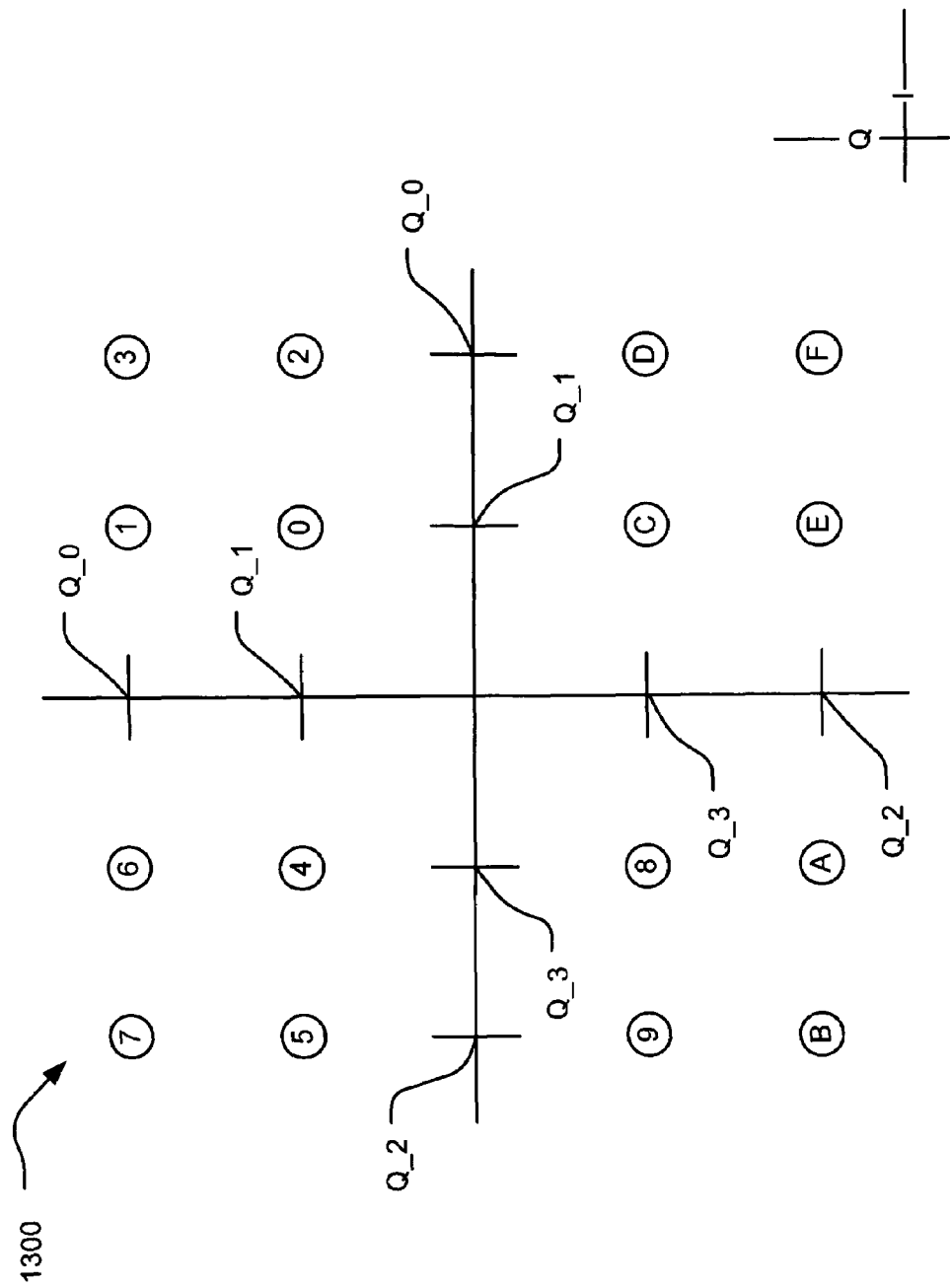
FIG. 13 is a diagram illustrating an embodiment of a 16 QAM (Quadrature Amplitude Modulation) constellation, its corresponding mapping in hexadecimal, and the 16 QAM coefficients employed therein according to certain aspects of the invention.

FIG. 13 is a diagram illustrating an embodiment of a 16 QAM (Quadrature Amplitude Modulation) constellation 1300, its corresponding mapping in hexadecimal, and the 16 QAM coefficients employed therein according to certain aspects of the invention.

Also similar to the embodiments described above, each of these constellation points may also be represented using coefficients that extend along each of the I and Q axes of this 2-dimensional diagram from the I, Q origin. Because of the symmetry of the constellation points of this 16 QAM modulation, only 4 different coefficient values are necessary to depict all of the 16 coefficients within this 16 QAM shaped constellation.

More specifically, the Cartesian coordinate form for each of these constellation points may be described as follows:

0 constellation point 0000→(Q_1, Q_1) in Cartesian coordinate form, 1 constellation point 0001→(Q_1, Q_2) in Cartesian coordinate form, 2 constellation point 0010→(Q_0, Q_1) in Cartesian coordinate form, 3 constellation point 0011→(Q_0, Q_0) in Cartesian coordinate form, 4 constellation point 0100→(Q_3, Q_1) in Cartesian coordinate form, 5 constellation point 0101→(Q_2, Q_1) in Cartesian coordinate form, 6 constellation point 0110→(Q_3, Q_0) in Cartesian coordinate form, 7 constellation point 0111→(Q_2, Q_0) in Cartesian coordinate form 8 constellation point 1000→(Q_3, Q_3) in Cartesian coordinate form, 9 constellation point 1001→(Q_2, Q_3) in Cartesian coordinate form, A constellation point 1010→(Q_3, Q_2) in Cartesian coordinate form, B constellation point 1011→(Q_2, Q_2) in Cartesian coordinate form, C constellation point 1100→(Q_1, Q_3) in Cartesian coordinate form, D constellation point 1101→(Q_0, Q_3) in Cartesian coordinate form, E constellation point 1110→(Q_1, Q_2) in Cartesian coordinate form, and F constellation point 1111→(Q_0, Q_2) in Cartesian coordinate form.

Figure 14:
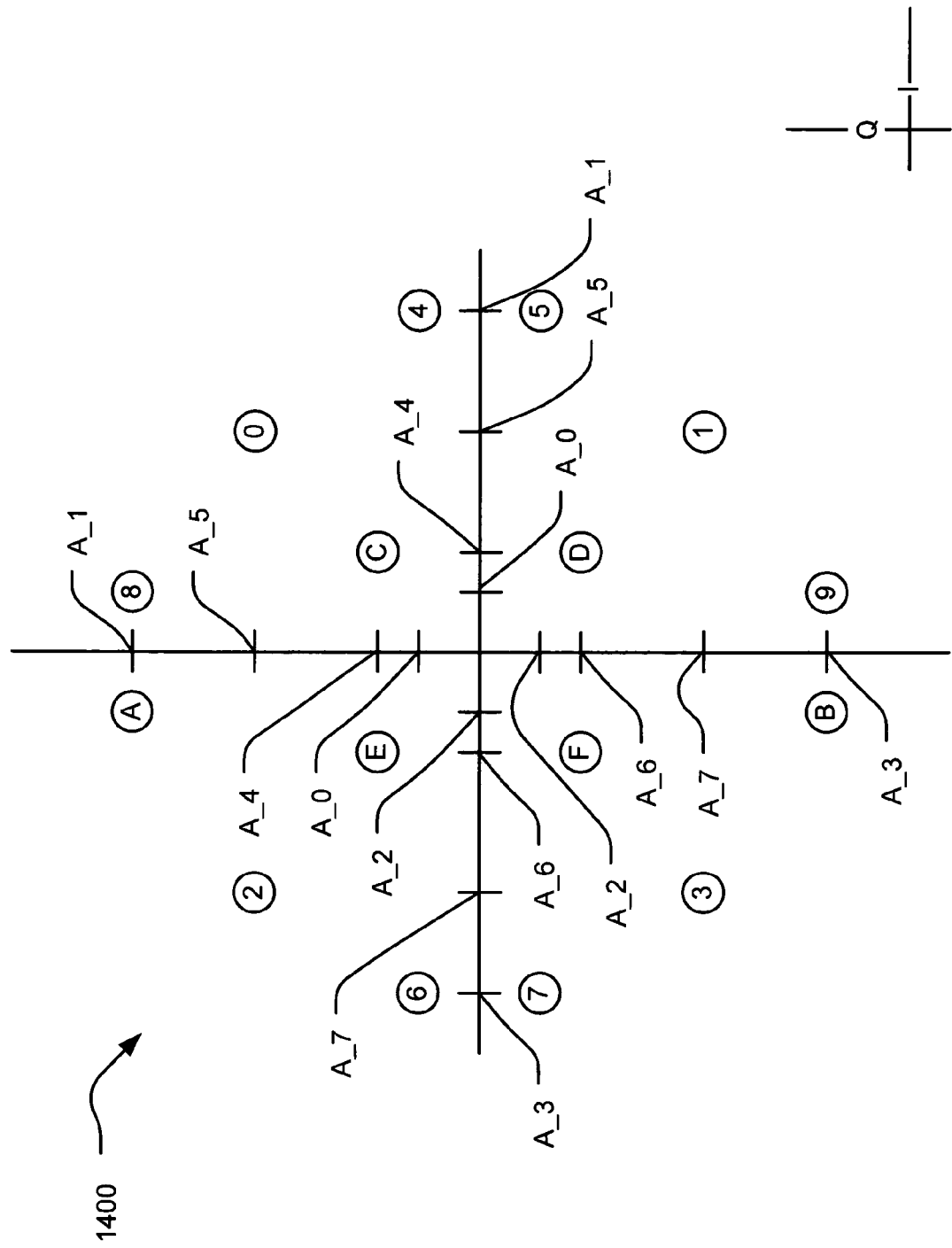
FIG. 14 is a diagram illustrating an embodiment of a 16 APSK (Asymmetric Phase Shift Keying) constellation, its corresponding mapping in hexadecimal, and the 16 APSK coefficients employed therein according to certain aspects of the invention.

FIG. 14 is a diagram illustrating an embodiment of a 16 APSK (Asymmetric Phase Shift Keying) constellation 1400, its corresponding mapping in hexadecimal, and the 16 APSK coefficients employed therein according to certain aspects of the invention.

Also similar to the embodiments described above, each of these constellation points may also be represented using coefficients that extend along each of the I and Q axes of this 2-dimensional diagram from the I, Q origin. Specifically, the Cartesian coordinate form for each of these constellation points may be described as follows:

0 constellation point 0000→(A_5, A_5) in Cartesian coordinate form, 1 constellation point 0001→(A_5, A_7) in Cartesian coordinate form, 2 constellation point 0010→(A_7, A_5) in Cartesian coordinate form, 3 constellation point 0011→(A_7, A_7) in Cartesian coordinate form, 4 constellation point 0100→(A_1, A_0) in Cartesian coordinate form, 5 constellation point 0101→(A_1, A_2) in Cartesian coordinate form, 6 constellation point 0110→(A_3, A_0) in Cartesian coordinate form, 7 constellation point 0111→(A_3, A_2) in Cartesian coordinate form 8 constellation point 1000→(A_0, A_1) in Cartesian coordinate form, 9 constellation point 1001→(A_0, A_3) in Cartesian coordinate form, A constellation point 1010→(A_2, A_1) in Cartesian coordinate form, B constellation point 1011→(A_2, A_3) in Cartesian coordinate form, C constellation point 1100→(A_4, A_4) in Cartesian coordinate form, D constellation point 1101→(A_4, A_6) in Cartesian coordinate form, E constellation point 1110→(A_6, A_4) in Cartesian coordinate form, and F constellation point 1111→(A_6, A_6) in Cartesian coordinate form.

It is also noted here that each of these modulations (QPSK, 8 PSK, 16 QAM, and 16 APSK) is also employed within the DVB-S2 standard.

FIG. 15 is a diagram illustrating an embodiment of a table including coefficients for corresponding modulations according to certain aspects of the invention. This table shows how the appropriate coefficients may be selected, based on the modulation employed, for calculating of the metrics associated therewith. As can be seen, for each of the modulations, different values are selected for use as the coefficients. There may be as many as 8 coefficients (e.g., for the 16 APSK modulation), 4 coefficients (e.g., for the 8 PSK or 16 QAM modulations), or as few as 2 coefficient (e.g., for the QPSK modulation). If it is desired to service other modulations in another embodiment, then different numbers of coefficients may need to be selected.

By using this table, a very efficient design of metric generator calculation functionality is presented with respect to the following diagrams. More specifically, a singular design may be employed to calculate the metrics associated with any number of modulations so long as the appropriate coefficients (i.e., appropriate for the given modulation) are selected for use in calculating the metrics.

As one example, when calculating the metrics associated with a symbol having a QPSK modulation, then the values for Coef_1 and Coef_3 are selected as being, P_1 and P_3, respectively. Analogously, when calculating the metrics associated with a symbol having an 8 PSK modulation, then the values for Coef_0, Coef_1, Coef_2, and Coef_3 are selected as being, P_0, P_1, P_2, and P_3, respectively. For the other modulation types depicted in this diagram, the selection of appropriate values for the coefficients (e.g., Coef_0 up to Coef_7) is performed in a similar type manner in view of the constellation shape and mapping corresponding to the particular type of modulation. By using this approach by which the values for the coefficients are selected based on the modulation of interest, a singular type metric generator architecture may be employed to perform the metric calculations for a wide variety of modulation types. Some possible embodiments of such metric generator architectures are described with respect to the following diagrams.

Figure 16:
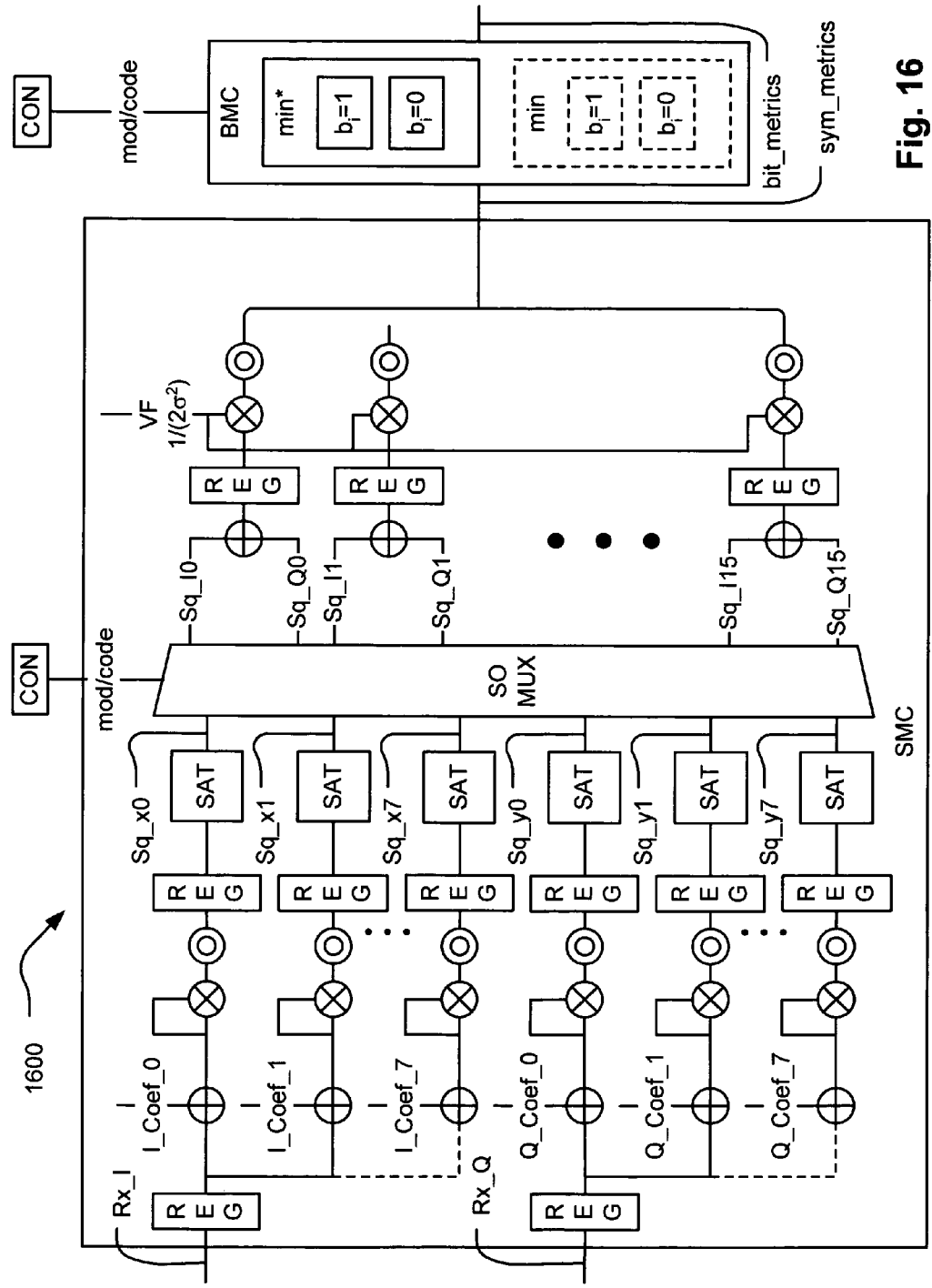
FIG. 16, FIG. 17, and FIG. 18 are diagrams illustrating various embodiments of metric generator architectures according to certain aspects of the invention.
Figure 17:
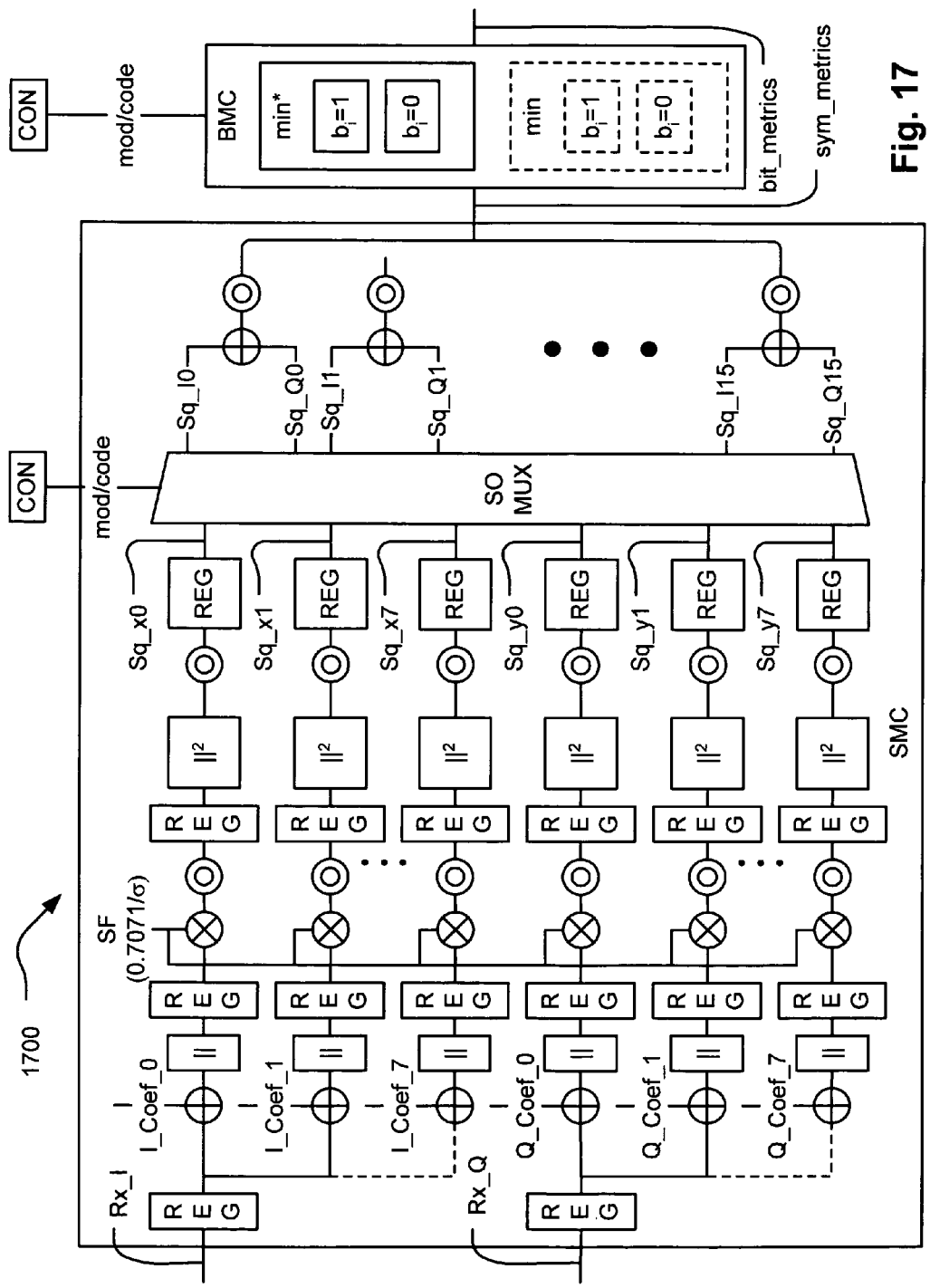
Figure 18:
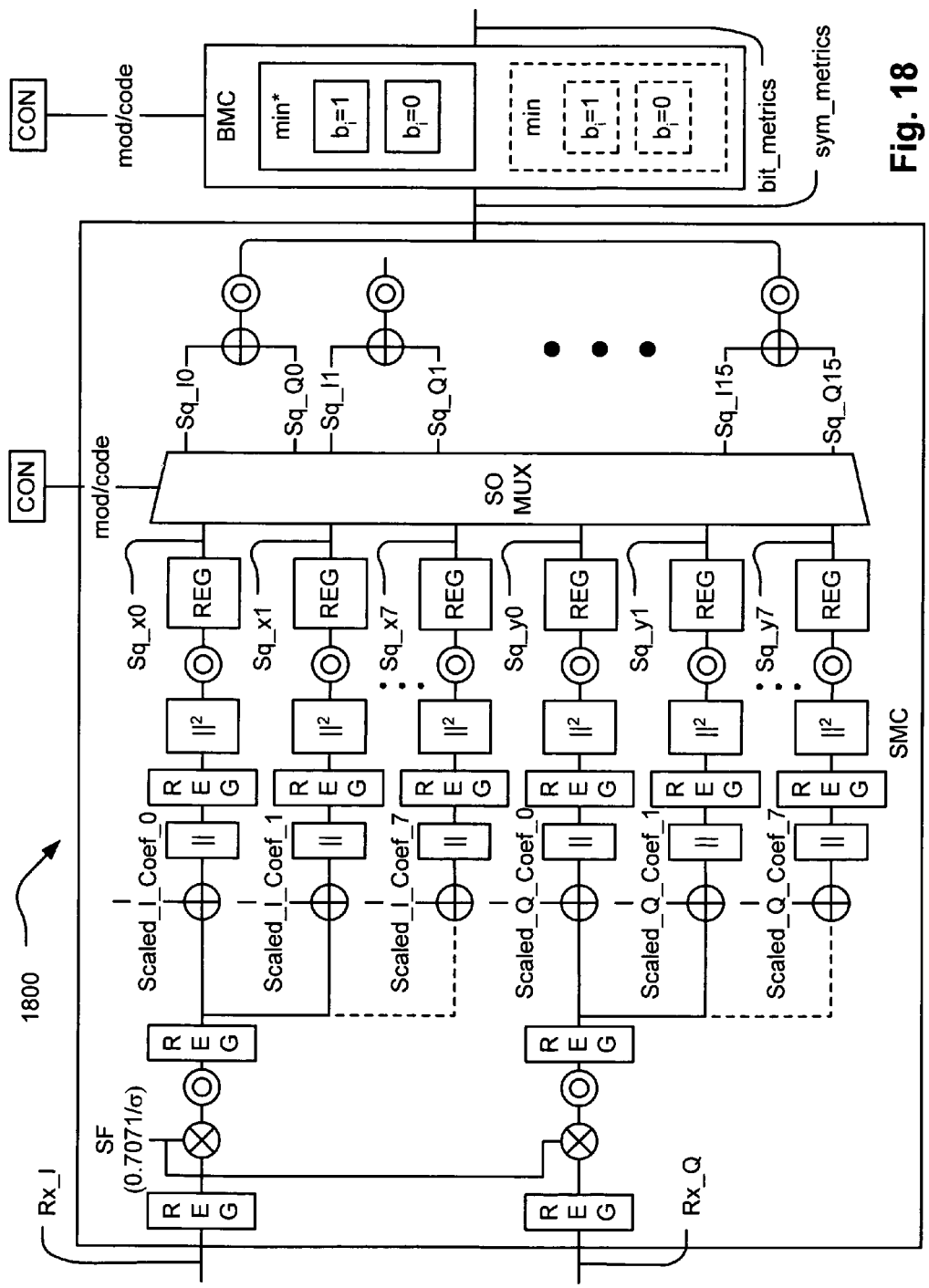

FIG. 16, FIG. 17, and FIG. 18 are diagrams illustrating various embodiments of metric generator architectures according to certain aspects of the invention.

Referring to the metric generator architecture 1600 of FIG. 16, the functionality of this metric generator architecture 1600 may be viewed as being broken into a symbol metric calculator functional block (shown as SMC) and a bit metric calculator functional block (shown as BMC). The symbol metric calculator functional block operates to calculate a plurality of symbol metrics (shown as sym_metrics), and the bit metric calculator functional block uses these plurality of symbol metrics to calculate a ply of bit metrics (shown as bit_metrics). This metric generator architecture 1600 may be viewed as being hardware that is capable to perform the mathematical calculations depicted above while supporting the capability to accommodate a number of different code rates and/or modulations.

To support a variety of code rates and/or modulations according to the variable code rate functionality of certain aspects of the invention, a number of I, Q coefficients are employed, and the "differences" between a received symbol's I value (Rx_I) and a number of I coefficients (shown as an I_Coef_0, . . . , and I_Coef_7, are all simultaneously calculated. Similarly, the "differences" between a received symbol's Q value (Rx_Q) and a number of Q coefficients (shown as an Q_Coef_0, . . . , and Q_Coef_7,) are all simultaneously calculated. The precision of these values may be 9 bits in some embodiments. It is noted that these "differences" are all calculated by using the symmetry of the constellations described above wherein only addition may be performed, and not subtraction, thereby providing hardware savings.

Each of these "differences" (generated by performing additions and an appropriately selected coefficient based on the constellation shape symmetry) undergoes a squaring operation. The precision of these squared values may be 18 bits in some embodiments. These squared results undergo a rounding operation. At this point, the precision of these values may be rounded down to 9 bits in some embodiments. Afterwards, these rounded values are then passed through a corresponding register (shown as REG).

After sitting in its corresponding register for a predetermined period of time (e.g., a clock cycle), then the output from each register is passed to a corresponding saturation functional block (shown as SAT) when a predetermined number of significant bits are selected from the total number of bits remaining. The outputs from each of the saturation functional blocks are shown as being for 1 values (i.e., Sq_x0, Sq_x1, . . . , Sq_x7), and also for Q values (i.e., Sq_y0, Sq_y1, . . . , Sq_y7). The precision of these values may be 7 bits in some embodiments. These outputs are provided to a square output multiplexor (MUX), or square output MUX (shown as SO MUX).

The selection of which value to be selected from the square output MUX is governed by the modulation and/or code rate that is provided by a controller (shown as CON). As described within other embodiments above, the controller is operable to direct the operation of certain of the various functional blocks of the LDPC decoding functionality based on the code rate and/or modulation of the symbols of the LDPC coded signal being decoded.

After being appropriately selected within the square output MUX by the signal provided by the controller, the appropriate terms are output from the from the square output MUX and selected to be summed together. For example, the term $(Rx\_I+I\_Coef\_0)^2$, shown as Sq__I0 out, and term $(Rx\_Q+Q\_Coef\_0)^2$, shown as Sq_Q0 out, are summed together. These I-related outputs from the square output MUX may be viewed as being indicative of I-axis distances separating an I component of the received symbol and the predetermined I coefficients corresponding to the constellation points of the appropriate constellation based on the appropriate code rate and/or modulation.

Similarly, the Q-related outputs from the square output MUX may be viewed as being indicative of Q-axis distances separating a Q component of the received symbol and the predetermined Q coefficients corresponding to the constellation points of the appropriate constellation based on the appropriate code rate and/or modulation.

These appropriately summed values, generated by the appropriately selected outputs from square output MUX, are then each passed to corresponding register (shown as REG) where they stay for a predetermined period of time (e.g., one clock cycle). Each of these corresponding values then undergoes variance factor scaling (shown as VF $1/(2\sigma^2)$) and subsequent rounding to get this value into a desirable bit precision. Sigma, $\sigma$, is the standard deviation of the normalized noise of the received symbol.

These symbol metric values generated by the symbol metric calculator functional block (shown as sym_metrics) are then output from the symbol metric calculator functional block and are provided to the bit metric calculator functional block. The bit metric calculator functional block calculates the corresponding bit metrics (shown as bit_metrics). For each bit ($b_i$) in a symbol, and based on the code rate and/or modulation (as determined and controlled by the signals provided by the controller, shown as CON), the bit metric calculator functional block performs min* processing for all of the symbol metrics (i.e., all of the values of sym_metric) with $b_i$=1. That is to say, the bit metric calculator functional block performs min* processing for all of the symbol metrics with a bit value of 1 in each of the bit locations of the symbol.

Analogously, the bit metric calculator functional block performs min* processing for all of the symbol metrics (i.e., all of the values of sym_metric) with $b_i=0$. That is to say, the bit metric calculator functional block performs min* processing for all of the symbol metrics with a bit value of 0 in each of the bit locations of the symbol. The difference between these two separate min* processing results is determined thereby generating the corresponding bit metrics (shown as bit_metrics).

Alternatively, the bit metric calculator functional block may perform straightforward min processing (with no log correction factor) in other embodiments. In this case, the difference between these two separate straightforward min processing results is determined thereby generating the corresponding bit metrics (shown as bit_metrics).

As is described and shown within two other possible metric generator architectures described below, there are many other possible ways by which metric generator functionality may be implemented without departing from the scope and spirit of the invention. Each of these various metric generator architectures is operable to support variable code rate and/or modulation signals.

Within the metric generator architecture 1600, the variance factor scaling is performed on the output signals from the square output MUX. Alternatively, signal factor scaling may be performed more early ahead in the processing. In some instances, this approach provides for a more elegant and efficient implementation.

Referring to the metric generator architecture 1700 of FIG. 17, the operation of the symbol metric calculator functional block (shown as SMC) is different than in the previous embodiment of the metric generator architecture 1600. The operation of the bit metric calculator functional block (shown as BMC) is similar to the previous embodiment of the metric generator architecture 1600. Also similar to the previous embodiment of the of the metric generator architecture 1600, the metric generator architecture 1700 receives code rate and/or modulation control signal from a controller (shown as CON) to direct the operation of the various functional blocks of the of the metric generator architecture 1700.

Similar to the embodiment of the metric generator architecture 1600 described above, in order to support a variety of code rates and/or modulations according to the variable code rate functionality of certain aspects of the invention, the metric generator architecture 1700 employs a number of I, Q coefficients. The "differences" between a received symbol's I value (Rx_I) and a number of I coefficients (shown as an I_Coef_0, . . . , and I_Coef_7, are all simultaneously calculated. Similarly, the "differences" between a received symbol's Q value (Rx_Q) and a number of Q coefficients (shown as an Q_Coef_0, . . . , and Q_Coef_7,) are all simultaneously calculated. The precision of these values may be 9 bits in some embodiments. It is noted that these "differences" are all calculated by using the symmetry of the constellations described above wherein only addition may be performed, and not subtraction, thereby providing hardware savings.

Each of these "differences" (generated by performing additions and an appropriately selected coefficient based on the constellation shape symmetry) undergo an absolute value operation function. Thereafter, these values are then passed through a corresponding register (shown as REG). After sitting in its corresponding register for a predetermined period of time (e.g., a clock cycle), then the output from each corresponding register then undergoes sigma factor scaling (shown as SF (0.7071/σ)). Again, sigma, σ, is the standard deviation of the normalized noise of the received symbol. After undergoing this sigma scaling, these values are passed undergo a rounding operation and are subsequently passed to a register (again, shown as REG). After sitting in the register for a predetermined period of time (e.g., for one clock cycle), each of these outputs are passed to a corresponding absolute value and squaring functional block. The outputs of the corresponding absolute value and squaring functional block undergoes a rounding operation and are then passed to a corresponding register (shown as REG). The outputs from each of these registers are shown as being for I values (i.e., Sq_x0, Sq_x1, . . . , Sq_x7), and also for Q values (i.e., Sq_y0, Sq_y1, . . . , Sq_y7). These outputs are provided to a square output multiplexor (MUX), or square output MUX (shown as SO MUX).

The selection of which value to be selected from the square output MUX is governed by the modulation and/or code rate that is provided by the controller (shown as CON). As described within other embodiments above, the controller is operable to direct the operation of certain of the various functional blocks of the LDPC decoding functionality based on the code rate and/or modulation of the symbols of the LDPC coded signal being decoded.

After being appropriately selected within the square output MUX by the signal provided by the controller, the appropriate terms are output from the from the square output MUX and selected to be summed together. For example, the term $(Rx\_I+I\_Coef\_0)^2$, shown as Sq_I0 out, and term $(Rx\_Q+Q\_Coef\_0)^2$, shown as Sq_Q0 out, are summed together. These I-related outputs from the square output MUX may be viewed as being indicative of I-axis distances separating an I component of the received symbol and the predetermined I coefficients corresponding to the constellation points of the appropriate constellation based on the appropriate code rate and/or modulation.

Similarly, the Q-related outputs from the square output MUX may be viewed as being indicative of Q-axis distances separating a Q component of the received symbol and the predetermined Q coefficients corresponding to the constellation points of the appropriate constellation based on the appropriate code rate and/or modulation.

After being summed together, these values all undergo a corresponding rounding operation before being output from the symbol metric calculator functional block to the bit metric calculator functional block. Again, the operation of the bit metric calculator functional block within the metric generator architecture 1700 is similar to the previous embodiment of the bit metric calculator functional block within the metric generator architecture 1600.

Referring to the metric generator architecture 1800 of FIG. 18, the operation of the symbol metric calculator functional block (shown as SMC) is different than in the previous embodiment of the metric generator architecture 1600 or the previous embodiment of the metric generator architecture 1700. The operation of the bit metric calculator functional block (shown as BMC) is similar to the previous embodiment of the metric generator architecture 1600 and the previous embodiment of the metric generator architecture 1700. Also similar to the previous embodiment of the of the metric generator architecture 1600 and the metric generator architecture 1700, the metric generator architecture 1800 receives code rate and/or modulation control signal from a controller (shown as CON) to direct the operation of the various functional blocks of the of the metric generator architecture 1800.

In this embodiment of the metric generator architecture 1800, the received I, Q values initially undergo sigma factor scaling. The received I Q values are passed through a register (shown as REG). After being situated in the register for a predetermined period of time (e.g., a clock cycle), these input I, Q values undergo sigma factor scaling (shown as SF (0.7071/σ)). Again, sigma, σ, is the standard deviation of the normalized noise of the received symbol. After undergoing this sigma scaling, these values are passed undergo a rounding operation and are subsequently passed to a register (again, shown as REG). After being situated in the register for a predetermined period of time (e.g., a clock cycle), these scaled I, Q values are then passed to corresponding summation blocks.

Similar to the embodiment of the metric generator architecture 1600 and the embodiment of the metric generator architecture 1700 described above, in order to support a variety of code rates and/or modulations according to the variable code rate functionality of certain aspects of the invention, the metric generator architecture 1800 employs a number of scaled I, Q coefficients. The "differences" between a received symbol's scaled I value (scaled Rx_I) and a number of scaled I coefficients (shown as an Scaled_I_Coef__0, . . . , and Scaled_I_Coef__7, are all simultaneously calculated. Similarly, the "differences" between a received symbol's scaled Q value (scaled Rx_Q) and a number of Q coefficients (shown as an Scaled_Q_Coef__0, . . . , and Scaled Q_Coef__7,) are all simultaneously calculated. The precision of these values may be 9 bits in some embodiments. It is noted that these "differences" are all calculated by using the symmetry of the constellations described above wherein only addition may be performed, and not subtraction, thereby providing hardware savings.

Each of these "differences" (generated by performing additions and an appropriately selected coefficient based on the constellation shape symmetry) undergo an absolute value operation function. Thereafter, these values are then passed through a corresponding register (shown as REG). After sitting in its corresponding register for a predetermined period of time (e.g., a clock cycle), then the output from each corresponding register is passed to a corresponding absolute value and squaring functional block. The outputs of the corresponding absolute value and squaring functional block undergoes a rounding operation and are then passed to a corresponding register (shown as REG). The outputs from each of these registers are shown as being for I values (i.e., Sq_x0, Sq_x1, . . . , Sq_x7), and also for Q values (i.e., Sq_y0, Sq_y1, . . . , Sq_y7). These outputs are provided to a square output multiplexor (MUX), or square output MUX (shown as SO MUX).

The selection of which value to be selected from the square output MUX is governed by the modulation and/or code rate that is provided by the controller (shown as CON). As described within other embodiments above, the controller is operable to direct the operation of certain of the various functional blocks of the LDPC decoding functionality based on the code rate and/or modulation of the symbols of the LDPC coded signal being decoded.

After being appropriately selected within the square output MUX by the signal provided by the controller, the appropriate terms are output from the from the square output MUX and selected to be summed together. For example, the term $(Rx\_I+I\_Coef\_0)^2$, shown as Sq__$_I$0 out, and term $(Rx\_Q+Q\_Coef\_0)^2$, shown as Sq_Q0 out, are summed together. These I-related outputs from the square output MUX may be viewed as being indicative of I-axis distances separating an I component of the received symbol and the predetermined I coefficients corresponding to the constellation points of the appropriate constellation based on the appropriate code rate and/or modulation.

Similarly, the Q-related outputs from the square output MUX may be viewed as being indicative of Q-axis distances separating a Q component of the received symbol and the predetermined Q coefficients corresponding to the constellation points of the appropriate constellation based on the appropriate code rate and/or modulation.

After being summed together, these values all undergo a corresponding rounding operation before being output from the symbol metric calculator functional block to the bit metric calculator functional block. Again, the operation of the bit metric calculator functional block within the metric generator architecture 1800 is similar to the previous embodiment of the bit metric calculator functional block within the metric generator architecture 1600 and the previous embodiment of the bit metric calculator functional block within the metric generator architecture 1700.

As mentioned above with respect to other embodiments, the iterative decoding processing performed when decoding LDPC coded signals typically involves performing both bit node processing and check node processing, alternatively and successively. In bit node processing, this involving updating and calculating the edge messages with respect to the bit nodes, $Medge_b$. After the initialization of the first iteration (in which predetermined values are used), the updating and calculating the edge messages with respect to the bit nodes, $Medge_b$, is performed using the most recently updated edge messages with respect to the check nodes, $Medge_c$.

In check node processing, this involving updating and calculating the edge messages with respect to the check nodes, $Medge_c$. The updating and calculating the edge messages with respect to the check nodes, $Medge_c$, is performed using the most recently updated edge messages with respect to the bit nodes, $Medge_b$.

In performing many of these calculations, the hardware implementations are oftentimes performing in the log domain (where multiplications may be reduced to additions and divisions may be reduced to subtractions). Various embodiments of bit node processing functionality and various embodiments of check node processing functionality are depicted and described with respect to many of the following figures.

Figure 19:
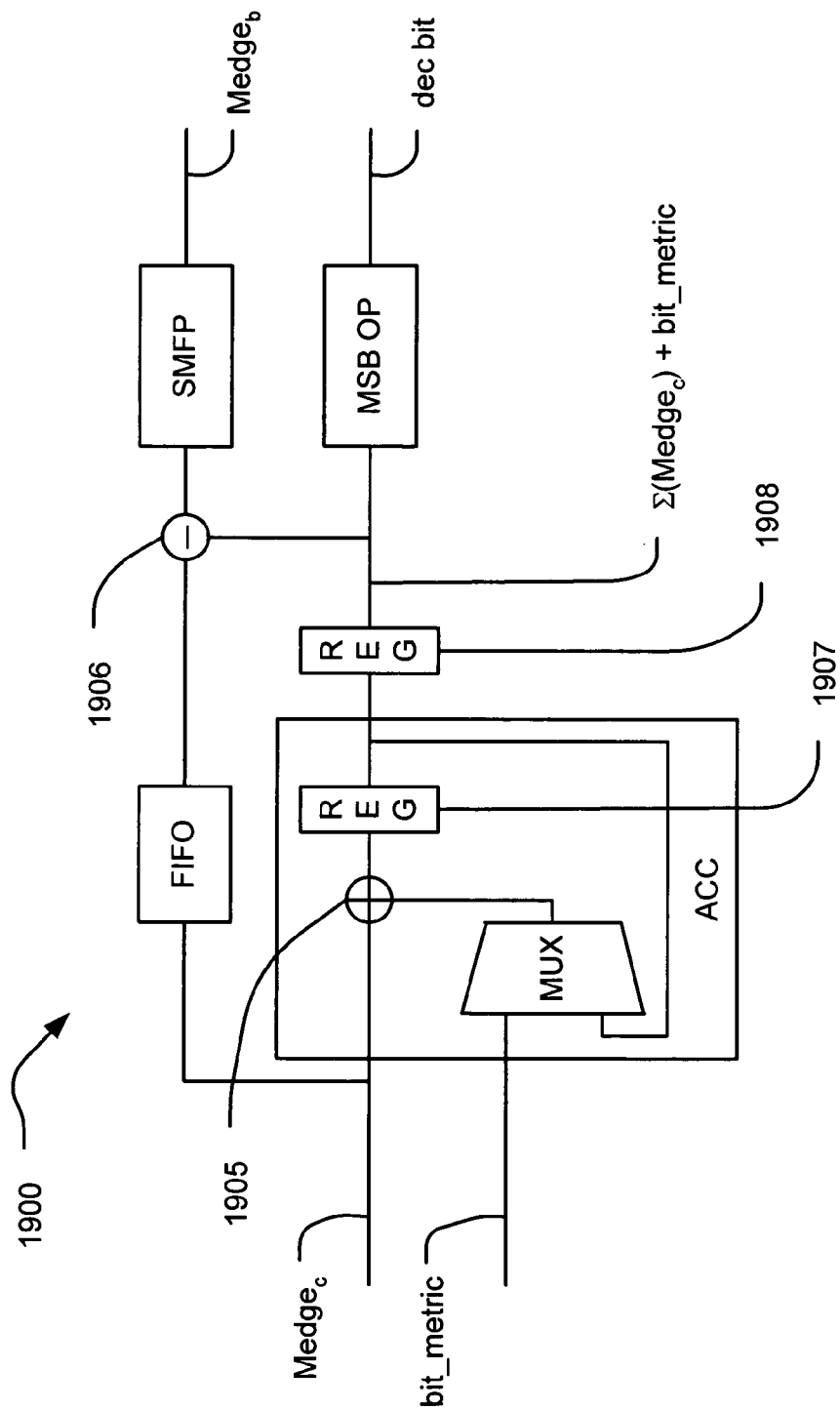
FIG. 19 is a diagram illustrating an embodiment of bit node processing functionality according to certain aspects of the invention.

FIG. 19 is a diagram illustrating an embodiment of bit node processing functionality 1900 according to certain aspects of the invention. The edge messages with respect to the check nodes, $Medge_c$, and the bit metrics (shown as bit_metric) are input to this bit node processing functionality 1900. The edge message with respect to the check nodes, $Medge_c$, is provided simultaneously to an accumulator (shown as ACC) and a FIFO (First-In First-Out) functional block. The bit metrics are also provided to the accumulator where they are provided to a multiplexor (shown as MUX in the accumulator). During the bit node processing, the first received edge message with respect to the check nodes, e.g. $Medge_c(0)$, is summed with the bit metric. Thereafter, this first sum (e.g. sum of $Medge_c(0)$ and the bit metric) is added with the second received edge message with respect to the check nodes, e.g. $Medge_c(1)$. During the next clock cycle, this second sum (e.g. sum of $Medge_c(0)$, $Medge_c(1)$, and the bit metric) is added with the third received edge message with respect to the check nodes, e.g. $Medge_c(2)$. By doing the summation in this manner, one clock cycle is saved when generating this summed value. The additions within the accumulator (i.e. ACC) are performed using an adder 1905.

Two registers (shown as REG 1907 as being within the accumulator and REG 1908 being just outside of the accumulator), operate to provide a summed value that includes all of the edge messages with respect to the check nodes, $Medge_c$, and the bit metric of interest (i.e., $\Sigma(Medge_c)+bit\_metric$). This value, $\Sigma(Medge_c)+bit\_metric$, may be viewed as being soft output within the bit node processing functionality

1900. And this soft output is provided to a most significant bit output processor (shown as MSB OP).

The output from the FIFO is provided to a subtraction functional block, and the soft output (provided from the accumulator) is subtracted from the output of the FIFO (which are simply the appropriately order edge messages with respect to the check nodes, $Medge_c$). This subtraction is performed using a subtractor 1906. The resultant from this subtraction functional block is the updated edge messages with respect to the bit nodes, $Medge_b$. These updated edge messages with respect to the bit nodes, $Medge_b$, include the sum of all of the edge messages with respect to the check nodes, $Medge_c$, (with the exception of the particular edge that is being calculated) and the bit metric. These updated edge messages with respect to the bit nodes, $Medge_b$, are provided in sign-magnitude format by a sign-magnitude format processor (shown as SMFP) to facilitate min** processing when performing check node processing during the subsequent iterative decoding processing. The output of the sign-magnitude format processor is such that the most significant bit indicates the sign, and the remaining bits indicate the actual value. These edge messages with respect to the bit nodes, $Medge_b$, may be stored in memory in sign-magnitude format. It is also noted here that the edge messages with respect to the check nodes, $Medge_c$, may be stored in memory in 2s complement format to facilitate bit node processing during the subsequent iterative decoding processing.

As mentioned above, there are many possible means by which check node processing functionality may be implemented in accordance with certain aspects of the invention.

FIG. 20, FIG. 21, FIG. 22, and FIG. 23 are diagrams illustrating various embodiments of check node processing functionality according to certain aspects of the invention.

Figure 20:
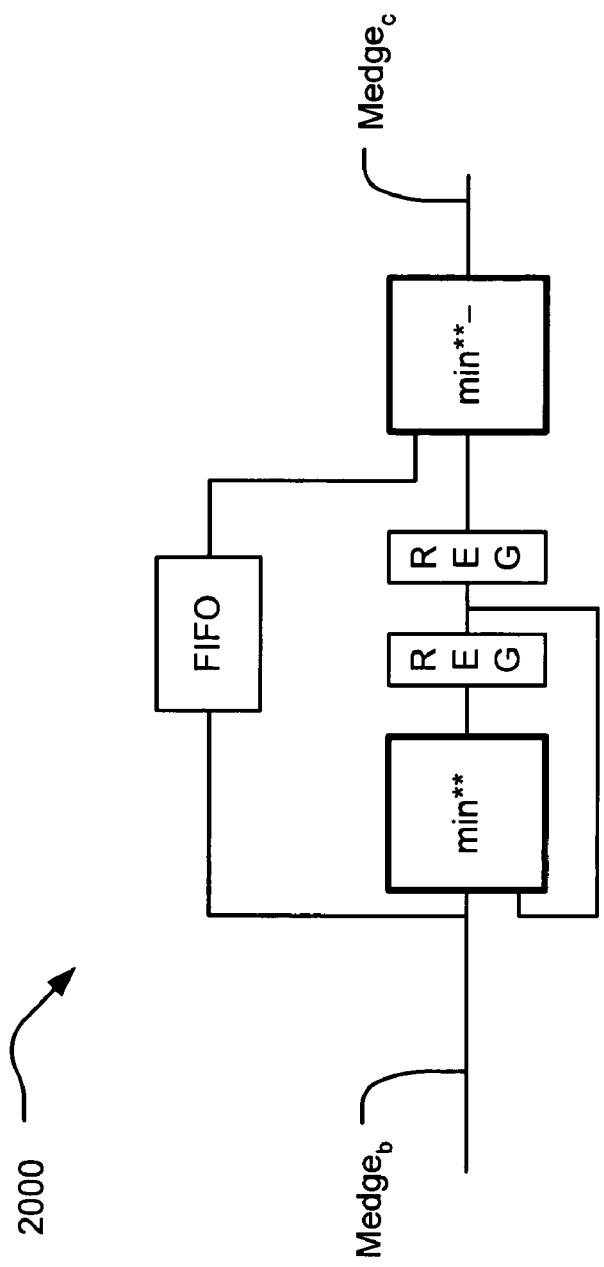
FIG. 20, FIG. 21, FIG. 22, and FIG. 23 are diagrams illustrating various embodiments of check node processing functionality according to certain aspects of the invention.

Referring to the check node processing functionality 2000 of FIG. 20, this diagram describes an embodiment that employs min processing and min− processing when updating the edge messages with respect to the check nodes, $Medge_c$, by using the edge messages with respect to the bit nodes, $Medge_b$. The most recently updated edge messages with respect to the bit nodes, $Medge_b$, are provided simultaneously to a min processing functional block and to a FIFO (First-In First-Out). As subsequent edge messages with respect to the bit nodes, $Medge_b$, are provided to the min processing functional block, a register (shown as REG) and a feedback path operate to perform the min processing of all of the edge messages with respect to the bit nodes, $Medge_b$. The final min processing resultant is provided from another register (shown as REG) is provided to a min− processing functional block where the appropriately ordered edge messages with respect to the bit nodes, $Medge_b$, is provided from the FIFO. The output of the min− processing functional block is the updated edge messages with respect to the check nodes, $Medge_c$.

Figure 21:
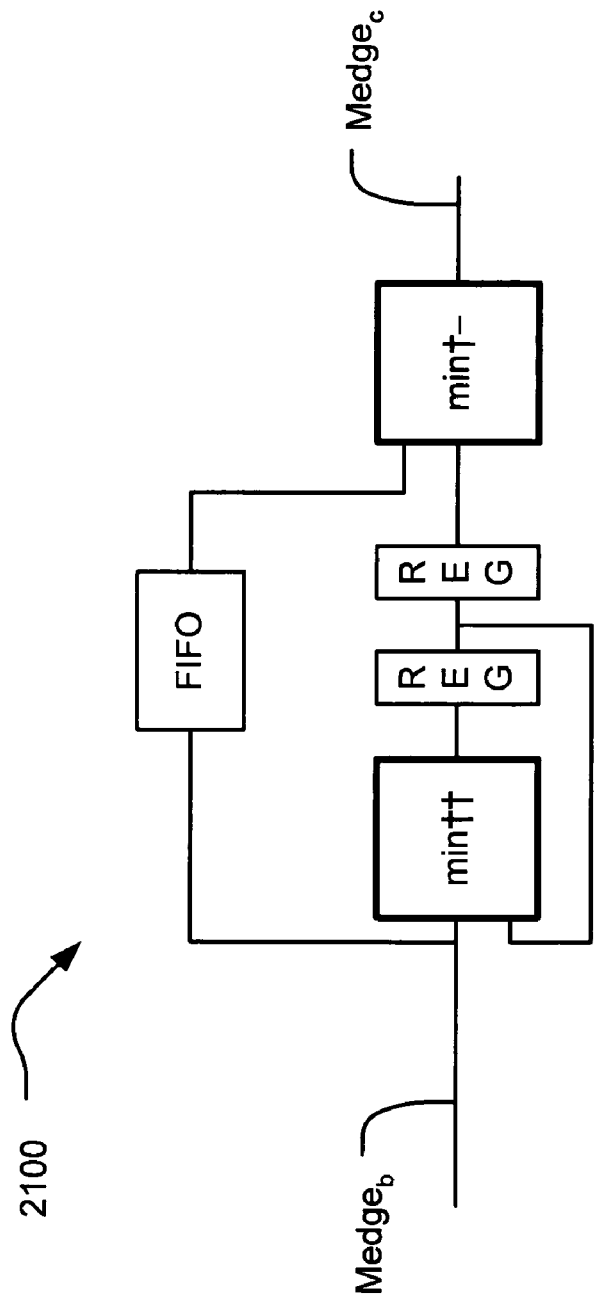

Referring to the check node processing functionality 2100 of FIG. 21, this diagram describes an embodiment that employs min†† processing and min†− processing when updating the edge messages with respect to the check nodes, $Medge_c$, by using the edge messages with respect to the bit nodes, $Medge_b$. The most recently updated edge messages with respect to the bit nodes, $Medge_b$, are provided simultaneously to a min†† processing functional block and to a FIFO (First-In First-Out). As subsequent edge messages with respect to the bit nodes, $Medge_b$, are provided to the min†† processing functional block, a register (shown as REG) and a feedback path operate to perform the min†† processing of all of the edge messages with respect to the bit nodes, $Medge_b$. The final min†† processing resultant is provided from another register (shown as REG) is provided to a min†− processing functional block where the appropriately ordered edge messages with respect to the bit nodes, $Medge_b$, is provided from the FIFO. The output of the min†− processing functional block is the updated edge messages with respect to the check nodes, $Medge_c$.

It is noted here that the functionality of the min†† functional block may be viewed performed a version of min* processing with minimum comparison processing.

More detail of a possible embodiment by which min†† processing may be performed is provided in subsequent diagrams and description. It is also noted that only one FIFO is required for all of a predetermined number of processors in each macro block. That is to say, each of the embodiments described above that include a plurality of macro blocks to support the LDPC decoding functionality may be implemented using either the check node processing functionality 2000 or the check node processing functionality 2100, and each such embodiment would need only one FIFO. In some instances, one FIFO is required for all 20 processors in each macro block of LDPC decoding functionality. As can also be seen below, this is also the case for the other embodiments of check node processing functionality 2200 and check node processing functionality 2300 described in more detail below.

Figure 22:
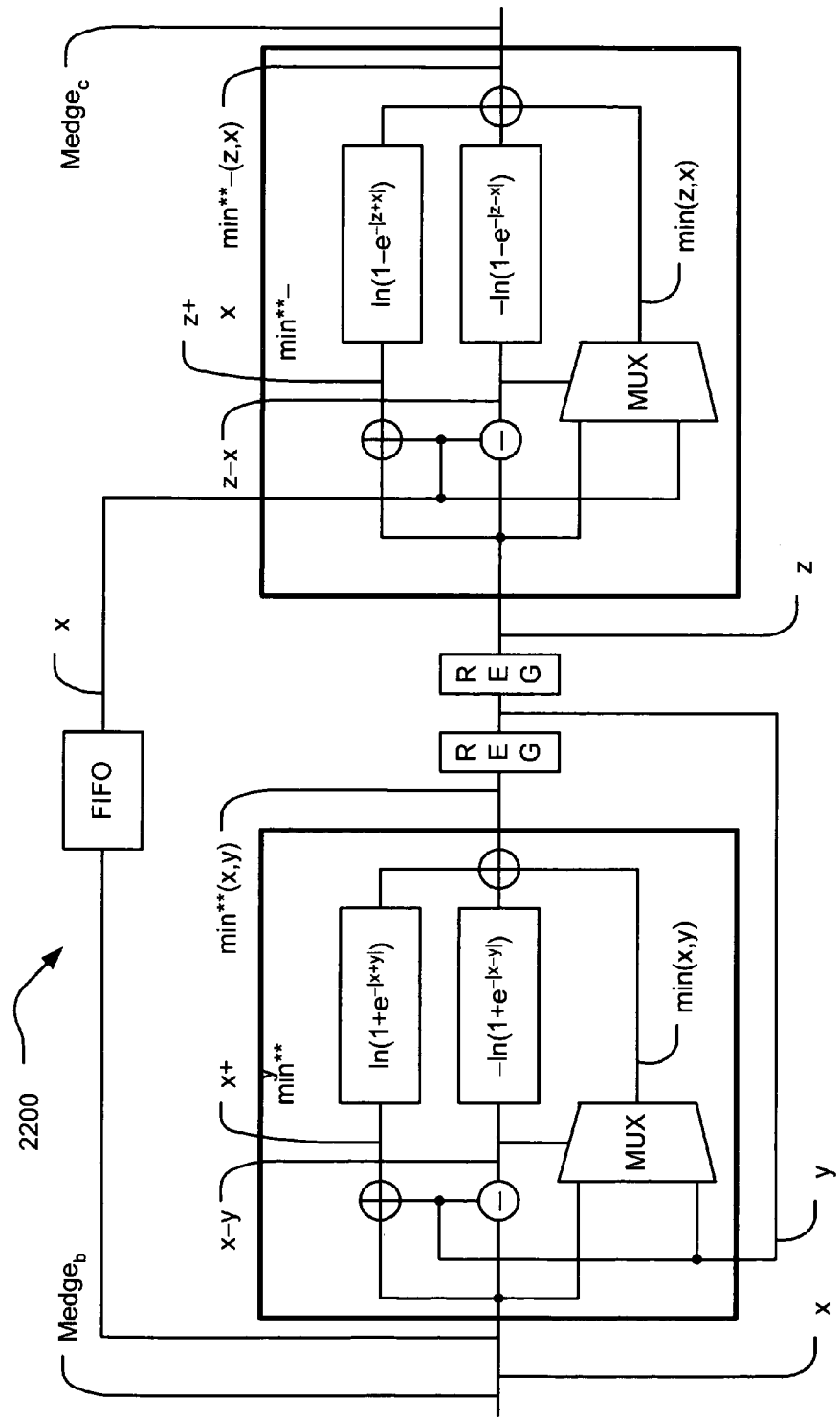

Referring to the check node processing functionality 2200 of FIG. 22, this diagram may be viewed as one possible manner by which the check node processing functionality 2000 can be implemented.

From a higher view, the functionality of the check node processing functionality 2200 is very similar to the check node processing functionality 2000. In this diagram, more details are provided for a possible embodiment for the min processing functional block and the min− processing functional block. The min processing functional block receives as input the edge messages with respect to the bit nodes, $Medge_b$, which is also depicted as the value of x in the diagram. The min processing functional block operates by calculating two separate log correction factors, shown as $\ln(1+e^{-|x+y|})$ and $-\ln(1+e^{-|x-y|})$ as well as determining the minimum value of among two separate values (i.e., minimum of x and y). The determination of which value is the smallest of the two (either x or y) is determined by a multiplexor (MUX). To do this, the min** processing functional block operates to calculate the two separate values of x−y and x+y. Each of these values is provided to its corresponding block that calculates its corresponding log correction value.

The output of the min processing functional block is the sum of the minimum value (x or y) and these two separate log correction factors. The value of y is the output of the min functional block that is fed back to the very same min** functional block for subsequent calculations.

The min− processing functional block operates somewhat similarly to the min processing functional block. However, the min− processing functional block operates on the resultant of the min processing functional block (whose output is shown as z), as well as the appropriately ordered edge message with respect to the bit nodes, $Medge_b$, that is provided from the FIFO (shown as x). This value of z may be viewed as being the min processing result of all of the edge messages with respect to the bit nodes (i.e., min (all $Medge_b$)).

The min− processing functional block operates by calculating two separate log correction factors, shown as $\ln(1-e^{-|z+x|})$ and $-\ln(1-e^{-|z-x|})$ as well as determining the minimum value of among two separate values (i.e., minimum of z and x). The determination of which value is the smallest of the two (either z or x) is determined by a multiplexor (MUX). To do this, the min– processing functional block operates to calculate the two separate values of z–x and z+x. Each of these values is provided to its corresponding block that calculates its corresponding log correction value.

The ultimate output from the min processing functional block and the min– processing functional block is the updated edge messages with respect to the check nodes, Medge$_c$. It is also noted that determination of the log correction values within each of the min processing functional block and the min– processing functional block may be performed using LUTs (Look Up Tables) implemented using some other type of memory structures. To perform this using LUTs, two separate LUTs may be implemented within each of the min processing functional block and the min– processing functional block.

Figure 23:
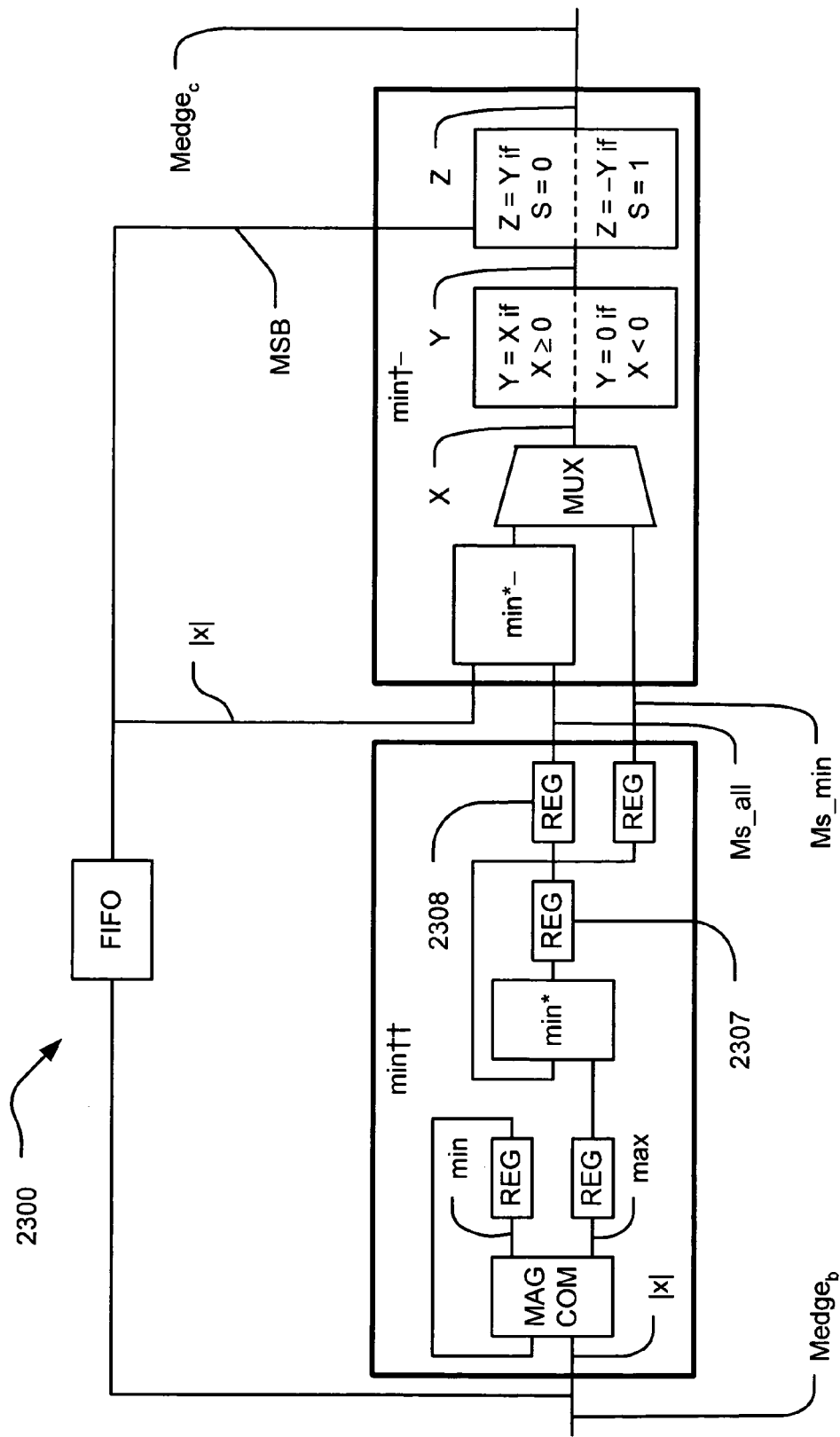

Referring to the check node processing functionality 2300 of FIG. 23, this diagram may be viewed as one possible manner by which the check node processing functionality 2100 can be implemented. This diagram employs a min†† processing functional block and a min†– processing functional block to update the edge messages with respect to the check nodes, Medge$_c$, using the edge messages with respect to the bit nodes, Medge$_b$.

From a higher view, the functionality of the check node processing functionality 2300 is very similar to the check node processing functionality 2100. In this diagram, more details are provided for a possible embodiment for the min††processing functional block and the min†– processing functional block.

Within the min†† processing functional block, the received edge messages with respect to the bit nodes, Medge$_b$, immediately undergo an absolute value determination and a format change to sign magnitude format so that the minimum of all inputs is easier to find. This is performed within a magnitude compare functional block (shown as MAG COM). The minimum (shown as min) and maximum (shown as max) value of all of the edge messages with respect to the bit nodes, Medge$_b$. The maximum value of all of the edge messages with respect to the bit nodes, Medge$_b$, is output from the magnitude compare functional block. This maximum value is passed to a min* processing functional block within the min†† processing functional block. The ultimate outputs from the min†† processing functional block is the min* processing resultant of all of the edge messages with respect to the bit nodes, Medge$_b$, (which is shown as Ms_all) and the min* processing resultant of all of the edge messages with respect to the bit nodes, Medge$_b$, except for the minimum input value (which is shown as Ms_min).

The min†– processing functional block receives each of these min* processing resultants (Ms_all and Ms_min). The min†– processing functional block also receives the absolute value of x, namely |x|, from the FIFO. A min*– processing functional block, within the min†– processing functional block, operates on the received absolute value of x, namely |x|, and the min* processing resultant of all of the edge messages with respect to the bit nodes, Medge$_b$, (which is shown as Ms_all) that is provided from the min†† processing functional block. This resultant, from the min*– processing functional block within the min†– processing functional block is provided as one input to a MUX within the min†– processing functional block, and the min* processing resultant of all of the edge messages with respect to the bit nodes, Medge$_b$, except for the minimum input value (which is shown as Ms_min) is provided as the other input to the MUX within the min†– processing functional block. The selected output from this MUX is shown as X within the min†– processing functional block. Two separate assignments are employed to generate Y and subsequently Z from the value of X.

$$Y = \begin{cases} X & \text{if } X \geq 0 \\ 0 & \text{if } X < 0 \end{cases}$$

$$Z = \begin{cases} Y & \text{if } S = 0 \\ -Y & \text{if } S = 1 \end{cases}$$

S is the MSB (Most Significant Bit) provided from the FIFO. This value of S helps to determine the final value of the updated edge messages with respect to the check nodes, Medge$_c$, based on the convention and assignment of the values Y and Z depicted above.

Each of these various embodiments to perform check node processing and to implement check node processing functionality may be implemented within any embodiment of a communication device that includes LDPC decoding functionality that is operable to decode LDPC coded signals.

The following embodiments show several possible, very efficient means by which the calculations used to perform check node processing may be implemented several embodiments are illustrated showing min* processing, and these designs can easily be adapted to perform max* processing with very little modification. This minor modification is to comport the hardware to perform the necessary calculations of the desired type of processing. Many of the several types of processing that may be employed when doing check node processing are provided above. For example, the various embodiments of min* processing may easily be adapted to perform max* processing. Analogously, the various embodiments of min*– processing may easily be adapted to perform max*– processing as well.

With respect to this check node processing functionality 2300, it is noted that two of the registers (REG 2307 and REG 2308) within the min†† processing functional block may also be employed within the bit node processing functionality 1900 of the FIG. 19. Moreover, certain of the components of the min* processing functional block of the min†† processing functional block as well as certain of the components of the min*– processing functional block of the min†– processing functional block.

Figure 24:
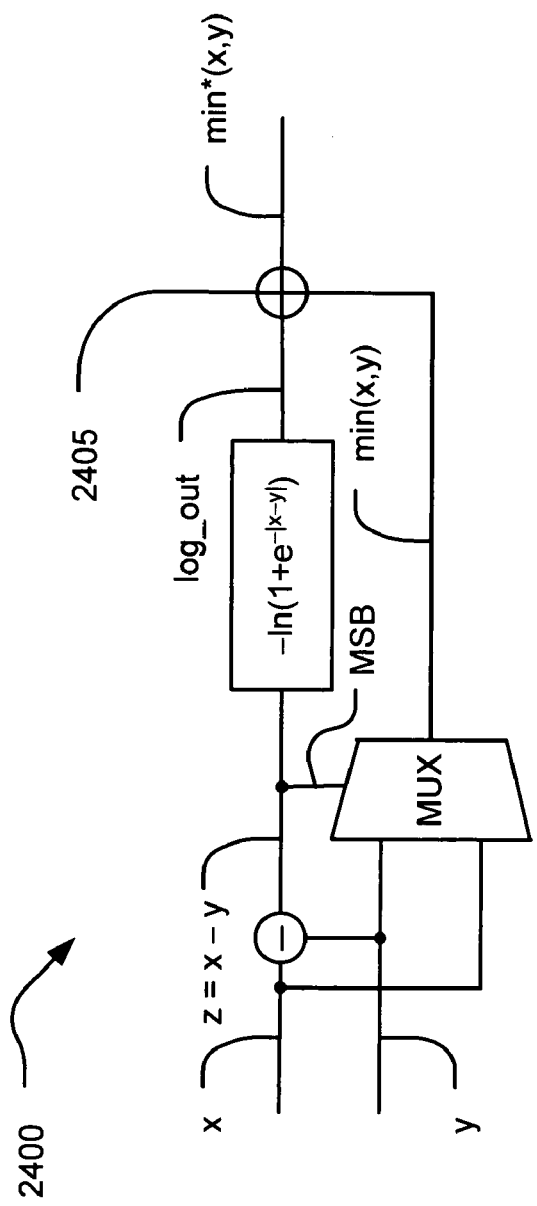
FIG. 24 is a diagram illustrating an embodiment of min* (min-star) processing functionality according to certain aspects of the invention.

FIG. 24 is a diagram illustrating an embodiment of min* (min-star) processing functionality 2400 according to certain aspects of the invention. This diagram shows the min* processing operations being performed on two inputs, namely x and y. A difference, z, between x and y is determined (i.e., z=x–y). Each of the inputs, x and y, is also provided to a MUX. The MSB of the difference between x and y, namely z, is used to select which of the inputs, x or y, is the minimum value (i.e., min(x,y)).

Also, the determined difference between x and y, namely z, is provided to a log correction factor calculation functional block that calculates $-\ln(1+e^{-|x-y|})$; this log correction value is shown as log_out. The final min* processing resultant is shown as being the sum of the minimum value of x or y and the log correction value (i.e., log_out).

An adder 2405 that is employed to do this summation may be the same adder 1905 that is employed within the bit node processing functionality 1900 of the FIG. 19. Moreover, this min* processing functionality 2400 may be implemented as the min* processing functional block within the min†† processing functional block of the check node processing functionality 2300 of the FIG. 23.

FIG. 25 is a diagram illustrating an embodiment of a min* log table according to certain aspects of the invention. As mentioned above in other embodiments, a LUT (Look-Up Table) may be employed to provide the predetermined (or pre-calculated) values of the very quickly based on the value of z, which the difference between the two input values. This table provides the values for the log correction factor, log_out (in binary), based on various values of the difference between x and y, namely z. The actual values of the term $-\ln(1+e^{-|x-y|})$ are provided as well as binary assignments of that term (as shown by log_out). As can be seen, when the difference between x and y, namely z, is relatively large beyond a particular threshold (i.e., a relatively large positively valued number) or relatively small beyond a particular threshold (i.e., a relatively large negatively valued number), then the value of log_out is saturated and set to 000. This embodiment of the min* log table shows 3 bits of precision of the log_out value in binary, yet other degrees of precision may alternatively be employed without departing from the scope and spirit of the invention. There is a region of interest of log_out in which its value does change as a function of z. For example, as z varies from approximately +1.25 to −1.25, the value of log_out in fact changes as a function of z. However, when z is greater than +1.25, then the value of log_out is saturated. Also, when z is less than −1.25, then the value of log_out is also saturated.

Because of this behavior of the log correction value, even more efficient and fast implementations of min* processing for use in check node processing in accordance with certain aspects of the invention. Analogously, other calculations employed within check node processing may also benefit from the fact that various values may be predetermined (or pre-calculated) and stored in LUTs, implemented using some type of memory, to provide for even faster calculations and processing within a communication device that employs LDPC decoding functionality in accordance with certain aspects of the invention.

Figure 26:
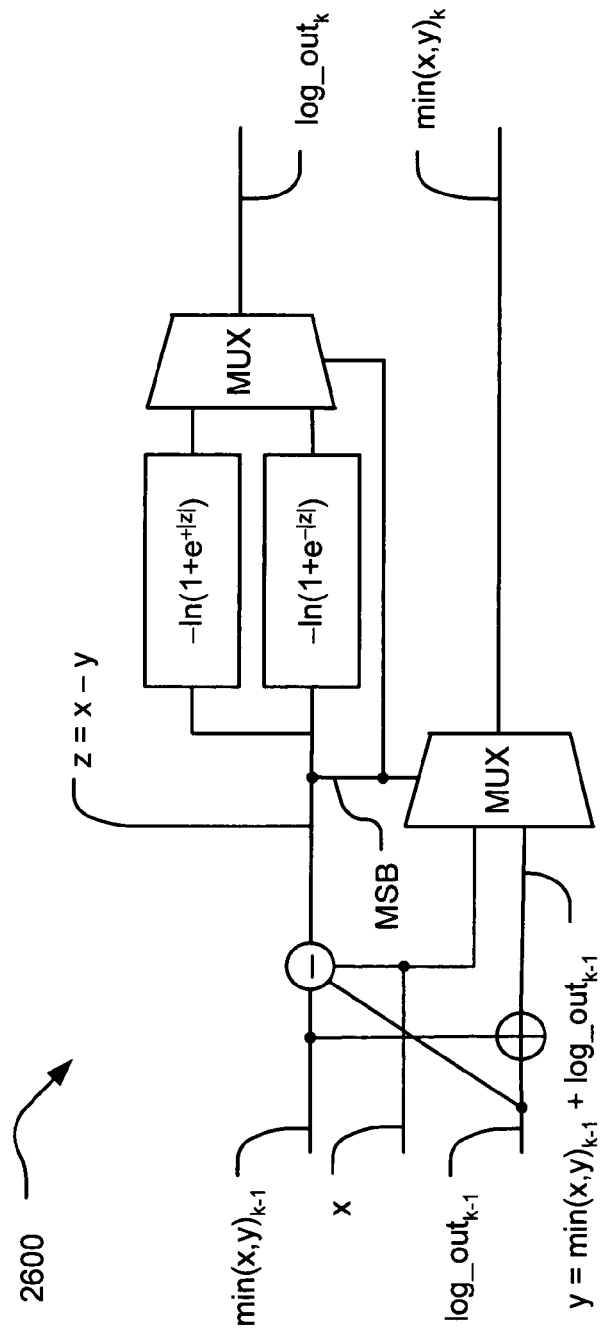
FIG. 26 is a diagram illustrating an alternative embodiment of min* processing functionality according to certain aspects of the invention.

FIG. 26 is a diagram illustrating an alternative embodiment of min* processing functionality 2600 according to certain aspects of the invention. The functionality of this diagram is also operable to perform min* processing, but in a much faster manner than the previous embodiment. In some respects, this embodiment has similarity to the embodiment described above. However, this diagram employs two separate and simultaneously operating log correction factor calculation functional blocks.

This diagram also shows the min* processing operations being performed on two inputs, namely x and y. A difference between x and y is determined (i.e., z=x−y). Each of the inputs, x and y, is also provided to a MUX. The value of y is the sum of two other values, namely the minimum value of x or y from a previous iteration (shown as $\min(x,y)_{k-1}$) and the log correction factor from the previous iteration (shown as $\log\_out_{k-1}$). The MSB of the difference between x and y, namely z, is used to select which of the inputs, x or y, is the minimum value in this iteration (i.e., $\min(x,y)_k$).

Also, the determined difference between x and y, namely z, is provided to the two separate log correction factor calculation functional blocks that calculate $-\ln(1+e^{-|z|})$ and $-\ln(1+e^{+|z|})$, respectively. Each of the resultant values from these two separate log correction factor calculation functional blocks is provided to another MUX. The same MSB of the difference between x and y, namely z, is used to select which of these values from the two separate log correction factor calculation functional blocks is to be used as the actual log correction value in this iteration. The final selected log correction value in this iteration is shown as $\log\_out_k$. The final min* processing resultant may be viewed as being the sum of the minimum value of x or y (i.e., $\min(x,y)_k$) and the log correction value (i.e., $\log\_out_k$). However, in this embodiment, these two values are kept separate for ease of performing subsequent computational steps. If desired, these two values may alternatively be added together.

Figure 27:
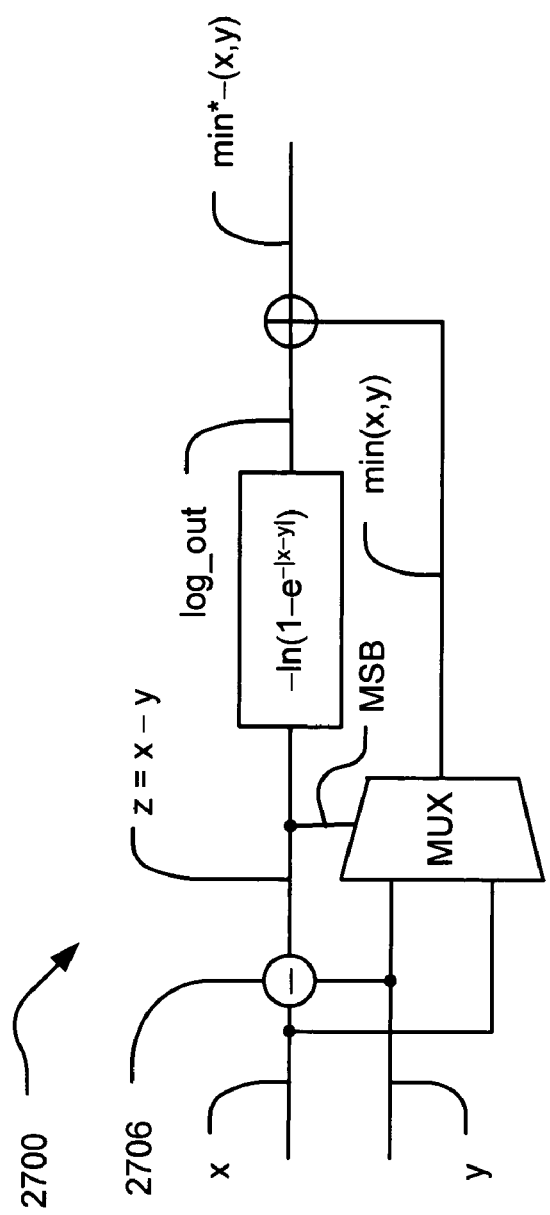
FIG. 27 is a diagram illustrating an embodiment of min*− (min-star-minus) processing functionality according to certain aspects of the invention.

FIG. 27 is a diagram illustrating an embodiment of min*− (min-star-minus) processing functionality 2700 according to certain aspects of the invention. The functionality of this diagram is somewhat similar to the functionality of the min* (min-star) processing functionality 2400.

This diagram shows the min*− processing operations being performed on two inputs, namely x and y. A difference between x and y is determined (i.e., z=x−y). Each of the inputs, x and y, is also provided to a MUX.

A subtractor 2706 that is employed to determine this difference may be the same subtractor 1906 that is employed within the bit node processing functionality 1900 of the FIG. 19. Moreover, this min*− processing functionality 2700 may be implemented as the min*− processing functional block within the min†− processing functional block of the check node processing functionality 2300 of the FIG. 23.

The MSB of the difference between x and y, namely z, is used to select which of the inputs, x or y, is the minimum value (i.e., min(x,y)).

Also, the determined difference between x and y, namely z, is provided to a log correction factor calculation functional block that calculates $-\ln(1-e^{-|x-y|})$; this log correction value is shown as log_out. The final min*− processing resultant is shown as being the sum of the minimum value of x or y and the log correction value (i.e., log_out).

Figure 28:
FIG. 28 is a diagram illustrating an embodiment of a min*− log table according to certain aspects of the invention.

FIG. 28 is a diagram illustrating an embodiment of a min*− log table according to certain aspects of the invention. Again, as mentioned above in other embodiments, a LUT (Look-Up Table) may be employed to provide the predetermined (or pre-calculated) values of the very quickly based on the value of z, which the difference between the two in put values. This table provides the values for the log correction factor, log_out (in binary), based on various values of the difference between x and y, namely z. The actual values of the term $-\ln(1-e^{-|x-y|})$ are provided as well as binary assignments of that term (as shown by log_out). As can be seen, when the difference between x and y, namely z, is relatively large beyond a particular threshold (i.e., a relatively large positively valued number) or relatively small beyond a particular threshold (i.e., a relatively large negatively valued number), then the value of log_out is saturated and set to 00000. This embodiment of the min*− log table shows 5 bits of precision of the log_out value in binary, yet other degrees of precision may alternatively be employed without departing from the scope and spirit of the invention. There is a region of interest of log_out in which its value does change as a function of z. For example, as z varies from approximately +1.5 to −1.5, the value of log_out in fact changes as a function of z. However, when z is greater than +1.5, then the value of log_out is saturated. Also, when z is less than −1.5, then the value of log_out is also saturated.

With respect to the value of log_out within min*− processing when z=0, then a predetermined value of log_out is employed (shown as 01000 in binary, and identified with an asterisk, *). This is because of the illegal value that would occur if the natural log is taken of a 0 valued number (i.e., ln(0)). Because of this, a predetermined large values estimate is employed for this case as can be seen in the min*− log table.

Because of this behavior of the log correction value, even more efficient and fast implementations of min*− processing for use in check node processing in accordance with certain aspects of the invention. Analogously, other calculations employed within check node processing may also benefit from the fact that various values may be predetermined (or pre-calculated) and stored in LUTs, implemented using some type of memory, to provide for even faster calculations and processing within a communication device that employs LDPC decoding functionality in accordance with certain aspects of the invention.

Figure 29:
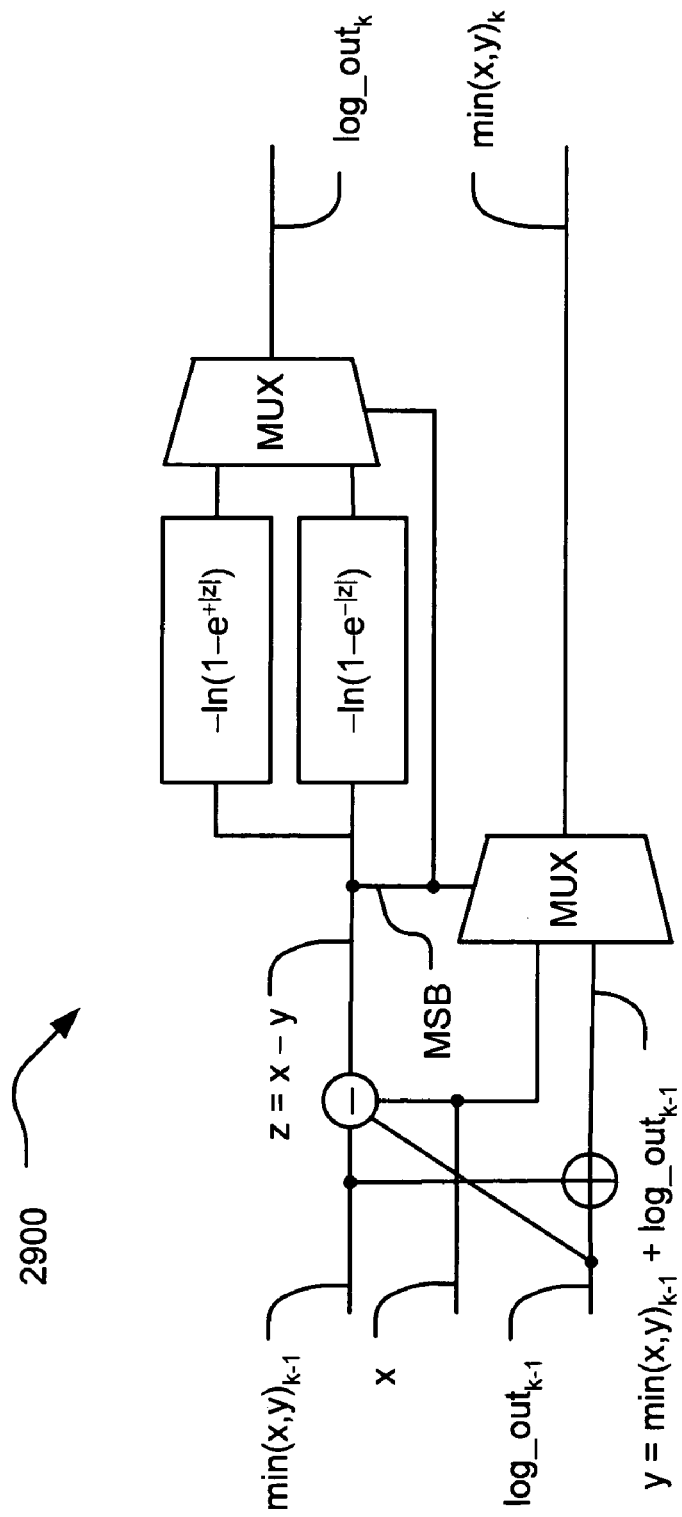
FIG. 29 and FIG. 30 are diagrams illustrating alternative embodiments of min*−processing functionality according to certain aspects of the invention.
Figure 30:
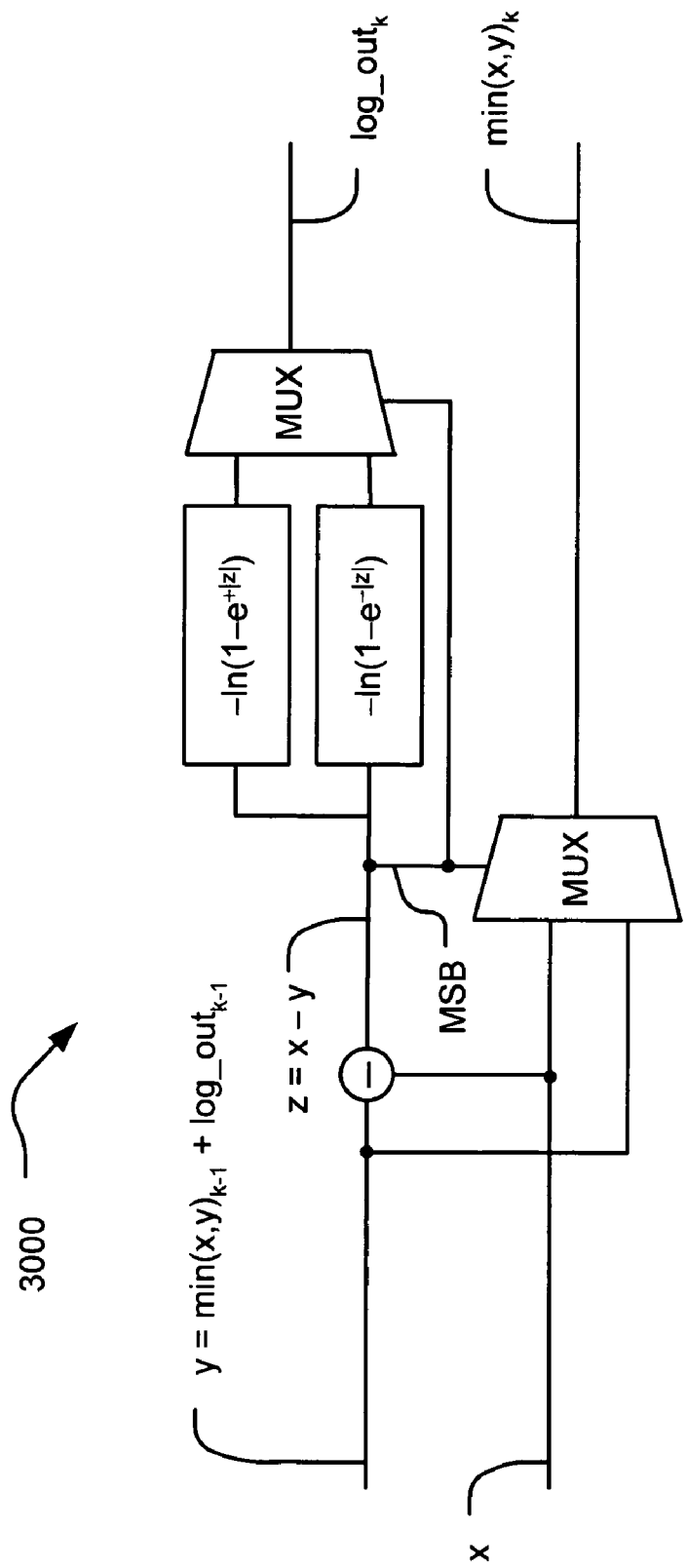

FIG. 29 and FIG. 30 are diagrams illustrating alternative embodiments of min*–processing functionality, 2900 and 3000, respectively, according to certain aspects of the invention.

Referring to the embodiment of min*– processing functionality 2900, this embodiment is somewhat similar to the embodiment of min* processing functionality 2600. The functionality of this diagram is also operable to perform min*– processing, but in a much faster manner than the previous embodiment. In some respects, this embodiment has similarity to the embodiment described above that performs min*– processing. However, this diagram employs two separate and simultaneously operating log correction factor calculation functional blocks.

This diagram also shows the min*– processing operations being performed on two inputs, namely x and y. A difference between x and y is determined (i.e., z=x–y). Each of the inputs, x and y, is also provided to a MUX. The value of y is the sum of two other values, namely the minimum value of x or y from a previous iteration (shown as $\min(x,y)_{k-1}$) and the log correction factor from the previous iteration (shown as $\log\_out_{k-1}$). The MSB of the difference between x and y, namely z, is used to select which of the inputs, x or y, is the minimum value in this iteration (i.e., $\min(x,y)_k$).

Also, the determined difference between x and y, namely z, is provided to the two separate log correction factor calculation functional blocks that calculate $-\ln(1-e^{-|z|})$ and $-\ln(1-e^{+|z|})$, respectively. Each of the resultant values from these two separate log correction factor calculation functional blocks is provided to another MUX. The same MSB of the difference between x and y, namely z, is used to select which of these values from the two separate log correction factor calculation functional blocks is to be used as the actual log correction value in this iteration. The final selected log correction value in this iteration is shown as $\log\_out_k$. The final min*– processing resultant may be viewed as being the sum of the minimum value of x or y (i.e., $\min(x,y)_k$) and the log correction value (i.e., $\log\_out_k$). However, in this embodiment, these two values are kept separate for ease of performing subsequent computational steps.

Referring to the embodiment of min*– processing functionality 3000, this embodiment is very similar to the embodiment of min*– processing functionality 2900 with the exception that the values of x and y are received such that y is the combined term of the sum of the minimum value of x or y from a previous iteration (shown as $\min(x,y)_{k-1}$) and the log correction factor from the previous iteration (shown as $\log\_out_{k-1}$); that is to say, y is received as being in the form $y=\min(x,y)_{k-1}+\log\_out_{k-1}$.

The bit degree precision of each of the various embodiments depicted and described herein may be adapted and selected by a designer. While certain examples of bit degree precision have been provided, it is clear that other values of bit degree precision may alternatively be employed without departing from the scope and spirit of the invention.

Figure 31:
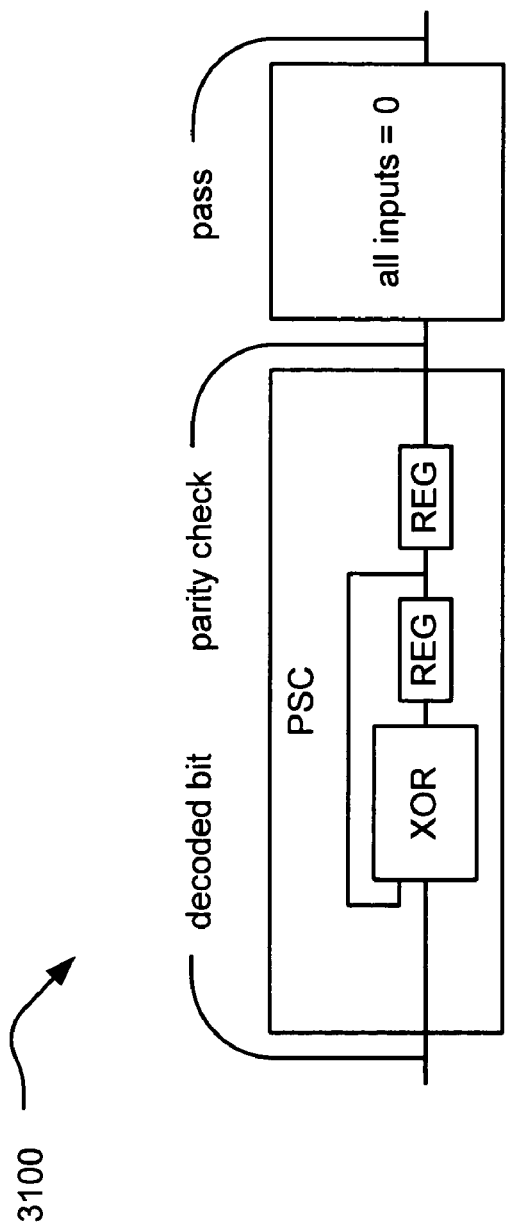
FIG. 31 is a diagram illustrating an embodiment of syndrome calculation functionality according to certain aspects of the invention.

FIG. 31 is a diagram illustrating an embodiment of syndrome calculation functionality 3100 according to certain aspects of the invention. For each of the various approaches to performing LDPC decoding, the most recent estimate of the decoded bit is provided to a partial syndrome check functional block (shown as PSC) to determine the parity check of the decoded bit. This most recent estimate of the decoded bit is passed to an XOR (exclusive OR) logic gate and subsequently to two successive registers (shown as REG). The output from the first of these registers is fed back to the XOR logic gate. The determined parity check is then passed to a subsequent functional block to determine if all of the syndromes (i.e., all of the parity checks from the partial syndrome check functional block) are equal to zero. When all of the syndromes are in fact equal to zero, then the decoded bit passes and the LDPC decoding functionality uses this most recent estimate of the decoded bit as the best estimate of the bit.

Figure 32:
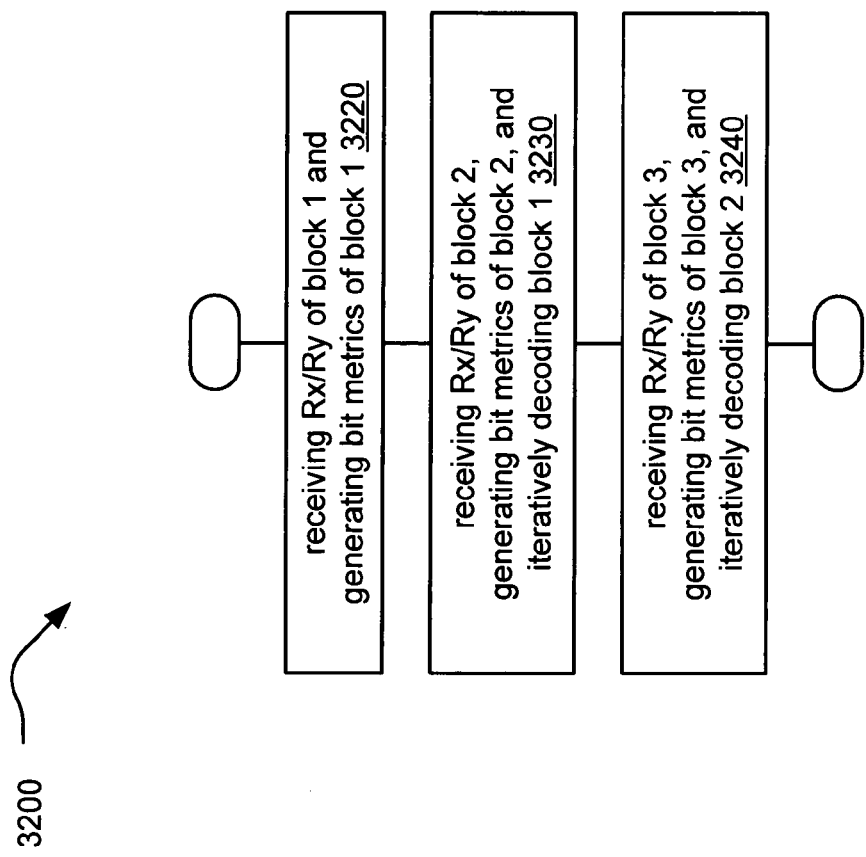
FIG. 32 is a flowchart illustrating an embodiment of a method for LDPC decoding that may be performed according to certain aspects of the invention.

FIG. 32 is a flowchart illustrating an embodiment of a method for LDPC decoding 3200 that may be performed according to certain aspects of the invention. In a block 3220, the method operates by receiving the I, Q values (e.g., Rx/Ry) of a block 1 and also generating the bit metrics of the block 1. This allows for parallel and simultaneous processing of the receipt of the I, Q values (e.g., Rx/Ry) of a first block while also going forward performing the bit metric calculation for the first block.

Then, in a block 3230, the method involves receiving the I, Q values (e.g., the Rx/Ry) of a block 2, and generating the bit metrics of the block 2. In addition, as also shown within the block 3230, the method simultaneously involves iteratively decoding the block 1. At this point in time, parallel and simultaneous processing of receipt and metric calculation for one block (e.g., block 2) is being performed while iteratively decoding a previously received block (e.g., block 1).

Then, in a block 3240, the method involves receiving the I, Q values (e.g., the Rx/Ry) of a block 3, and also generating the bit metrics of the block 3. In addition, as also shown within the block 3240, the method simultaneously involves iteratively decoding the block 2. Just as within the operations shown within the block 3230, parallel and simultaneous processing of receipt and metric calculation for one block (e.g., block 3) is being performed while iteratively decoding a previously received block (e.g., block 2).

Figure 33:
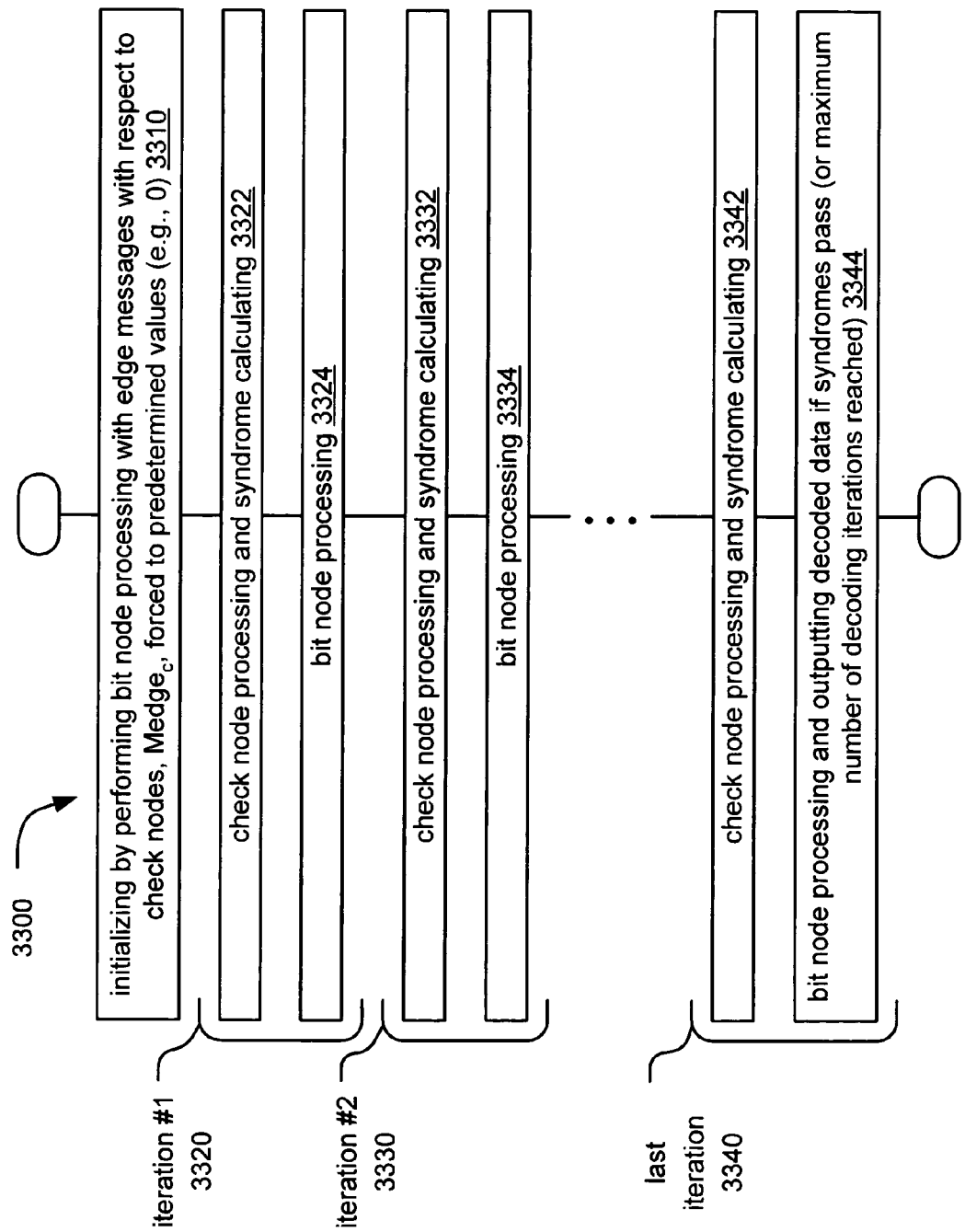
FIG. 33 is a flowchart illustrating an embodiment of a method for iterative LDPC decoding that may be performed according to certain aspects of the invention.

FIG. 33 is a flowchart illustrating an embodiment of a method for iterative LDPC decoding 3300 that may be performed according to certain aspects of the invention. In a block 3310, the method involves initializing by performing bit node processing with edge messages with respect to check nodes, $Medge_c$, forced to predetermined values. These edge messages with respect to check nodes, $Medge_c$, may be forced to 0 values in some embodiments.

Next, the iterative decoding processing operations are performed. During an iteration #1 3320, the method operates by performing check node processing and syndrome calculating as shown in a block 3322. Also during the iteration #1 3320, the method operates by performing bit node processing as shown in a block 3324.

During an iteration #2 3330, the method operates by performing check node processing and syndrome calculating as shown in a block 3332. Also during the iteration #2 3330, the method operates by performing bit node processing as shown in a block 3334.

Various numbers of decoding iterations may be performed without departing from the scope and spirit of the invention. This is shown pictorially as an ellipsis (i.e. . . . ).

During a last iteration 3340, the method operates by performing check node processing and syndrome calculating as shown in a block 3342. Also during the last iteration 3340, the method operates by performing bit node processing and outputting decoded data if syndromes pass (or maximum number of decoding iterations reached) as shown in a block 3334.

Figure 34:
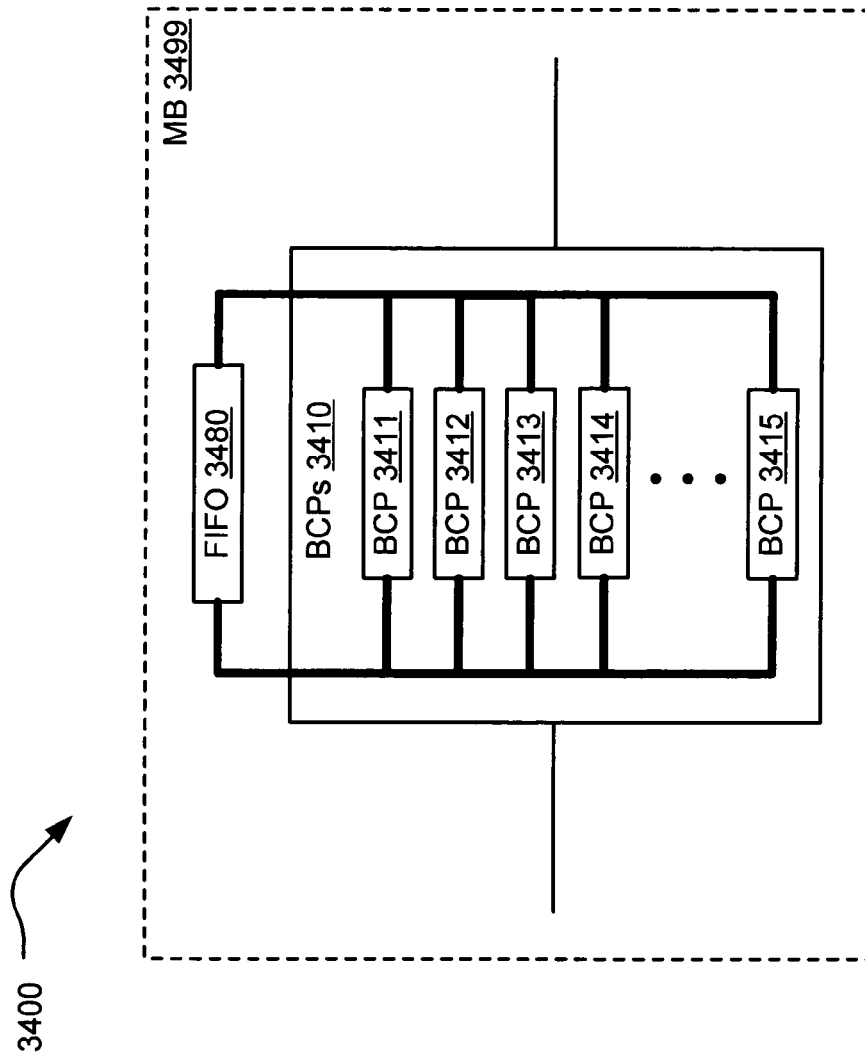
FIG. 34 is a diagram illustrating an embodiment of a single FIFO buffer servicing a number of bit/check processors within a macro block of an LDPC decoder in accordance with certain aspects of the invention.

FIG. 34 is a diagram illustrating an embodiment 3400 of a single FIFO buffer servicing a number of bit/check processors within a macro block of an LDPC decoder in accordance with certain aspects of the invention. In this diagram, a single FIFO buffer 3480 is operable to service each bit/check processor of a plurality of bit/check processors 3410 within a macro block 3499 (shown as MB 3499). The plurality of bit/check processors 3410 may include a BCP 3411 (which is a $1^{st}$ bit/check processor), BCP 3412 (which is a $2^{nd}$ bit/check processor), BCP 3413 (which is a $3^{rd}$ bit/check processor), BCP 3414 (which is a $4^{th}$ bit/check processor), . . . , and BCP 3415 (which may be viewed as being an nth bit/check processor). There may be various numbers plurality of bit/check processors within the plurality of bit/check processors 3410. For example, in some embodiments, there may be as many as 20 bit/check processors within the plurality of bit/check processors 3410. In addition, there may be various numbers of macro blocks 3499 implemented within such a decoder, as described above in alternative embodiments.

As can be seen in this embodiment, a single FIFO buffer 3480 is capable to service each bit/check processor of the plurality of bit/check processors 3410. By sharing the FIFO buffer 3480, a significant savings in real estate is achieved within an actual communication device that is implemented in accordance with certain aspects of the invention.

Figure 35:
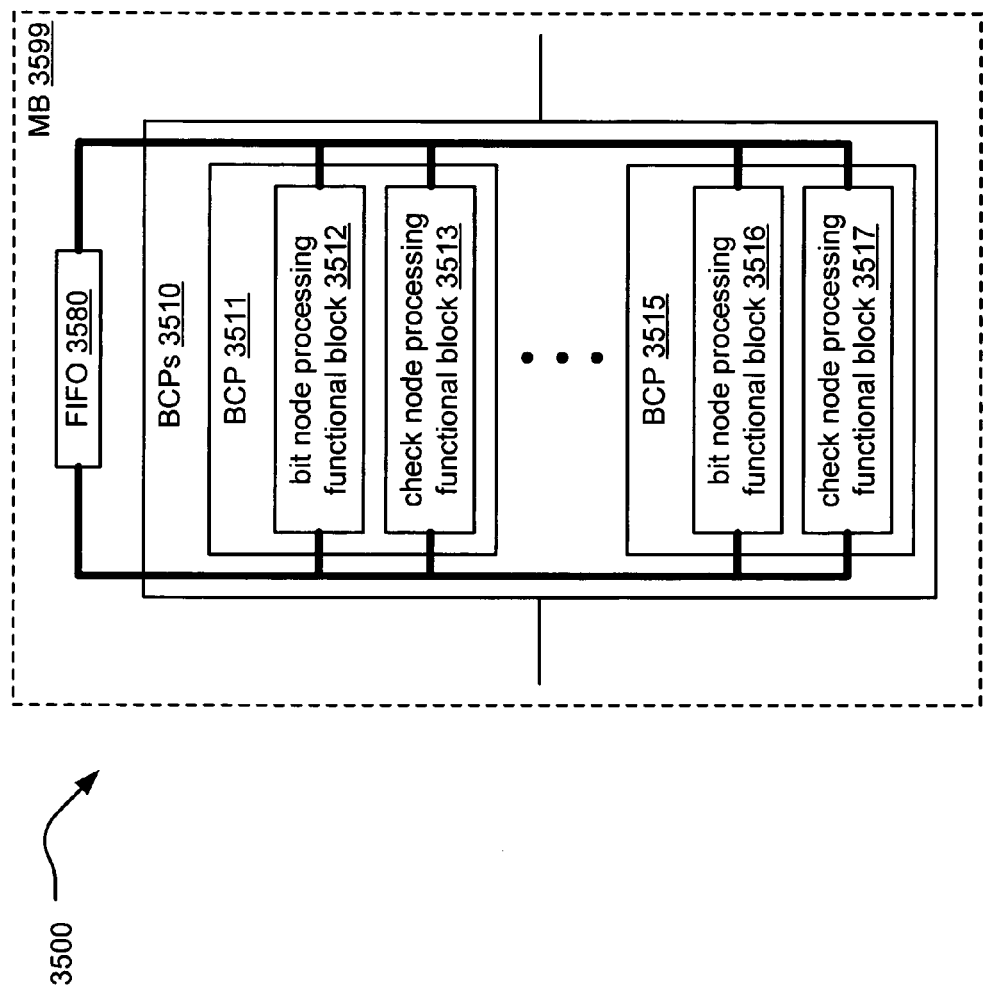
FIG. 35 is a diagram illustrating an embodiment of a single FIFO buffer servicing each corresponding bit node processing functional block and corresponding check node processing functional block within each of the bit/check processors of a macro block of an LDPC decoder in accordance with certain aspects of the invention.

FIG. 35 is a diagram illustrating an embodiment 3500 of a single FIFO buffer servicing each corresponding bit node processing functional block and corresponding check node processing functional block within each of the bit/check processors of a macro block of an LDPC decoder in accordance with certain aspects of the invention.

Also in this diagram, a single FIFO buffer 3580 is operable to service each bit/check processor of a plurality of bit/check processors 3510 within a macro block 3599 (shown as MB 3599). Again, the plurality of bit/check processors 3510 may include a BCP 3511 (which is a $1^{st}$ bit/check processor), . . . , and BCP 3515 (which may be viewed as being an nth bit/check processor). There may be various numbers plurality of bit/check processors within the plurality of bit/check processors 3510. For example, in some embodiments, there may be as many as 20 bit/check processors within the plurality of bit/check processors 3510. In addition, there may be various numbers of macro blocks 3599 implemented within such a decoder, as described above in alternative embodiments.

In this diagram, each of the bit/check processors within the plurality of bit/check processors 3510 is shown as including two separate processing functional blocks: a bit node processing functional block and a check node processing functional block. For example, the BCP 3511 includes a bit node processing functional block 3512 and a check node processing functional block 3513. Analogously, the BCP 3515 includes a bit node processing functional block 3516 and a check node processing functional block 3517. The FIFO buffer 3580 is operable to service each of the bit node processing functional block and the check node processing functional block within each bit/check processor of the plurality of bit/check processors 3510. By using a common circuitry to perform both bit node processing and check node processing (i.e., by using the combination bit/check processor embodiment described herein), a great deal of space savings (i.e., real estate savings) may be achieved within an actual device that implements this architecture. Because of this shared circuitry, certain optimizations by sharing circuitry portions provides for a much smaller device.

It is also noted that the particular embodiment employed within each bit node processing functional block and check node processing functional block within the various bit/check processors may be selected as desired by a particular designer. For example, the check node processing functional block may be implemented using a min (min-double-star) processing functional block that operates in conjunction with a min− (min-double-star-minus) processing functional block as described above in other embodiments. Alternatively, the check node processing functional block may be implemented using a min†† (min-double-dagger) processing functional block that operates in conjunction with a min†− (min-dagger-minus) processing functional block as described above in other embodiments. Greater detail is provided above with respect to each of these possible embodiments of check node processing functionality that may be implemented within each check node processing functional block of each bit/check processor of the plurality of bit/check processors 3510. Generally speaking, the complexity of the bit node processing functional block may be viewed as being only that of an adder and/or a subtractor. This is also apparent when viewing the embodiments described above with respect to bit node processing functionality. Also generally speaking, the complexity of the check node processing functional block may be viewed as being only that of a min* (or max*) processing functional block or a min (or max) processing functional block. It is noted that a max− processing functional block has comparable complexity as a max processing functional block. Moreover, it is noted that certain aspects of the invention provide for a very efficient means to implement the max** processing calculations that are the exact hardware representation of the decoding calculations required to perform decoding of LDPC coded signals. Other aspects of the invention also provide for performing min* processing to approximate these calculations, in an effort to provide for even less hardware complexity (but with the understanding that there is some degradation in precision and performance).

There is a significant efficiency that is achieved by performing the check node processing in accordance with either of these two embodiments when compared to the prior art. For example, by performing min processing followed by min− processing when performing check node processing, a significant reduction in complexity is achieved when operating on multiple inputs (i.e., when operating on multiple edge messages with respect to a plurality of bit nodes, Medge$_b$, when performing updating of edge messages with respect to a plurality of check nodes, Medge$_c$.).

Figures 36A, 36B:
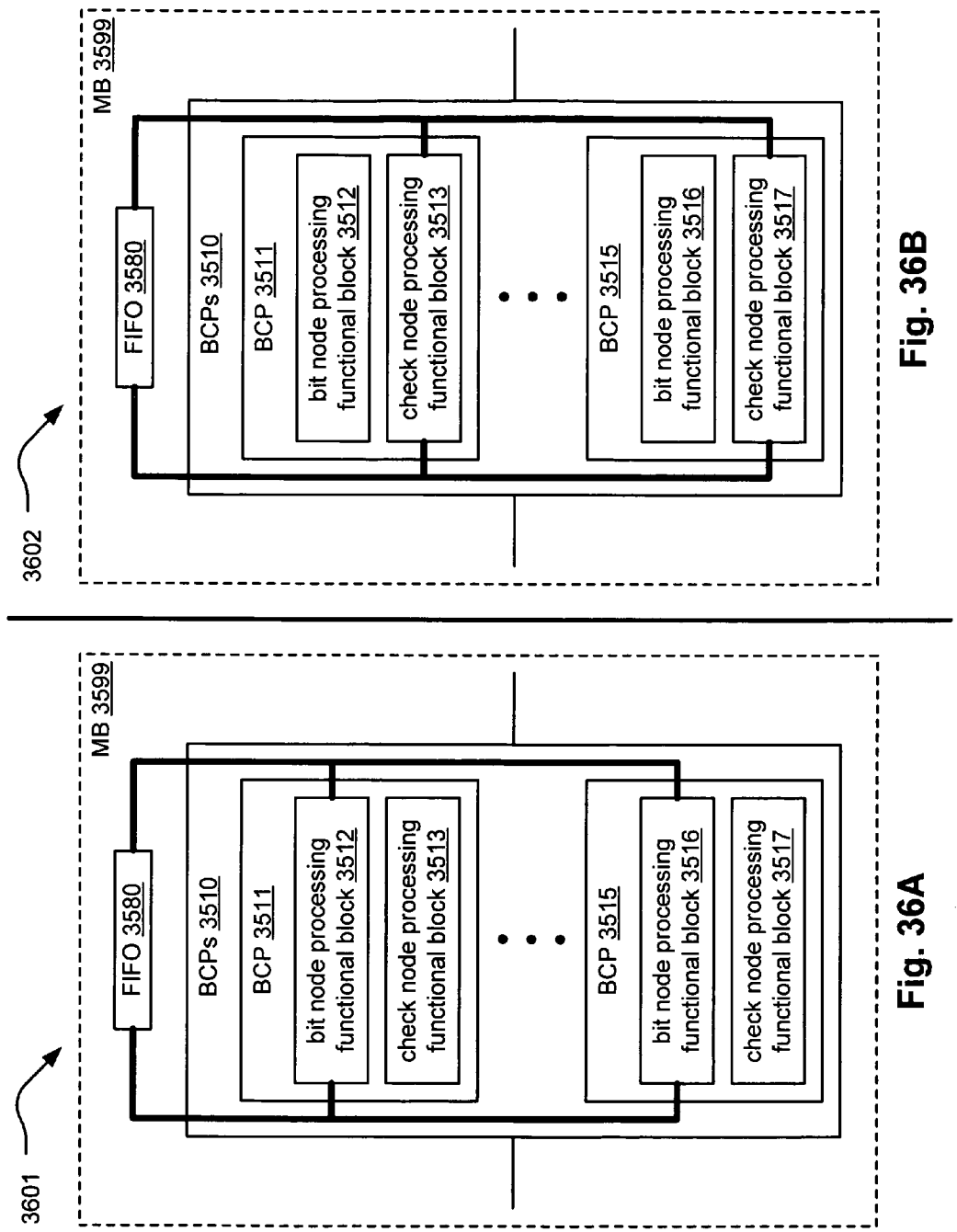
FIG. 36A is a diagram illustrating the embodiment of the FIG. 35 during bit node processing wherein the FIFO buffer is servicing each corresponding bit node processing functional block within each of the bit/check processors of a macro block of an LDPC decoder in accordance with certain aspects of the invention.
FIG. 36B is a diagram illustrating the embodiment of the FIG. 35 during check node processing wherein the FIFO buffer is servicing each corresponding check node processing functional block within each of the bit/check processors of a macro block of an LDPC decoder in accordance with certain aspects of the invention.

FIG. 36A is a diagram illustrating the embodiment 3601 of the FIG. 35 during bit node processing wherein the FIFO buffer is servicing each corresponding bit node processing functional block within each of the bit/check processors of a macro block of an LDPC decoder in accordance with certain aspects of the invention. As can be seen in this diagram, the connectivity is provided between the FIFO buffer 3580 and each bit node processing functional block of each bit/check processor of the plurality of bit/check processors 3510 when the LDPC decoder is performing bit node processing. That is to say, when an LDPC decoder that uses this architecture is performing bit node processing (i.e., updating edge messages with respect to a plurality of bit nodes, Medge$_b$), then the then the FIFO buffer 3580 is operable to service each of the corresponding bit node processing functional blocks contained within the macro block 3599.

FIG. 36B is a diagram illustrating the embodiment 3602 of the FIG. 35 during check node processing wherein the FIFO buffer is servicing each corresponding check node processing functional block within each of the bit/check processors of a macro block of an LDPC decoder in accordance with certain aspects of the invention.

As can be seen in this diagram, the connectivity is provided between the FIFO buffer 3580 and each check node processing functional block of each bit/check processor of the plurality of bit/check processors 3510 when the LDPC decoder is performing check node processing. That is to say, when an LDPC decoder that uses this architecture is performing check node processing (i.e., updating edge messages with respect to a plurality of check nodes, Medge$_c$), then the then the FIFO buffer 3580 is operable to service each of the corresponding check node processing functional blocks contained within the macro block 3599.

These diagrams of FIG. 36A and FIG. 36B are provided to show the reader the temporal relationship of the servicing of the FIFO buffer 3580 to each of the corresponding processing functional blocks (e.g., either bit node processing functional block or check node processing functional block) within each bit/check processor of the plurality of bit/check processors 3510 as a function of time. This use of a single FIFO buffer 3580, to service each of these separate functional blocks, during each of bit node processing and check node processing, also provides for a great deal of savings in terms of complexity, real estate, and also cost. Moreover, by the very nature that the there is shared circuitry portions and optimization by implementing the check node processing functional block and the bit node processing functional block in the same circuitry portion (i.e., within a bit/check processor), there is also even more savings in terms of complexity, real estate, and cost.

Each of the following diagrams are somewhat analogous to the previous embodiments, with the exception that the given FIFO buffers each have a plurality of parallel paths therein. For example, a single FIFO buffer is in such a way that is can accommodate a number of substantially simultaneous FIFO operations to service a number of different functional blocks. As also described before, a single FIFO buffer is operable to service each bit/check processor within a given macro block within an LDPC decoder implemented to perform this decoding processing. Generally speaking, a single FIFO buffer is operable to service each bit/check processor within a given macro block. In some embodiments as described above, each macro block includes 20 bit/check processor, and the FIFO buffers as described herein are operable to service that particular embodiment by servicing each bit/check processor within such a macro block.

Figure 37:
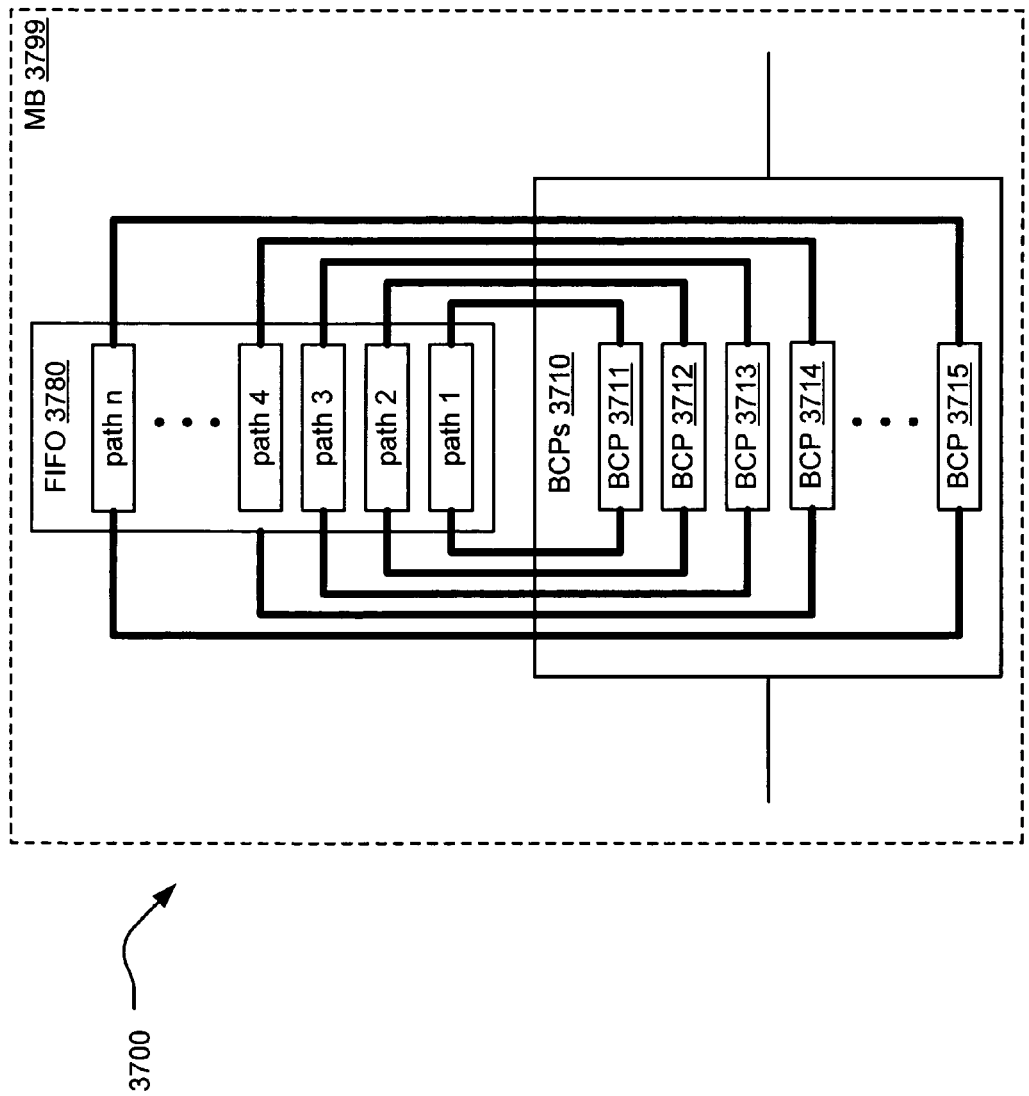
FIG. 37 is a diagram illustrating an embodiment of a single FIFO buffer, that include a number of parallel paths therein, implemented such that each parallel path of the FIFO buffer services corresponding bit/check processor within a macro block of an LDPC decoder in accordance with certain aspects of the invention.

FIG. 37 is a diagram illustrating an embodiment 3700 of a single FIFO buffer, that include a number of parallel paths therein, implemented such that each parallel path of the FIFO buffer services corresponding bit/check processor within a macro block of an LDPC decoder in accordance with certain aspects of the invention. This diagram shows a FIFO 3780 that includes n different paths therein, (shown as a path 1, a path 2, a path 3, a path 4, . . . , and a path n).

Similar to some embodiments above in some respects, a single FIFO buffer 3780 is operable to service each bit/check processor of a plurality of bit/check processors 3710 within a macro block 3799 (shown as MB 3799). The plurality of bit/check processors 3710 may include a BCP 3711 (which is a 1$^{st}$ bit/check processor), BCP 3712 (which is a 2$^{nd}$ bit/check processor), BCP 3713 (which is a 3$^{rd}$ bit/check processor), BCP 3714 (which is a 4$^{th}$ bit/check processor), . . . , and BCP 3715 (which may be viewed as being an nth bit/check processor). There may be various numbers plurality of bit/check processors within the plurality of bit/check processors 3710. For example, in some embodiments, there may be as many as 20 bit/check processors within the plurality of bit/check processors 3710. In addition, there may be various numbers of macro blocks 3799 implemented within such a decoder, as described above in alternative embodiments.

As can be seen in this embodiment, a single FIFO buffer 3780 is capable to service each bit/check processor of the plurality of bit/check processors 3710. By sharing the FIFO buffer 3780, a significant savings in real estate is achieved within an actual communication device that is implemented in accordance with certain aspects of the invention.

More specifically within this embodiment wherein the FIFO buffer 3780 includes a number of parallel path: the path 1 services the BCP 3711; the path 2 services the BCP 3712; the path 3 services the BCP 3713; the path 4 services the BCP 3714; . . . , and the path n services the BCP 3715 (which is an nth bit/check processor). Again, it is noted that a single FIFO buffer implemented to service each of the processing functional blocks within a given macro block provides for a great deal of savings of complexity, real estate, and cost of an actual hardware device implemented to support such functionality.

Figure 38:
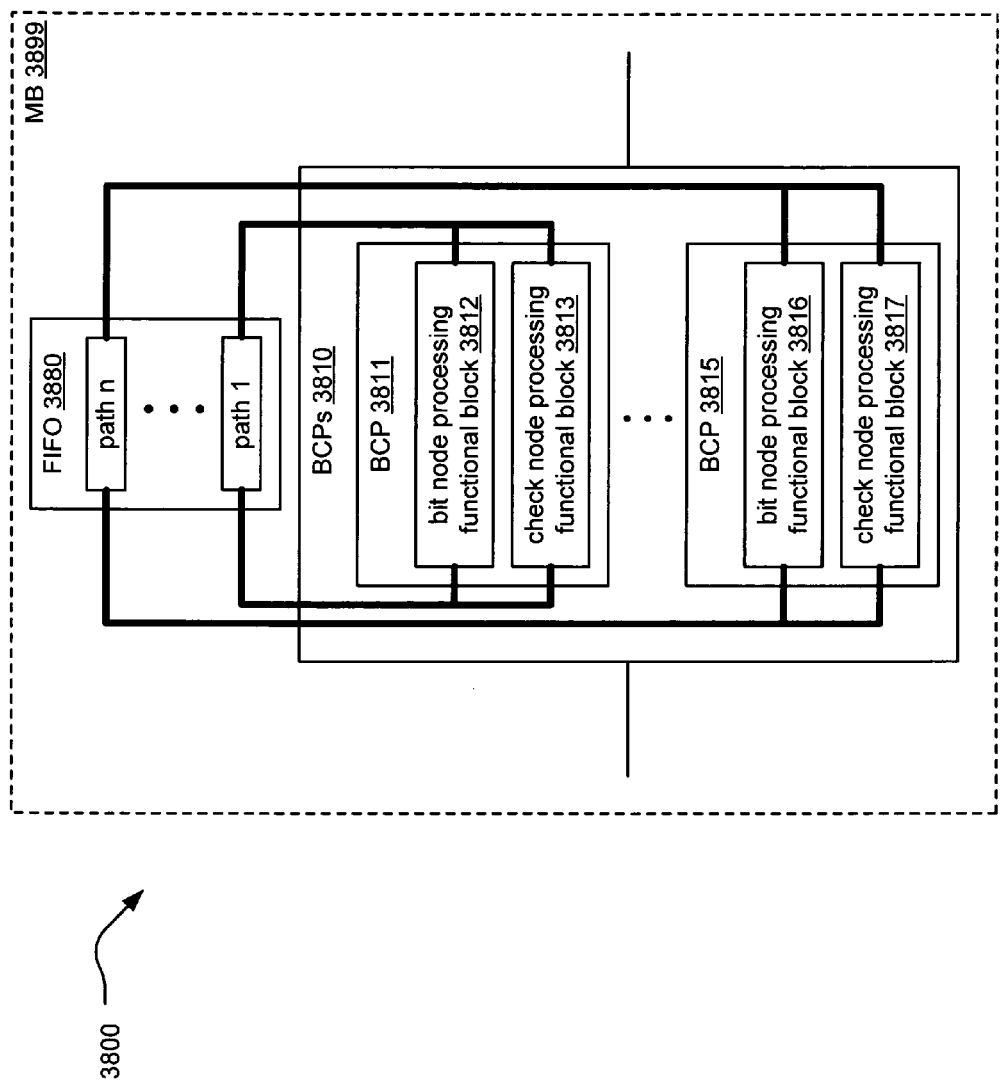
FIG. 38 is a diagram illustrating an embodiment of each parallel path of a FIFO buffer servicing each corresponding bit node processing functional block and each corresponding check node processing functional block within each of the bit/check processors of a macro block of an LDPC decoder in accordance with certain aspects of the invention.

FIG. 38 is a diagram illustrating an embodiment 3800 of each parallel path of a FIFO buffer servicing each corresponding bit node processing functional block and each corresponding check node processing functional block within each of the bit/check processors of a macro block of an LDPC decoder in accordance with certain aspects of the invention. This diagram shows a FIFO 3880 that includes n different paths therein, (shown as a path 1, . . . , and a path n).

Similar to some embodiments above in some respects, the single FIFO buffer 3880 is operable to service each bit/check processor of a plurality of bit/check processors 3810 within a macro block 3899 (shown as MB 3899). Again, the plurality of bit/check processors 3810 may include a BCP 3811 (which is a 1$^{st}$ bit/check processor), . . . , and BCP 3815 (which may be viewed as being an nth bit/check processor). There may be various numbers plurality of bit/check processors within the plurality of bit/check processors 3810. For example, in some embodiments, there may be as many as 20 bit/check processors within the plurality of bit/check processors 3810. In addition, there may be various numbers of macro blocks 3899 implemented within such a decoder, as described above in alternative embodiments.

In this diagram, each of the bit/check processors within the plurality of bit/check processors 3810 is shown as including two separate processing functional blocks: a bit node processing functional block and a check node processing functional block. For example, the BCP 3811 includes a bit node processing functional block 3812 and a check node processing functional block 3813. Analogously, the BCP 3815 includes a bit node processing functional block 3816 and a check node processing functional block 3817. The FIFO buffer 3880 is operable to service each of the bit node processing functional block and the check node processing functional block within each bit/check processor of the plurality of bit/check processors 3810. By using a common circuitry to perform both bit node processing and check node processing (i.e., by using the combination bit/check processor embodiment described herein), a great deal of space savings (i.e., real estate savings) may be achieved within an actual device that implements this architecture. Because of this shared circuitry, certain optimizations by sharing circuitry portions provides for a much smaller device.

More specifically within this embodiment wherein the FIFO buffer 3880 includes a number of parallel path. The path 1 of the FIFO buffer 3880 services (at different times) each of the bit node processing functional block 3812 and a check node processing functional block 3813 of the BCP 3811. Analogously, the path 1 of the FIFO buffer 3880 services (at different times) each of the bit node processing functional block 3816 and a check node processing functional block 3817 of the BCP 3815.

It is noted here that although the individual paths of the FIFO buffer 3880 are shown as connecting to each bit node processing functional block and each check node processing functional block within each bit/check processor of the plurality of bit/check processors 3810, it is noted that the corresponding bit node processing functional blocks are serviced during bit node processing and the corresponding check node processing functional blocks are serviced during check node processing. This is analogous to the diagrams of the FIG. 36A and the FIG. 36B with the exception that the FIFO buffer 3880 services these processing functional blocks using its individual paths therein.

Figure 39:
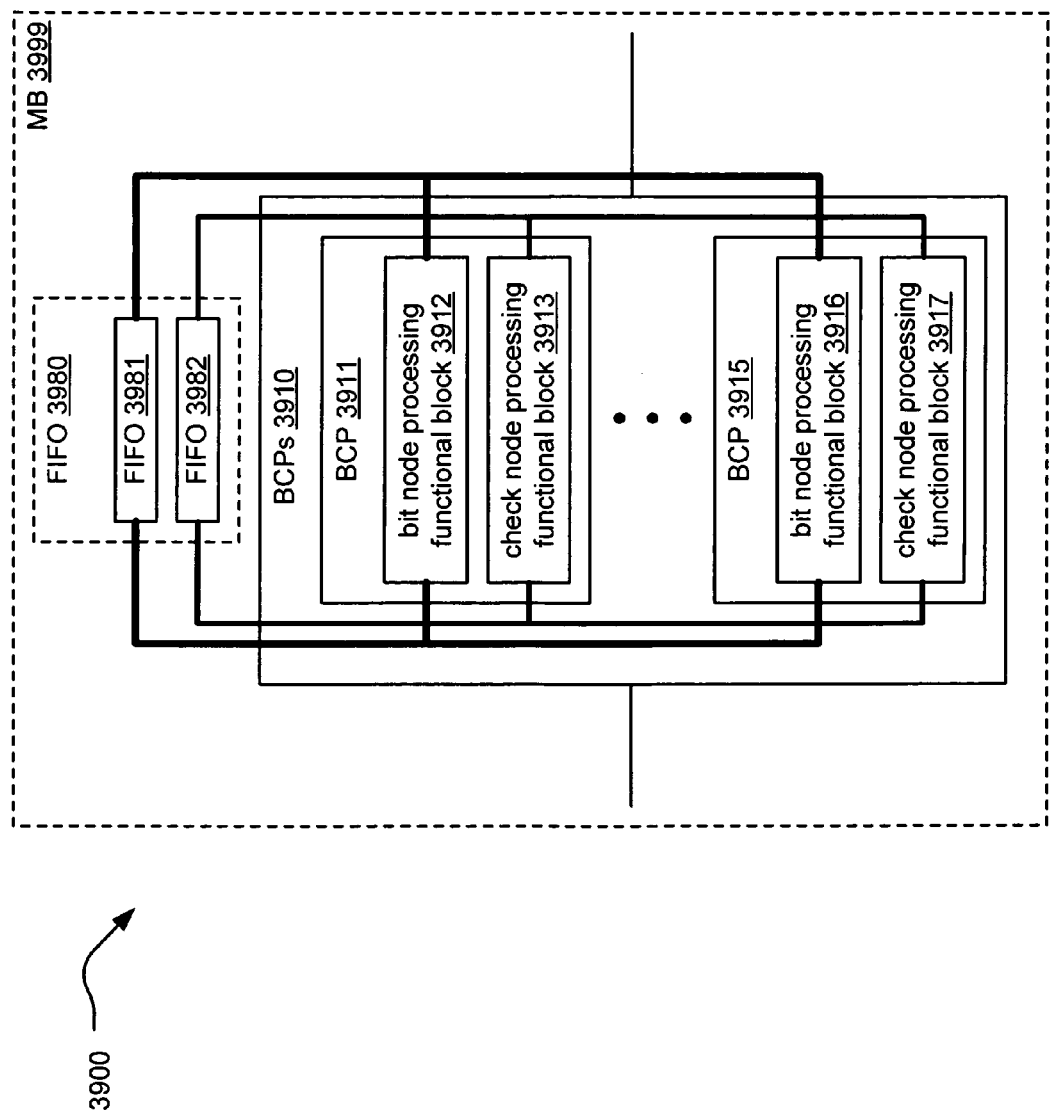
FIG. 39 is a diagram illustrating an embodiment of two FIFO buffers (which may be logically portioned in a single FIFO buffer) servicing each corresponding bit node processing functional block and corresponding check node processing functional block within each of the bit/check processors of a macro block of an LDPC decoder in accordance with certain aspects of the invention.

FIG. 39 is a diagram illustrating an embodiment 3900 of two FIFO buffers (which may be logically portioned in a single FIFO buffer) servicing each corresponding bit node processing functional block and corresponding check node processing functional block within each of the bit/check processors of a macro block of an LDPC decoder in accordance with certain aspects of the invention.

Also in this diagram, two separate FIFO buffers (i.e., FIFO buffer 3981 and FIFO buffer 3982) are each operable to service each of the corresponding bit node processing functional block and check node processing functional block within each bit/check processor of a plurality of bit/check processors 3910 within a macro block 3999 (shown as MB 3999). Again, the plurality of bit/check processors 3910 may include a BCP 3911 (which is a $1^{st}$ bit/check processor), ..., and BCP 3915 (which may be viewed as being an nth bit/check processor). There may be various numbers plurality of bit/check processors within the plurality of bit/check processors 3910. For example, as also described above with respect to some other embodiments, there may be as many as 20 bit/check processors within the plurality of bit/check processors 3910. In addition, there may be various numbers of macro blocks 3999 implemented within such a decoder, as described above in alternative embodiments.

In this diagram, each of the bit/check processors within the plurality of bit/check processors 3910 is shown as including two separate processing functional blocks: a bit node processing functional block and a check node processing functional block. For example, the BCP 3911 includes a bit node processing functional block 3912 and a check node processing functional block 3913. Analogously, the BCP 3915 includes a bit node processing functional block 3916 and a check node processing functional block 3917.

The FIFO buffer 3981 is operable to service each bit node processing functional block within each bit/check processor of the plurality of bit/check processors 3910. For example, the FIFO buffer 3981 is operable to service the bit node processing functional block 3912 and the bit node processing functional block 3916 (as well as any intervening bit node processing functional blocks within any additional bit/check processors within the plurality of bit/check processors 3910).

Analogously, the FIFO buffer 3982 is operable to service each check node processing functional block within each bit/check processor of the plurality of bit/check processors 3910. For example, the FIFO buffer 3982 is operable to service the check node processing functional block 3913 and the check node processing functional block 3917 (as well as any intervening check node processing functional blocks within any additional bit/check processors within the plurality of bit/check processors 3910).

It is also noted that the FIFO buffer 3981 and the FIFO buffer 3982 may be actual distinct and separate functional blocks and/or circuitries in some embodiment. In even other embodiments, the FIFO buffer 3981 and the FIFO buffer 3982 may simply be logical partitions within a single FIFO buffer 3980. This embodiment shows the ability to have a single FIFO buffer (e.g., the FIFO buffer 3981) service each bit node processing functional block within each bit/check processor within the plurality of bit/check processors 3910. Moreover, this embodiment shows the ability to have a single FIFO (e.g., the FIFO buffer 3982) buffer service each check node processing functional block within each bit/check processor within the plurality of bit/check processors 3910.

It is also noted that each of the FIFO buffer 3981 and the FIFO buffer 3892 may be implemented to include a number of parallel paths in similar manner as some of the other embodiments described above. For example, the FIFO buffer 3981 may include a number of parallel paths such that each path services a corresponding bit node processing functional block within each bit/check processor. Analogously, the FIFO buffer 3982 may include a number of parallel paths such that each path services a corresponding check node processing functional block within each bit/check processor.

There are a wide variety of means by which such a FIFO buffer may be implemented to service each of the bit/check processors and/or their respective bit node processing functional block and check node processing functional block implemented therein in accordance with certain aspects of the invention.

Figure 40:
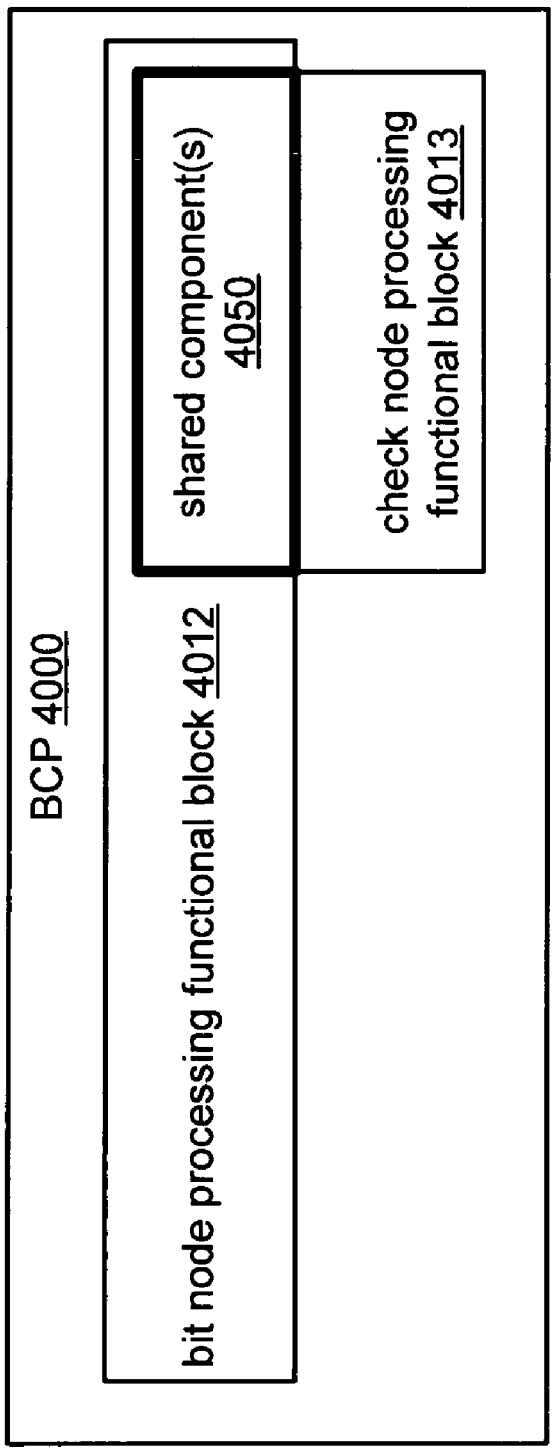
FIG. 40 is a diagram illustrating an embodiment of a bit/check processor that includes at least one common component that is employed by each of a bit node processing functional block and a check node processing functional block implemented therein in accordance with certain aspects of the invention.

FIG. 40 is a diagram illustrating an embodiment of a bit/check processor 4000 (BCP 4000) that includes at least one common component (depicted by shared component(s) 4050) that is employed by each of a bit node processing functional block 4012 and a check node processing functional block 4013 implemented therein in accordance with certain aspects of the invention. This diagram shows how certain components may be shared and used when performing both bit node processing and check node processing. This efficiency in terms of reusing certain components can result in a reduction in complexity and a reduction in size (thanks to the re-use of components).

As some examples of the re-use and sharing of certain components for both bit node processing and check node processing, the bit node processing functionality 1900 of the FIG. 19 includes certain components that may be employed and used within the check node processing functionality 2300 of the FIG. 23. For example, the adder 1905, the subtractor 1906, and the REG 1907 and REG 1908 of the embodiment of the FIG. 19 may be employed directly within the embodiment of the FIG. 23.

Specifically, the check node processing functionality 2300 of the FIG. 23 includes a min* processing functional block and a min*− processing functional block. The min* processing functionality 2400 of the FIG. 24 may be implemented as the min* processing functional block within the min†† processing functional block of the check node processing functionality 2300 of the FIG. 23. If this is done, then the adder 2405 that is employed therein to do summation may be the same adder 1905 that is employed within the bit node processing functionality 1900 of the FIG. 19.

Analogously, the min*− processing functionality 2700 of the FIG. 27 may be implemented as the min*− processing functional block within the min†− processing functional block of the check node processing functionality 2300 of the FIG. 23. If this is done, then the subtractor 2706 that is employed to determine this difference may be the same subtractor 1906 that is employed within the bit node processing functionality 1900 of the FIG. 19.

These possible embodiments show just one possible means by which certain components may be shared and used when performing both bit node processing and check node processing within a bit/check processor that is implemented to perform both of these types of processing. Clearly, other optimizations of shared components may also be performed to conserve device size and reduce complexity without departing from the scope and spirit of the invention.

It is also noted that the methods described herein may also be performed within any of the appropriate system and/or apparatus designs (communication systems, communication transmitters, communication receivers, communication transceivers, and/or functionality described therein) that are described herein without departing from the scope and spirit of the invention.

Moreover, it is also noted that the various functionality, system and/or apparatus designs, and method related embodiments that are described herein may all be implemented to perform various calculations in the logarithmic domain (e.g., log domain) thereby enabling multiplication operations to be performed using addition and thereby enabling division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to decode an LDPC (Low Density Parity Check) coded signal, the decoder comprising:
    a FIFO (First-In First-Out) buffer that is operable to receive and subsequently to provide a plurality of edge messages with respect to a plurality of check nodes;
    a bit node processing functional block that is operable to receive a bit metric that corresponds to a symbol of the LDPC coded signal, the plurality of edge messages with respect to the plurality of check nodes, and one edge message of the plurality of edge messages with respect to the plurality of check nodes from the FIFO buffer, and that comprises:
        an accumulator that is operable to add each edge message of the plurality of edge messages with respect to the plurality of check nodes with the bit metric thereby generating a summed value; and
        a subtraction functional block that is operable to subtract the one edge message of the plurality of edge messages with respect to the plurality of check nodes provided from the FIFO buffer from the summed value thereby generating one updated edge message of a plurality of updated edge messages with respect to a plurality of bit nodes;
    wherein the FIFO buffer is also operable to receive and subsequently to provide the plurality of updated edge messages with respect to the plurality of bit nodes; and
    a check node processing functional block that is operable to receive the plurality of updated edge messages with respect to the plurality of bit nodes from the bit node processing functional block and that comprises:
        a min (min-double-star) processing functional block that is operable to perform min processing using the plurality of updated edge messages with respect to the plurality of bit nodes thereby generating a min** resultant; and
        a min− (min-double-star-minus) processing functional block that is operable to perform min− processing using one updated edge message with respect to the plurality of bit nodes provided from the FIFO buffer and the min resultant received from the min processing functional block thereby generating an updated edge message with respect to the plurality of check nodes.

2. The decoder of claim 1, wherein:
    the bit node processing functional block is operable to provide the plurality of updated edge messages with respect to the plurality of bit nodes to the check node processing functional block in 2s complement format.

3. The decoder of claim 1, wherein the min** processing functional block further comprises:
    a MUX (Multiplexor) that is operable to select a minimum value from one updated edge message of the plurality of updated edge messages with respect to the plurality of bit nodes and a previously calculated min** resultant;
    a first log correction factor functional block that is operable to provide a first log correction factor;
    a second log correction factor functional block that is operable to provide a second log correction factor; and
    a summer that is operable to add the selected minimum value, the first log correction factor, and the second log correction thereby generating the min** resultant.

4. The decoder of claim 3, wherein:
    the first log correction factor functional block comprises a first LUT (Look-Up Table) that comprises a predetermined plurality of first log correction factors; and
    the second log correction factor functional block comprises a second LUT that comprises a predetermined plurality of second log correction factors.

5. The decoder of claim 1, wherein the min**− processing functional block further comprises:
    a MUX (Multiplexor) that is operable to select a minimum value from the min** resultant and updated edge message of the plurality of updated edge messages with respect to the plurality of bit nodes received from the FIFO buffer;
    a first log correction factor functional block that is operable to provide a first log correction factor;
    a second log correction factor functional block that is operable to provide a second log correction factor; and
    a summer that is operable to add the selected minimum value, the first log correction factor, and the second log correction thereby generating the updated edge message with respect to the plurality of check nodes.

6. The decoder of claim 5, wherein:
    the first log correction factor functional block comprises a first LUT (Look-Up Table) that comprises a predetermined plurality of first log correction factors; and
    the second log correction factor functional block comprises a second LUT that comprises a predetermined plurality of second log correction factors.

7. The decoder of claim 1, wherein:
    during a first clock cycle, the accumulator is operable to add a first edge message of the plurality of edge messages with respect to the plurality of check nodes with the bit metric thereby generating a first intermediate summed value;
    during a second clock cycle, the accumulator is operable to add a second edge message of the plurality of edge messages with respect to the plurality of check nodes with the first intermediate summed value thereby generating a second intermediate summed value; and
    during a third clock cycle, the accumulator is operable to add a third edge message of the plurality of edge messages with respect to the plurality of check nodes with the second intermediate summed value thereby generating the summed value.

8. The decoder of claim 1, further comprising a plurality of macro blocks that is arranged in a parallel configuration such that each macro block of the plurality of macro blocks comprises one FIFO buffer and a plurality of bit/check processors, wherein:
- each bit/check processor of the plurality of bit/check processors comprises a corresponding bit node processing functional block and a corresponding check node processing functional block; and
- the one FIFO buffer of each macro block of the plurality of macro blocks includes a plurality of parallel paths such that each parallel path corresponds to one bit/check processor of the corresponding plurality of bit/check processors.

9. The decoder of claim 1, wherein:
- the LDPC coded signal is a variable code rate signal and is also a variable modulation signal;
- the first symbol of the LDPC coded signal has a first code rate and a first modulation having a first constellation shape and a corresponding first mapping; and
- the second symbol of the LDPC coded signal has a second code rate and a second modulation having a second constellation shape and a corresponding second mapping.

10. The decoder of claim 9, wherein:
- at least one of the first modulation and the second modulation is QPSK (Quadrature Phase Shift Key) modulation, 8 PSK (Phase Shift Key) modulation, 16 APSK (Asymmetric Phase Shift Keying) modulation, or 16 QAM (Quadrature Amplitude Modulation).

11. The decoder of claim 1, wherein:
- the decoder is operable to decode LDPC coded signals that are compliant with at least one of DVB-S2 (Digital Video Broadcasting Project—Satellite Version 2) standard and recommended practices provided by IEEE (Institute of Electrical & Electronics Engineers) P802.3an (10GBASE-T) Task Force.

12. A decoder that is operable to decode an LDPC (Low Density Parity Check) coded signal, the decoder comprising:
- a FIFO (First-In First-Out) buffer that is operable to receive and subsequently to provide a plurality of edge messages with respect to a plurality of check nodes;
- a bit node processing functional block that is operable to receive a bit metric that corresponds to a symbol of the LDPC coded signal, the plurality of edge messages with respect to the plurality of check nodes, and one edge message of the plurality of edge messages with respect to the plurality of check nodes from the FIFO buffer, and that comprises:
  - an accumulator that is operable to add each edge message of the plurality of edge messages with respect to the plurality of check nodes with the bit metric thereby generating a summed value; and
  - a subtraction functional block that is operable to subtract the one edge message of the plurality of edge messages with respect to the plurality of check nodes provided from the FIFO buffer from the summed value thereby generating one updated edge message of a plurality of updated edge messages with respect to a plurality of bit nodes;
- wherein the FIFO buffer is also operable to receive and subsequently to provide absolute values of each updated edge message of the plurality of updated edge messages with respect to the plurality of bit nodes; and
- a check node processing functional block that is operable to receive the plurality of updated edge messages with respect to the plurality of bit nodes from the bit node processing functional block and that comprises:
  - a min†† (min-double-dagger) processing functional block that is operable to perform min†† processing thereby generating a min* (min-star) resultant generated using the plurality of updated edge message with respect to the plurality of bit nodes and also thereby outputting a minimum updated edge message of the plurality of updated edge message with respect to the plurality of bit nodes; and
  - a min†− (min-dagger-minus) processing functional block that is operable to perform min†− processing using an absolute value of one updated edge message of the plurality of updated edge messages with respect to the plurality of bit nodes provided from the FIFO buffer, the min* resultant received from the min†† processing functional block, and the minimum updated edge message received from the min†† processing functional block thereby generating an updated edge message with respect to the plurality of check nodes.

13. The decoder of claim 12, wherein:
- the bit node processing functional block further comprises a sign-magnitude format processor that is operable to provide the plurality of updated edge messages with respect to the plurality of bit nodes to the check node processing functional block in sign-magnitude format.

14. The decoder of claim 12, wherein:
- the FIFO buffer is operable to provide an MSB (Most Significant Bit) of one updated edge message of the plurality of updated edge messages with respect to the plurality of bit nodes to the min†− processing functional block for use in determining a final value of the updated edge message with respect to the plurality of check nodes.

15. The decoder of claim 12, wherein:
- during a first clock cycle, the accumulator is operable to add a first edge message of the plurality of edge messages with respect to the plurality of check nodes with the bit metric thereby generating a first intermediate summed value;
- during a second clock cycle, the accumulator is operable to add a second edge message of the plurality of edge messages with respect to the plurality of check nodes with the first intermediate summed value thereby generating a second intermediate summed value; and
- during a third clock cycle, the accumulator is operable to add a third edge message of the plurality of edge messages with respect to the plurality of check nodes with the second intermediate summed value thereby generating the summed value.

16. The decoder of claim 12, further comprising a plurality of macro blocks that is arranged in a parallel configuration such that each macro block of the plurality of macro blocks comprises one FIFO buffer and a plurality of bit/check processors, wherein:
- each bit/check processor of the plurality of bit/check processors comprises a corresponding bit node processing functional block and a corresponding check node processing functional block; and
- the one FIFO buffer of each macro block of the plurality of macro blocks includes a plurality of parallel paths such that each parallel path corresponds to one bit/check processor of the corresponding plurality of bit/check processors.

17. The decoder of claim 12, wherein:

the LDPC coded signal is a variable code rate signal and is also a variable modulation signal;

the first symbol of the LDPC coded signal has a first code rate and a first modulation having a first constellation shape and a corresponding first mapping; and the second symbol of the LDPC coded signal has a second code rate and a second modulation having a second constellation shape and a corresponding second mapping.

18. The decoder of claim 12, wherein:

the decoder is operable to decode LDPC coded signals that are compliant with at least one of DVB-S2 (Digital Video Broadcasting Project—Satellite Version 2) standard and recommended practices provided by IEEE (Institute of Electrical & Electronics Engineers) P802.3an (10GBASE-T) Task Force.

19. A decoder, comprising a plurality of macro blocks that is arranged in a parallel configuration such that each macro block of the plurality of macro blocks comprises one FIFO (First-In First-Out) buffer and a plurality of bit/check processors, that is operable to decode an LDPC (Low Density Parity Check) coded signal, wherein:

the FIFO buffer of each macro block of the plurality of macro blocks is operable to receive and subsequently to provide a plurality of edge messages with respect to the plurality of check nodes;

the FIFO buffer of each macro block of the plurality of macro blocks includes a plurality of parallel paths such that each parallel path corresponds to one bit/check processor of the corresponding plurality of bit/check processors;

each bit/check processor of the plurality of bit/check processors comprises a corresponding bit node processing functional block and a corresponding check node processing functional block, wherein:

each corresponding bit node processing functional block is operable to receive a bit metric that corresponds to a symbol of the LDPC coded signal, the plurality of edge messages with respect to the plurality of check nodes, and one edge message of the plurality of edge messages with respect to the plurality of check nodes from the FIFO buffer, and comprises:

an accumulator that is operable to add each edge message of the plurality of edge messages with respect to the plurality of check nodes with the bit metric thereby generating a summed value; and a subtraction functional block that is operable to subtract the one edge message of the plurality of edge messages with respect to the plurality of check nodes provided from the FIFO buffer from the summed value thereby generating one updated edge message of a plurality of updated edge messages with respect to a plurality of bit nodes;

the FIFO buffer of each macro block of the plurality of macro blocks is also operable to receive and subsequently to provide the plurality of updated edge messages with respect to the plurality of bit nodes; and each check node processing functional block is operable to receive the plurality of updated edge messages with respect to the plurality of bit nodes from a corresponding bit node processing functional block and comprises:

a min (min-double-star) processing functional block that is operable to perform min processing using the plurality of updated edge messages with respect to the plurality of bit nodes thereby generating a min resultant; and a min− (min-double-star-minus) processing functional block that is operable to perform min− processing using one updated edge message with respect to the plurality of bit nodes provided from the FIFO buffer and the min resultant received from the min** processing functional block thereby generating an updated edge message with respect to the plurality of check nodes.

20. A decoder, comprising a plurality of macro blocks that is arranged in a parallel configuration such that each macro block of the plurality of macro blocks comprises one FIFO (First-In First-Out) buffer and a plurality of bit/check processors, that is operable to decode an LDPC (Low Density Parity Check) coded signal, wherein:

the FIFO buffer of each macro block of the plurality of macro blocks is operable to receive and subsequently to provide a plurality of edge messages with respect to the plurality of check nodes;

the FIFO buffer of each macro block of the plurality of macro blocks includes a plurality of parallel paths such that each parallel path corresponds to one bit/check processor of the corresponding plurality of bit/check processors;

each bit/check processor of the plurality of bit/check processors comprises a corresponding bit node processing functional block and a corresponding check node processing functional block, wherein:

each corresponding bit node processing functional block is operable to receive a bit metric that corresponds to a symbol of the LDPC coded signal, the plurality of edge messages with respect to the plurality of check nodes, and one edge message of the plurality of edge messages with respect to the plurality of check nodes from the FIFO buffer, and comprises:

an accumulator that is operable to add each edge message of the plurality of edge messages with respect to the plurality of check nodes with the bit metric thereby generating a summed value; and a subtraction functional block that is operable to subtract the one edge message of the plurality of edge messages with respect to the plurality of check nodes provided from the FIFO buffer from the summed value thereby generating one updated edge message of a plurality of updated edge messages with respect to a plurality of bit nodes;

the FIFO buffer of each macro block of the plurality of macro blocks is also operable to receive and subsequently to provide absolute values of each updated edge message of the plurality of updated edge messages with respect to the plurality of bit nodes; and each check node processing functional block is operable to receive the plurality of updated edge messages with respect to the plurality of bit nodes from a corresponding bit node processing functional block and comprises:

a min†† (min-double-dagger) processing functional block that is operable to perform min†† processing thereby generating a min* (min-star) resultant generated using the plurality of updated edge message with respect to the plurality of bit nodes and also thereby outputting a minimum updated edge message of the plurality of updated edge message with respect to the plurality of bit nodes; and a min†− (min-dagger-minus) processing functional block that is operable to perform min†− processing using an absolute value of one updated edge message of the plurality of updated edge messages with respect to the plurality of bit nodes provided from the FIFO buffer, the min* resultant received from the min†† processing functional block, and the minimum updated edge message received from the min†† processing functional block thereby generating an updated edge message with respect to the plurality of check nodes.

* * * * *